(12) United States Patent
Moriya et al.

(10) Patent No.: US 7,622,736 B2
(45) Date of Patent: Nov. 24, 2009

(54) SEMICONDUCTOR DEVICE AND METHOD FOR MANUFACTURING THE SAME

(75) Inventors: Yoshitaka Moriya, Atsugi (JP); Hiroko Abe, Setagaya (JP); Mikio Yukawa, Atsugi (JP); Ryoji Nomura, Kanagawa (JP)

(73) Assignee: Semiconductor Energy Laboratory Co., Ltd., Atsugi-shi, Kangawa-ken (JP)

( * ) Notice: Subject to any disclaimer, the term of this patent is extended or adjusted under 35 U.S.C. 154(b) by 453 days.

(21) Appl. No.: 11/579,145

(22) PCT Filed: Dec. 1, 2005

(86) PCT No.: PCT/JP2005/022594

§ 371 (c)(1),
(2), (4) Date: Oct. 30, 2006

(87) PCT Pub. No.: WO2006/062175

PCT Pub. Date: Jun. 15, 2006

(65) Prior Publication Data

US 2007/0215869 A1    Sep. 20, 2007

(30) Foreign Application Priority Data

Dec. 7, 2004    (JP) .............................. 2004-354490

(51) Int. Cl.
*H01L 23/58* (2006.01)
(52) U.S. Cl. .................... 257/48; 257/184; 257/187; 257/222; 257/226; 257/E21.521
(58) Field of Classification Search .................. 257/48, 257/184, 187, 222, 226
See application file for complete search history.

(56) References Cited

U.S. PATENT DOCUMENTS

| 4,860,254 A | 8/1989 | Pott et al. |
| 6,714,392 B2 | 3/2004 | Opolka et al. |
| 6,773,929 B2 | 8/2004 | Oh et al. |

(Continued)

FOREIGN PATENT DOCUMENTS

| EP | 0 236 696 | 9/1987 |
| WO | WO 01/73845 | 10/2001 |

OTHER PUBLICATIONS

International Search Report (Application No.PCT/JP2005/022594) dated Mar. 23, 2006.
Written Opinion (Application No. PCT/JP2005/022594) dated Mar. 23, 2006.

*Primary Examiner*—Wai-Sing Louie
(74) *Attorney, Agent, or Firm*—Eric J. Robinson; Robinson Intellectual Property Law Office, P.C.

(57) ABSTRACT

It is an object of the present invention to provide a volatile semiconductor device into which data can be additionally written and which is easy to manufacture, and a method for manufacturing the same. It is a feature of the present invention that a semiconductor device includes an element formation layer including a first transistor and a second transistor which are provided over a substrate; a memory element provided over the element formation layer; and a sensor portion provided above the memory element, wherein the memory element has a layered structure including a first conductive layer, and an organic compound layer, and a second conductive layer, the first conductive layer is electrically connected to the first transistor, and the sensor portion is electrically connected to the second transistor.

53 Claims, 32 Drawing Sheets

U.S. PATENT DOCUMENTS

| | | |
|---|---|---|
| 6,812,509 B2 | 11/2004 | Xu |
| 6,818,920 B2 | 11/2004 | De Leeuw et al. |
| 6,927,437 B2 | 8/2005 | Oh et al. |
| 2004/0084728 A1* | 5/2004 | Tanabe ........................ 257/347 |
| 2004/0258866 A1* | 12/2004 | Shiba et al. ................. 428/35.7 |
| 2006/0121308 A1* | 6/2006 | Katoh et al. ................. 428/690 |

* cited by examiner

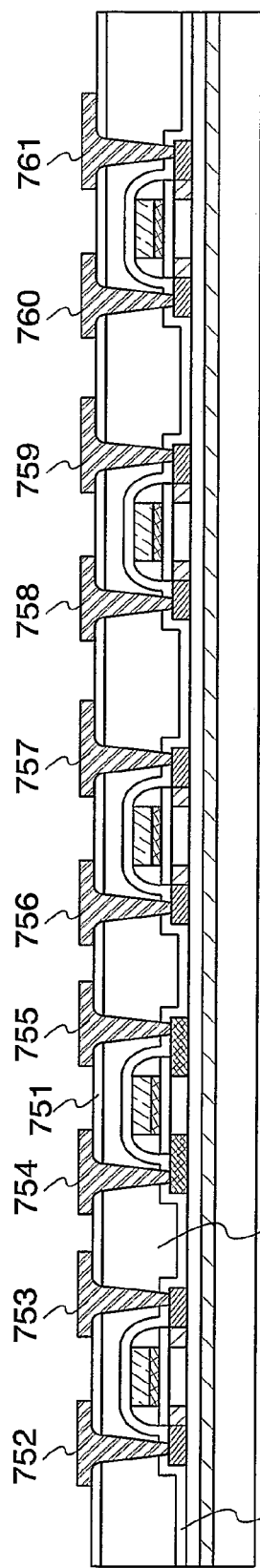
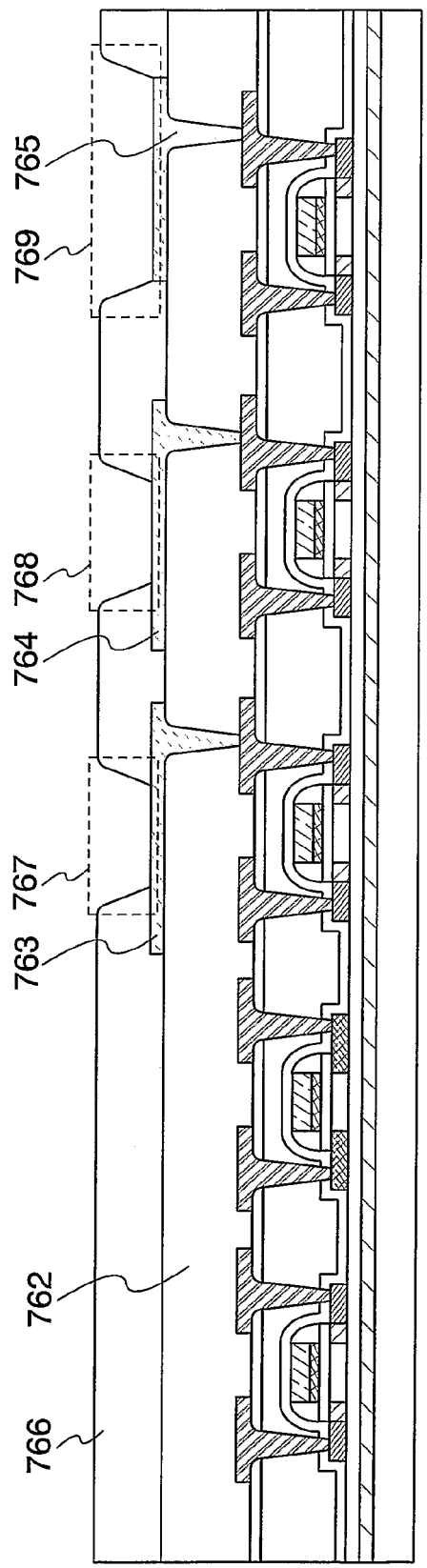
FIG. 22A
FIG. 22B

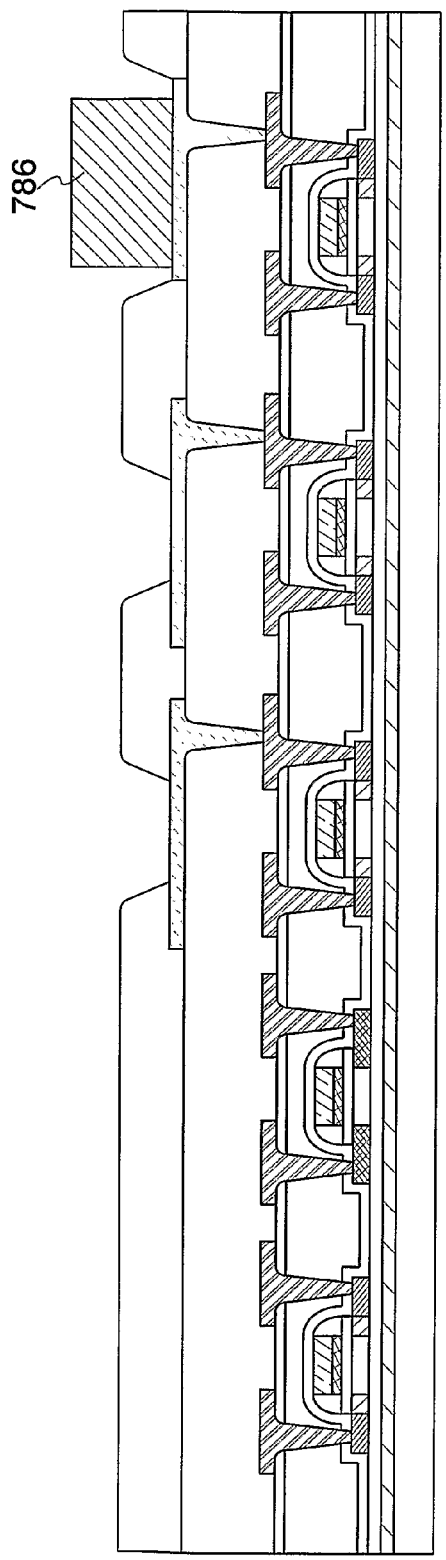
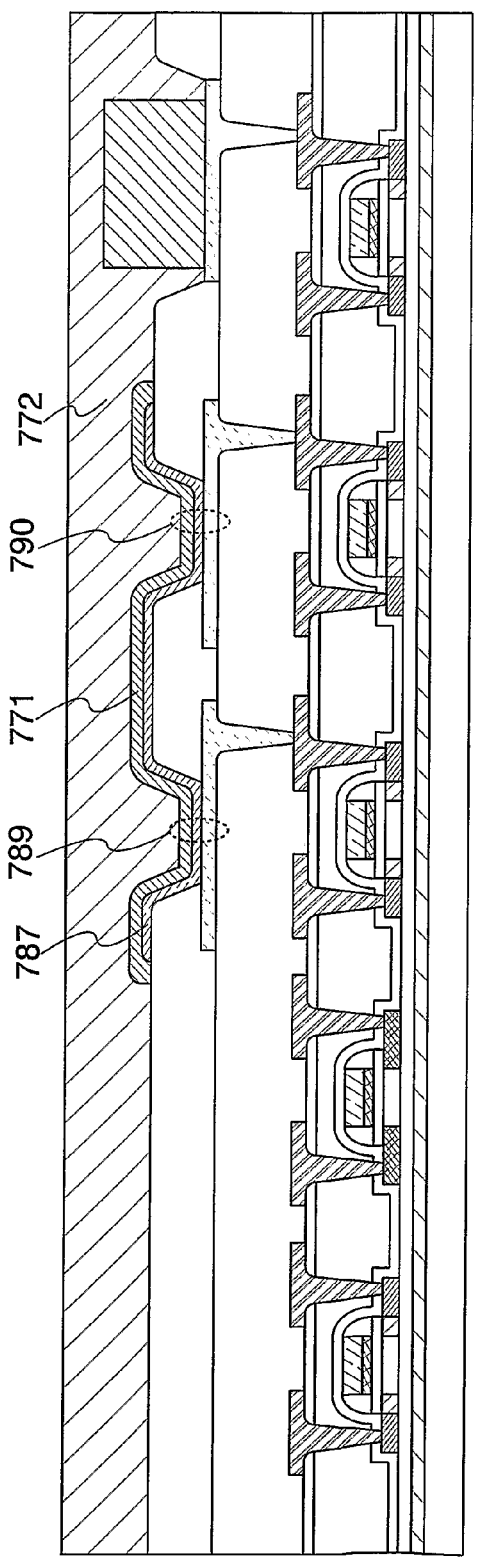
FIG. 23A
FIG. 23B

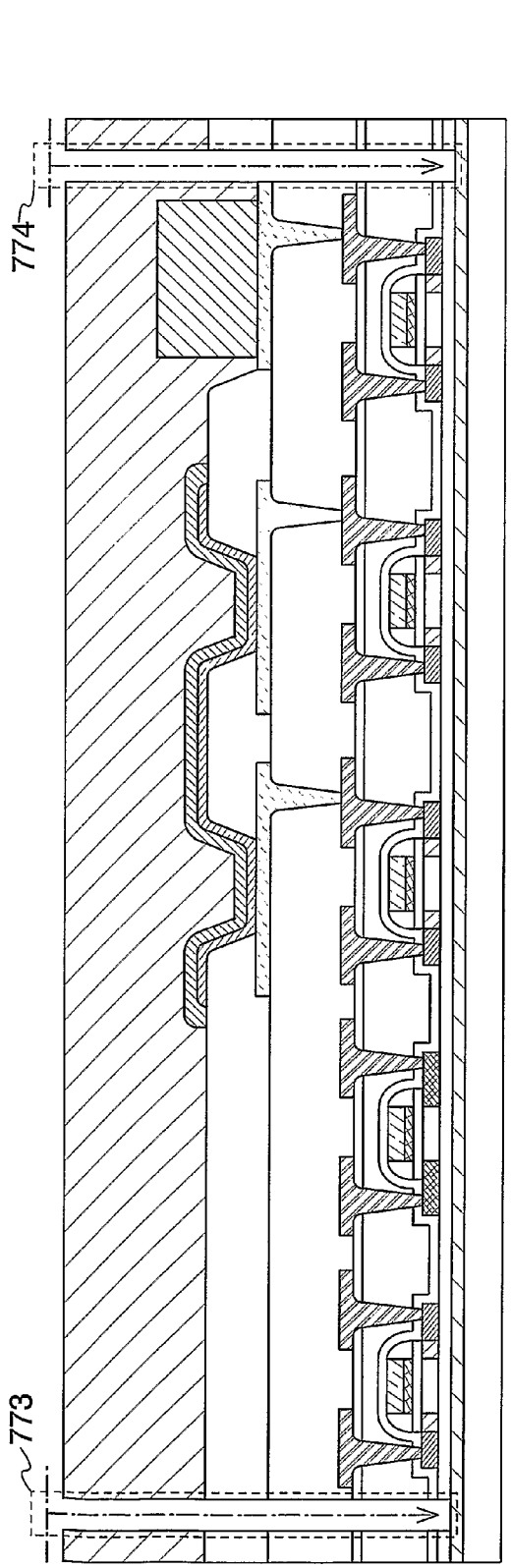
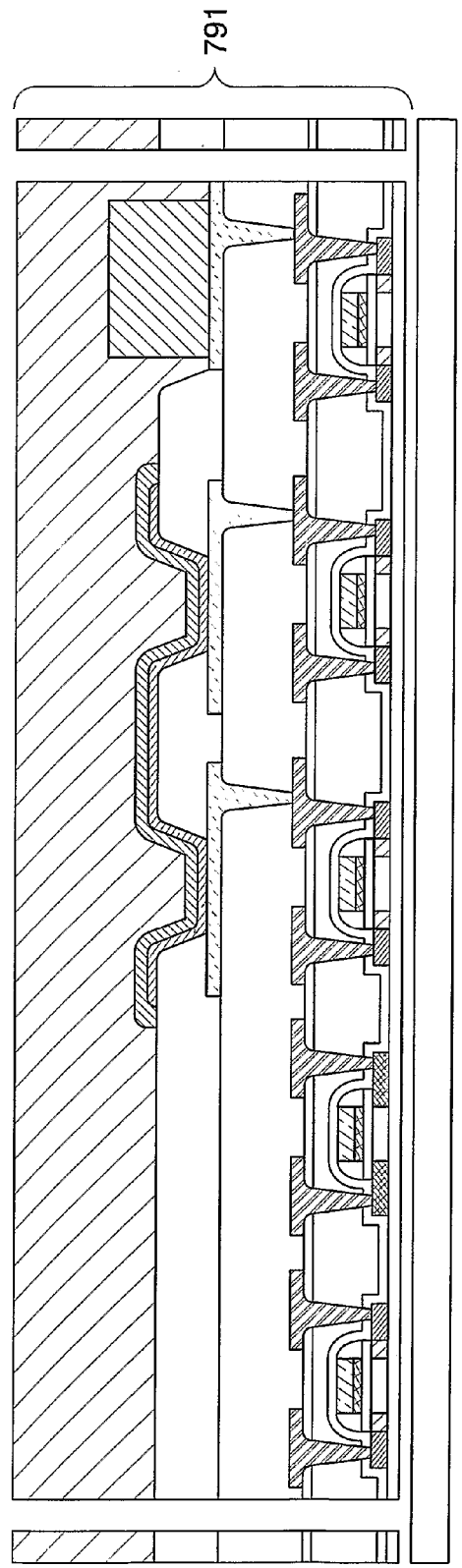
FIG. 24A
FIG. 24B

SEMICONDUCTOR DEVICE AND METHOD FOR MANUFACTURING THE SAME

TECHNICAL FIELD

The present invention relates to a semiconductor device, preferably to a semiconductor device capable of storing data by using an organic compound for the memory circuit.

BACKGROUND ART

In recent years, individual recognition technology has attracted attention. For example, there is a technology to be used for production and management, in which information such as a history of the object is clarified by giving an ID (an individual recognition code) to an individual object. Above all, the developments of semiconductor devices, that can send and receive data without contact have been advanced. As such semiconductor devices, in particular, an RFID (Radio Frequency Identification) tag (also referred to as an ID tag, an IC tag, and IC chip, an RF (Radio Frequency) tag, a wireless tag, an electronic tag, or a wireless chip) is beginning to be used in companies, markets, and the like.

Many of semiconductor devices that have already been put to practical use each has a circuit using a semiconductor substrate such as a Si substrate (also referred to as an IC (Integrated Circuit) chip) and an antenna, and the IC chip includes a memory circuit (also referred to as a memory) and a control circuit. Particularly, by equipping a memory circuit which stores much data, a high-value-added semiconductor device providing higher performance can be provided.

As a memory circuit provided in a semiconductor device, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, and the like can be used in general. Among them, data is erased when the power is turned off so that data is required to be written every time the power is turned on when using a DRAM or an SRAM which are volatile memory circuits. An FeRAM is a nonvolatile memory circuit which uses a capacitor including a ferroelectric layer and requires a large number of manufacturing process. A mask ROM has a simple structure, however, data is required to be written during the manufacturing steps, and thus data cannot be additionally written. An EPROM, an EEPROM, and a flash memory are non-volatile memory circuits using an element having two gate electrodes, so that the manufacturing steps are increased.

DISCLOSURE OF INVENTION

In view of the above matters, it is an object of the present invention to provide a volatile semiconductor device into which data can be additionally written and which is easy to manufacture, and a method for manufacturing the same.

In order to achieve the objects, the present invention provides the following measures.

A semiconductor device according to the present invention includes an element formation layer including a first transistor and a second transistor which are provided over a substrate; a memory element provided over the element formation layer; and a sensor portion provided above the memory element, wherein the memory element has a layered structure of a first conductive layer, and an organic compound layer, and a second conductive layer, the first conductive layer is electrically connected to the first transistor, and the sensor portion is electrically connected to the second transistor.

Another structure of a semiconductor device according to the invention includes an element formation layer including a first transistor, a second transistor, and a third transistor which are provided over a substrate; a memory element provided over the element formation layer; a conductive layer which functions as an antenna; and a sensor portion provided above the memory element, wherein the memory element has a layered structure of a first conductive layer, and an organic compound layer, and a second conductive layer, the first conductive layer is electrically connected to the first transistor, the sensor portion is electrically connected to the second transistor, and the conductive layer which functions as an antenna is electrically connected to the third transistor. Further, the conductive layer which functions as an antenna is provided in a same layer as the first conductive layer.

In another structure of a semiconductor device according to the invention, a conductive layer provided on the sensor portion is electrically connected to a conductive layer electrically connected to a source or drain region of the second transistor through a conductive particle, so that the sensor portion is electrically connected to the second transistor.

Another structure of a semiconductor device according to the invention includes an element formation layer including a first transistor, a second transistor, and a sensor portion which are provided over a substrate; and a memory element provided over the element formation layer, wherein the memory element has a layered structure of a first conductive layer, and an organic compound layer, and a second conductive layer, the first conductive layer is electrically connected to the first transistor, and the sensor portion is electrically connected to the second transistor.

Another structure of a semiconductor device according to the invention includes an element formation layer including a first transistor, a second transistor, a third transistor, and a sensor portion which are provided over a substrate; a memory element provided over the element formation layer; and a conductive layer which functions as an antenna, wherein the memory element has a layered structure of a first conductive layer, and an organic compound layer, and a second conductive layer, the first conductive layer is electrically connected to the first transistor, and the sensor portion is electrically connected to the second transistor, and the conductive layer which functions as an antenna is electrically connected to the third transistor. Further, the conductive layer which functions as an antenna is provided in a same layer as the first conductive layer.

In another structure of a semiconductor device according to the invention, the sensor portion includes a photodiode or a phototansistor.

Another structure of a semiconductor device according to the invention includes an element formation layer including a first transistor and a second transistor which are provided over a substrate; and a memory element and a sensor portion which are provided over the element formation layer, wherein the memory element portion has a layered structure of a first conductive layer, a first organic compound layer, and a second conductive layer, the sensor portion has a layered structure of a third conductive layer and a second organic compound layer and a fourth conductive layer, the first conductive layer is electrically connected to the first transistor, and the third conductive layer is electrically connected to the second transistor.

Another structure of a semiconductor device according to the invention includes an element formation layer including a first transistor, a second transistor, and a third transistor which are provided over a substrate; a memory element and a sensor portion which are provided over the element formation layer; and a conductive layer which functions as an antenna, wherein the memory element portion has a layered structure of a first conductive layer, a first organic compound layer, and a second conductive layer, the sensor portion has a layered structure of a third conductive layer, a second organic compound layer, and a fourth conductive layer, the first conductive layer is electrically connected to the first transistor, the third conductive layer is electrically connected to the second transistor, and the conductive layer which functions as an antenna is electrically connected to the third transistor. Further, the conductive layer which functions as an antenna is provided in a same layer as the first conductive layer and the third conductive layer.

In another structure of a semiconductor device according to the invention, the conductive layer which functions as an antenna is provided in a same layer as the first conductive layer and the third conductive layer. Further, the conductive layer which functions as an antenna is provided in a same layer as the first conductive layer and the third conductive layer.

In another structure of a semiconductor device according to the invention, distance between the first conductive layer and second conductive layer by writing in the memory element.

In another structure of a semiconductor device according to the invention, the transistor is an organic transistor.

In another structure of a semiconductor device according to the invention, the transistor is provided over a glass substrate or a flexible substrate.

In another structure of a semiconductor device according to the invention, the organic compound layer contains a high molecular weight compound.

In another structure of a semiconductor device according to the invention, resistance of the memory element changes irreversibly by writing.

BRIEF DESCRIPTION OF DRAWINGS

FIGS. 22A and 22B show an example of a method for manufacturing the semiconductor device of the present invention.

FIGS. 23A and 23B show an example of a method for manufacturing the semiconductor device of the present invention.

FIGS. 24A and 24B show an example of a method for manufacturing the semiconductor device of the present invention.

BEST MODE FOR CARRYING OUT THE INVENTION

Figure 1A:
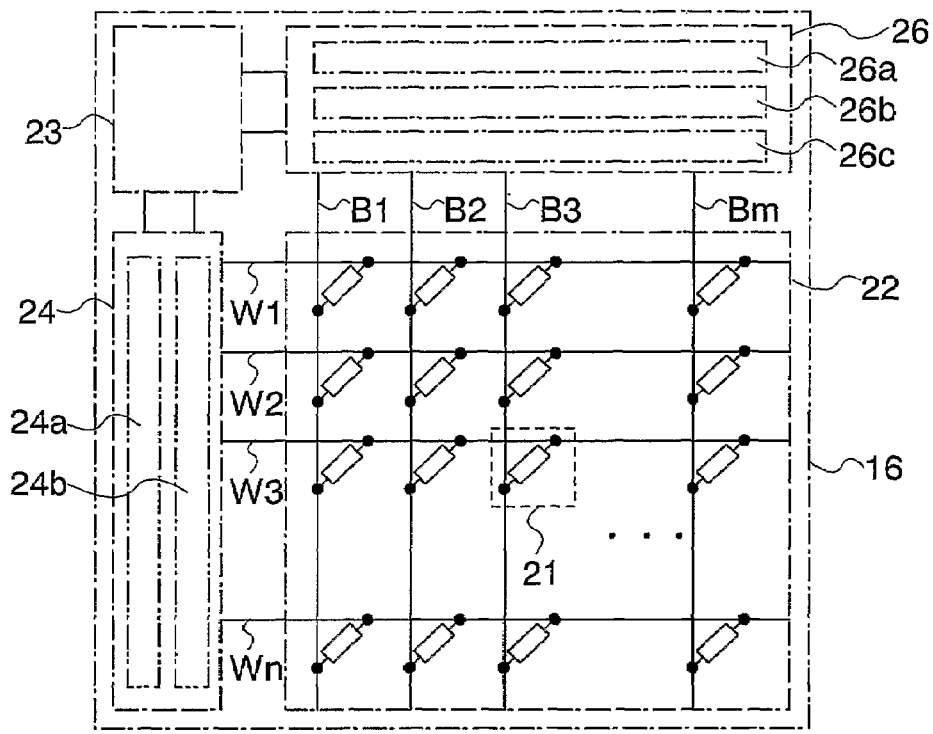
FIGS. 1A and 1B each shows an example of a structure of a semiconductor device of the present invention.

Embodiment modes and embodiments of the present invention will be described below with reference to the drawings. However, the present invention is not limited to the following descriptions. As is easily understood by a person skilled in the art, the mode and the detail of the invention can be variously changed without departing from the purpose and the scope of the present invention. Accordingly, the present invention is not interpreted as being limited to the following description of the embodiment modes and embodiments. Note that the same reference numeral can be commonly used to denote the same component among the different drawings showing the structures of the present invention described below.

Embodiment Mode 1

In this embodiment mode, an example of a structure of a memory circuit in which a memory element includes organic compound layer (hereinafter referred to as an organic memory) will be described with reference to the drawings. More specifically, the case where the structure of the memory circuit is passive matrix type will be described.

FIG. 1A shows an example of a structure of a semiconductor device according to the invention. The semiconductor device includes a memory cell array 22 in which memory cells 21 are arranged in matrix; a bit line driver circuit 26 including a column decoder 26a, a read circuit 26b, and a selector 26c; a word line driver circuit 24 including a row decoder 24a and a level shifter 24b; and an interface 23 having a writing circuit, which communicates with outside. Note that the structure shown here is only an example; accordingly, the memory circuit 16 may include another circuit such as a sense amplifier, an output circuit, a buffer, and the writing circuit may be provided on the bit line driver circuit.

The memory cell 21 has a structure in which an organic compound layer is provided between a pair of conductive layers (hereinafter also referred to as an organic memory element). Here, the organic memory element has a layered structure including a first conductive layer which forms a word line Wy ($1 \leq y \leq n$), an organic compound layer, and a second conductive layer which forms a bit line Bx ($1 \leq x \leq m$). The organic compound layer may have a single layer structure or a layered structure between the first conductive layer and the second conductive layer.

Figure 1B:
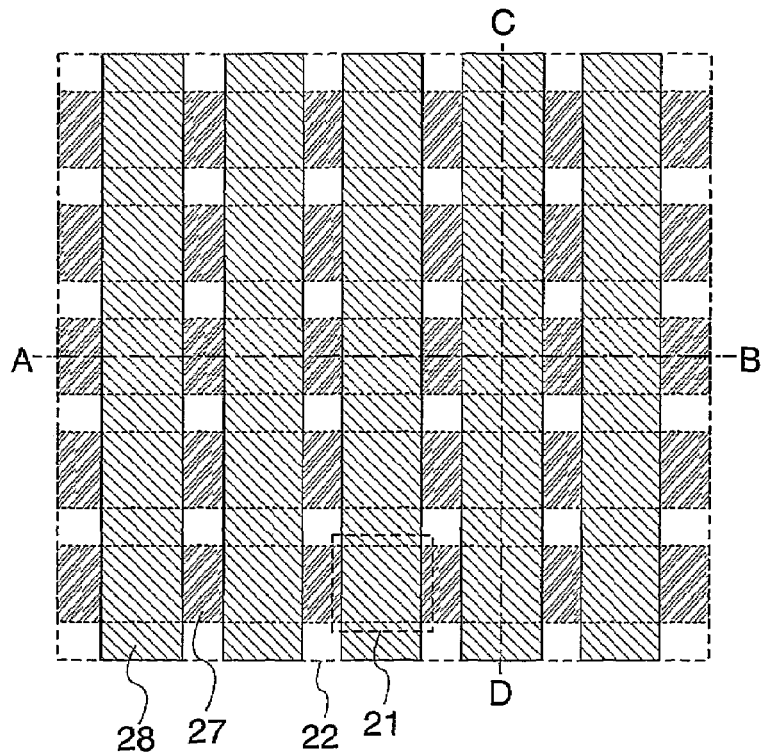

FIG. 1B show an example of a planar structure of the memory cell array 22. The memory cell array 22 includes a first conductive layer 27 which extends in a first direction, an organic compound layer which covers the first conductive layer 27, and a second conductive layer 28 which extends in a second direction that is different from the first direction, in the perpendicular direction here. The organic compound layer is provided between the first conductive layer 27 and the second conductive layer 28. The first conductive layer 27 serves as the word line Wy and the second conductive layer 28 serves as the bit line Bx.

Next, a method for manufacturing a memory cell array including an organic memory element will be described with reference to FIGS. 2A to 2D. FIGS. 2A to 2D each shows an example of a cross-sectional structure along line A-B in FIG. 1B.

Figure 2A:
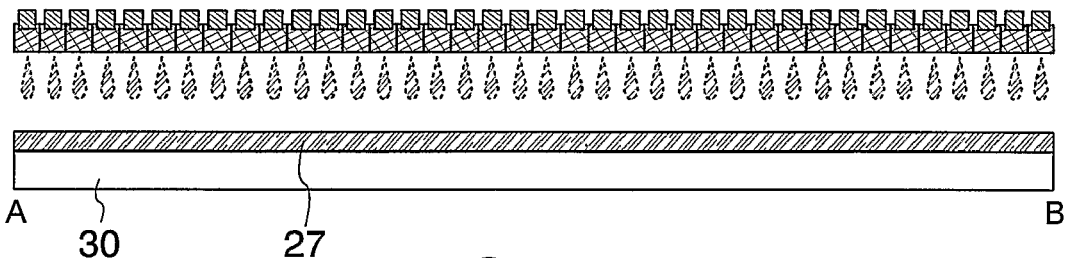
FIG. 2A to 2D show an example of a method for manufacturing a semiconductor device of the present invention.

First, a first conductive layer 27 is formed by selectively discharging a conductive composition onto a substrate 30 (FIG. 2A). Further, the first conductive layer 27 may be formed by vapor deposition, sputtering, CVD, spin coating, screen printing, gravure printing, or the like without limitation to a droplet discharge method. For example, the first conductive layer 27 can be formed by depositing a conductive material over the entire surface by sputtering or CVD and thereafter selectively etching it by photolithography.

Figure 2B:
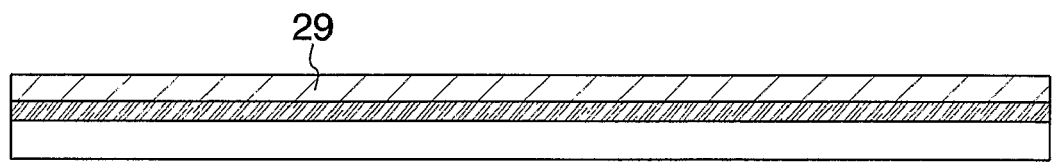

Next, an organic compound layer 29 is formed to cover the first conductive layer 27 (FIG. 2B). The organic compound layer 29 can be formed by a droplet discharge method, screen printing, gravure printing, spin coating, vapor deposition, or the like. Using such a method, the operation efficiency can be improved.

Figure 2C:
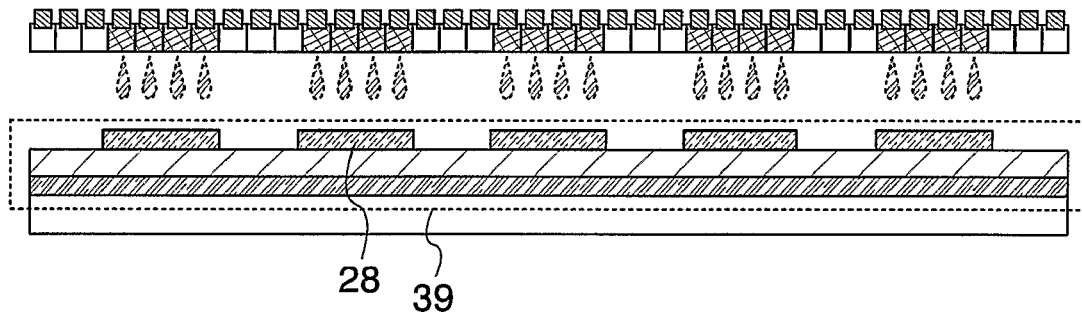

Next, a second conductive layer 28 is formed by selectively discharging a conductive composition onto an organic compound layer 29 (FIG. 2C). Here, a memory element portion 39 including a plurality of organic memory elements having a layered structure of the first conductive layer 27, the organic compound layer 29, and the second conductive layer 28. Further, the second conductive layer 28 can be formed by another method as described concerning the formation of the first conductive layer. The second conductive layer 28 may be formed by a different method from the first conductive layer 27. For example, the second conductive layer 28 can be directly and selectively formed by a droplet discharge method, screen printing, or the like while the first conductive layer 27 is formed by forming a conductive material over the entire surface by CVD or sputtering followed by selective etching. In this case, the second conductive layer 28 can be formed without etching, so that damages to the organic compound layer 29 can be suppressed.

Figure 2D:
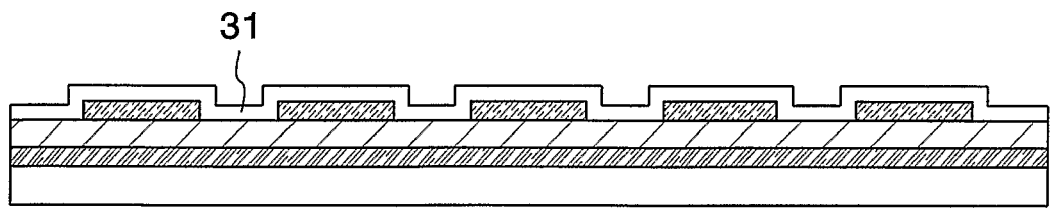

Next, insulating layer 31 serving as a protective film is provided so as to cover the second conductive layer 28 (FIG. 2D).

Through the above steps, a passive matrix memory cell array including an organic memory element can be formed. Materials used in each step above will be specifically described below.

As the substrate 30, for example, a glass substrate such as a barium borosilicate glass substrate or aluminoborosilicate glass substrate, a quartz substrate, a ceramic substrate, or the like can be used. Further, a metal substrate containing stainless-steel or a semiconductor substrate each of which an insulating layer is formed on the surface may be used. Although a substrate made of a flexible synthetic resin, such as PET generally has lower heat-resistance than the above-described substrate, it can be used as long as it can withstand process temperature in the manufacturing steps. The surface of the substrate 30 may be planarized in advance by polishing such as a CMP method.

Further, the first conductive layer 27 and the second conductive layer 28 may have a single layer containing an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), and titanium (Ti), tantalum (Ta) or an alloy containing a plurality of the elements. As the alloy containing a plurality of the elements, for example, an alloy containing Al, Ti, and C, an alloy containing Al and Ni, an alloy containing Al and C, an alloy containing Al, Ni, and C, an alloy containing Al and Mo, or the like can be used. Alternatively, a conductive polymer of which conductivity is improved by doping or the like, such as conductive polyaniline, conductive polypyrrole, or conductive polythiophen, a complex of polyethylene dioxythiophene (PEDOT) and polystyrenesulphonic (PSS), or the like can be used. A light-transmitting conductive material may also be used instead. Particularly in case of writing data by optical action, it is preferable to use a light-transmitting conductive material. As the light-transmitting conductive material, indium tin oxide (ITO), zinc oxide (ZnO), indium zinc oxide (IZO), zinc oxide added with gallium (GZO), or the like can be used. Indium tin oxide containing silicon oxide (hereinafter referred to as ITSO) or a material in which 2 to 20% of zinc oxide (ZnO) is mixed into ITSO may be used instead. The conductive layers can be formed by a droplet discharge method; vapor deposition, sputtering, CVD, spin coating, screen printing or gravure printing using the above material.

The organic compound layer 29 is provided to have a single layer structure or a layered structure of a layer containing conductive organic compound material. Specific examples of a conductive organic compound material include a high molecular weight compound having a carrier transporting property and the like.

As a high molecular weight compound having a carrier transporting property, poly (p-phenylene vinylene) (PPV), [methoxy-5-(2-ethyl)hexyloxy]-p-phenylene vinylene (MEH-PPV), poly (9,9-dialkylfluorene) (PAF), poly (9-vinylcarbazole) (PVK), polypyrrole, polythiophen, polyacetylene, poly pyrene, poly carbazole, or the like can be used. Further, oligomer or the like with lower degree of polymerization than the above macromolecular compound may be used. The materials can be formed by spin coating, a droplet discharge method, screen printing, gravure printing, vapor deposition, or the like.

As an insulating layer 31, a layer or a stack of an inorganic material containing oxygen or nitrogen or the like, such as silicon oxide (SiOx), silicon nitride (SiNx), silicon oxynitride (SiOxNy) (x>y), silicon nitride oxide (SiNxOy) (x>y), or the like can be used. Alternatively, an organic material such as polyimide, polyamide, polyvinyl carbolic acid, benzocyclobutene, acrylic, epoxy, or siloxane may be used in the single layer or the stack. A stack of an organic compound material and an inorganic compound material may be provided instead. A siloxane material is a material containing an Si—O—Si bond. As for siloxane, the skeletal structure includes silicon (Si) and bond with oxygen (O). As the substituent, an organic group containing at least hydrogen (for example, an alkyl group or aromatic hydrocarbon) may be used. As another substituent, a fluoro group may be used. Alternatively, both an organic group containing at least hydrogen and a fluoro group may be used as the substituent.

Note that the structure shown in FIGS. 2A to 2D are only examples, and the structure is not limited thereto. The case of another structure are shown in FIGS. 3A to 3E.

Figure 3A:
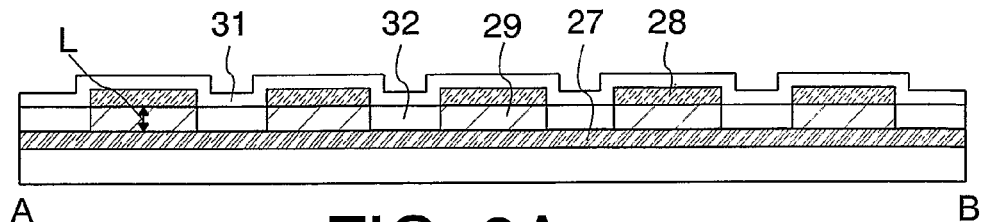
FIGS. 3A to 3E each shows an example of a structure of a semiconductor device of the present invention.

In FIGS. 2B to 2D, an organic compound layer 29 is formed so as to cover the entire surface of a first conductive layer 27. However, if influence of electric field in lateral directions between adjacent memory cells is concerned; an insulating layer 32 may be provided between organic compound layers provided in memory cells so that the organic compound layers provided in memory cells are isolated from each other (FIG. 3A). In other words, an organic compound layer may be selectively provided in each memory cell. In this case, the organic compound layers can be selectively formed in memory cells efficiently by a droplet discharge method, screen printing, gravure printing, or the like.

Figure 3B:
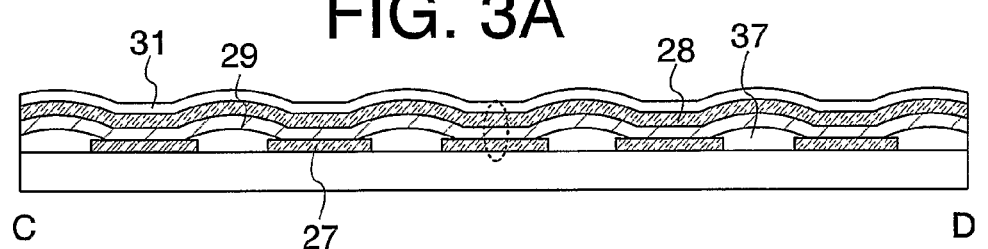

Further, in providing the organic compound layer 29 covering the first conductive layer 27, insulating layer 37 may be provided to cover an end portion of the first conductive layer 27 and between the first conductive layers 27 thereby preventing disconnection of the organic compound layer 29 due to the level differences between the first conductive layer 27 and influence of electric field in lateral directions between cells (FIG. 3B). In this case, the insulating layer 37 may be selectively provided between a plurality of the first conductive layers 27.

Figure 3C:
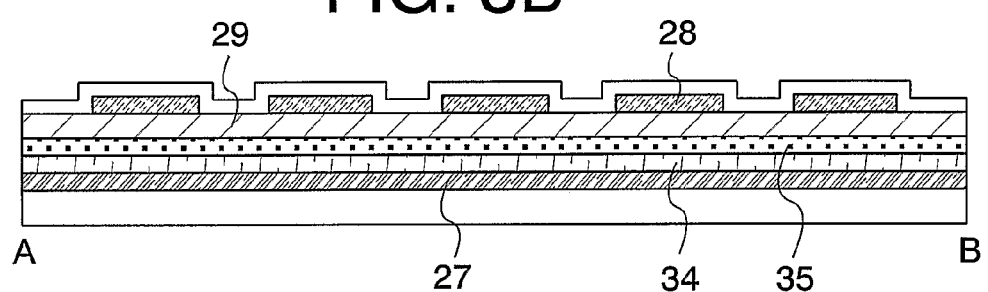
Figure 3D:
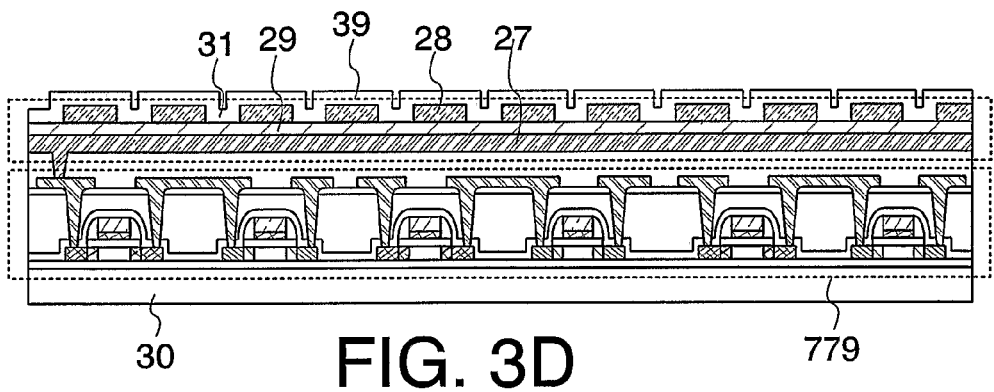

Further, in the structures shown in FIGS. 2A to 2D, a rectifying element may be provided between the first conductive layer 27 and the organic compound layer 29 (FIG. 3C). As typical the rectifying elements, a Schottky diode, a diode having a PN junction, a diode having a PIN junction, or a transistor in which a gate electrode and a drain electrode are connected can be used. Naturally, the rectifying element may be a diode having another structure. Here, a PN junction diode including semiconductor layers 34 and 35 between the first conductive layer and the organic compound layer is provided. One of the semiconductor layers 34 and 35 is an N-type semiconductor while the other is a P-type semiconductor. Thus, saccuracy and margin of reading and writing can be improved by providing the rectifying element.

Figure 3E:
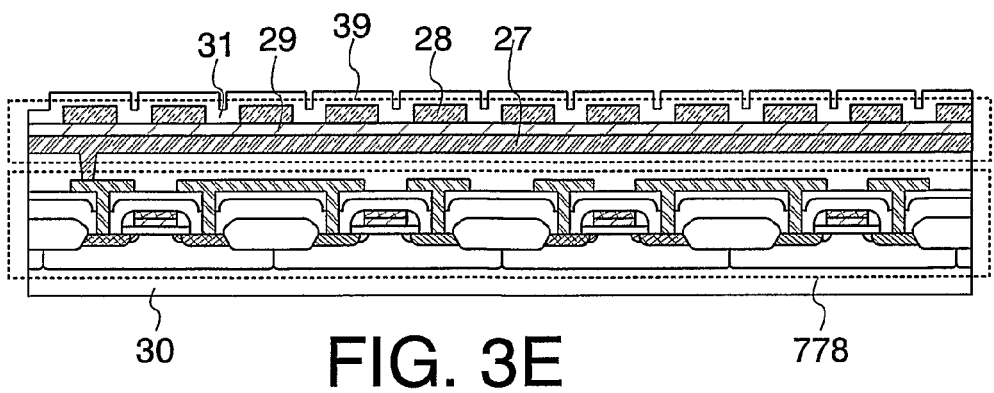

Further, a structure in which a memory element 39 including a plurality of memory elements is provided over the substrate 30 is shown in FIG. 2D. However, it is not limited thereto, and the memory element portion 39 may be formed above thin film transistors (TFT) 779 provided over a substrate 30 (FIG. 3D), or the memory element portion 39 may be provided over filed effect transistors (FET) 78 formed over the substrate 30, which is a semiconductor substrate such as a Si substrate or an SOI substrate. Incidentally, the FETs 778 uses the substrate 30 as a channel forming region of the transistors (FIG. 3E). Examples of forming the memory element portion 39 over the thin film transistors 779 or the field effect transistors 778 are shown here; however, the memory element portion 39 and the thin film transistors 79 or the memory element portion 39 and the field effect transistors 778 may be attached to each other. In this case, the memory element portion 39 and the thin film transistors 779 or the memory element portion 39 and the field effect transistors 778 may be manufactured in separate processes and may be adhered to each other using a conductive film, or the like. Further, the thin film transistors 779 or the field effect transistors 778 may have any known structure.

Thus, in this embodiment mode, the organic compound layer in the memory element can be formed by a droplet discharge method, spin coating, a printing method such as screen printing or gravure printing, or the like. Therefore, a memory device or a semiconductor device can be manufactured easily at low cost. Further, a memory element portion described in this embodiment mode can be manufactured with a minute structure, so that a semiconductor device having memory circuit with high capacity can be obtained.

Embodiment Mode 2

In this embodiment mode, a semiconductor device having a structure different from Embodiment Mode 1 will be described. Specifically, the case where the memory circuit has an active matrix structure will be shown.

Figure 4A:
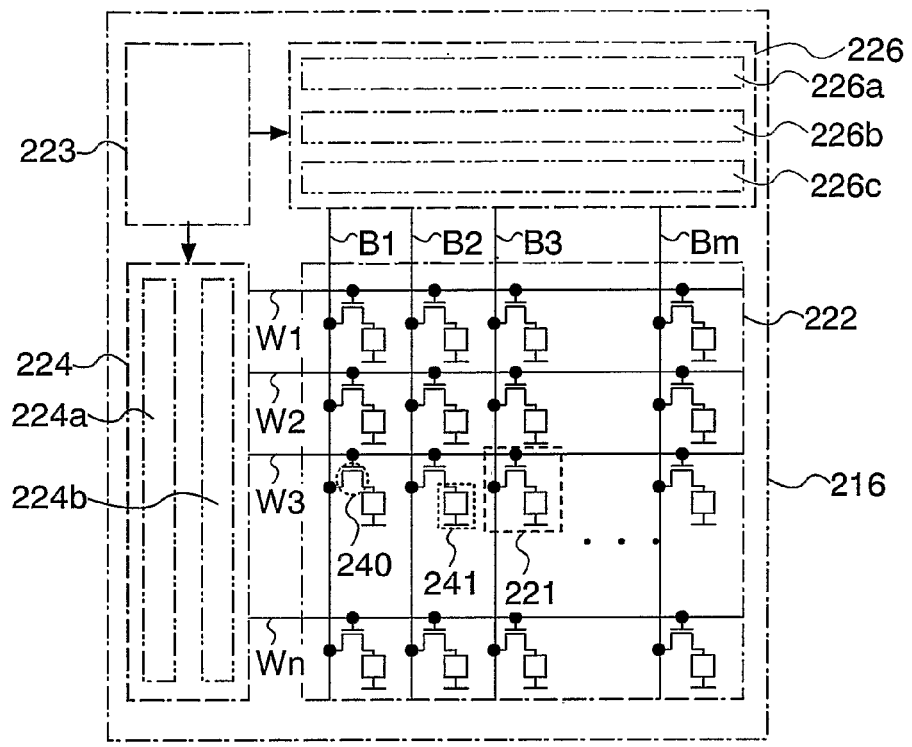
FIGS. 4A and 4B each shows an example of a structure of a semiconductor device of the present invention.

FIG. 4A shows a structure of a semiconductor device of the present invention as an example. The memory circuit includes a memory cell array 222 in which memory cells 221 are arranged in matrix; a bit line driver circuit 226 including a column decoder 226a, a read circuit 226b, and a selector 226c; a word line driver circuit 224 including a row decoder 224a and a level shifter 224b; and an interface 223 having a writing circuit, which communicates with outside. Note that the structure shown here is only an example; accordingly, the memory circuit 216 may include another circuit such as a sense amplifier, an output circuit, a buffer, and the writing circuit on the bit line driver circuit.

The memory cell 221 includes at least a transistor 240 and a memory element 241 (an organic memory element). The transistor 240 is connected to a first wiring constituting a word line Wy ($1 \leq y \leq n$) and a second wiring constituting a bit line Bx ($1 \leq x \leq m$).

Figure 4B:
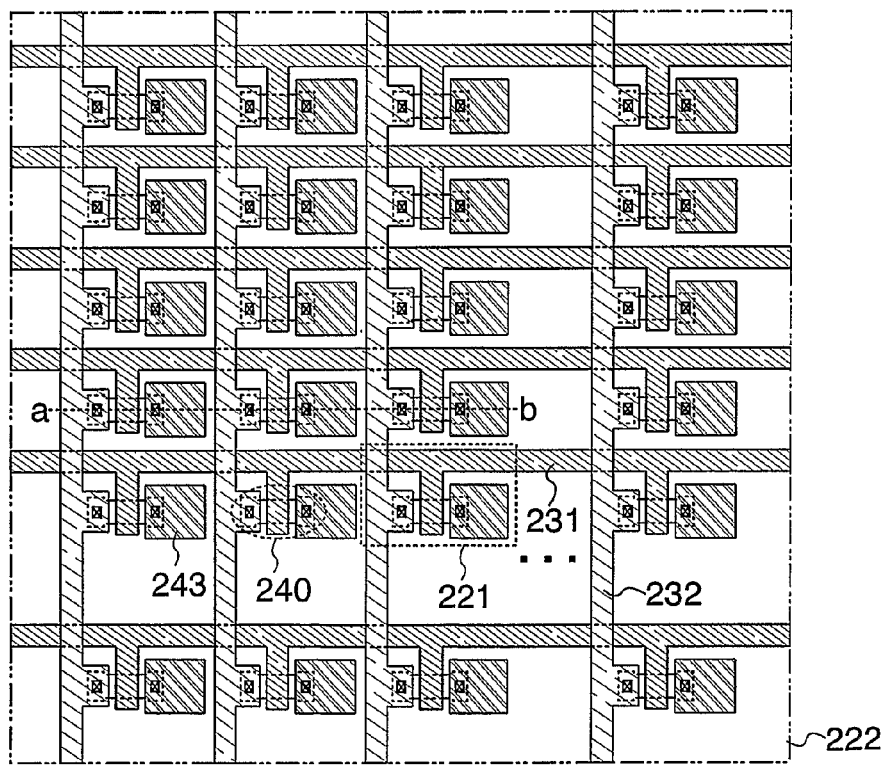

FIG. 4B shows an example of a planar structure of the memory cell array 222.

In the memory cell array 222, a first wiring 231 extending in a first direction and a second wiring 232 extending in a second direction different from the first direction (here, in the perpendicular direction) are arranged in matrix. Further, the second wiring 232 is electrically connected to one of the source and drain regions of the transistor 240, and the first wiring 231 is electrically connected to the gate electrode of the transistor 240 here. Furthermore, the other one of the source and the drain regions of the transistor 240 which is not connected with the first wiring is connected to a first conductive layer 243. The organic memory element 241 is provided with a layered structure of the first conductive layer 243, the organic compound layer, and a second conductive layer.

Next, a method for manufacturing an organic memory having the above structure will be explained with reference to FIGS. 5A to 5D. FIGS. 5A to 5D show cross-sectional views of the memory cell array 222 shown in FIG. 4B taken along line a-b, and cross-sectional views of a CMOS circuit included in the bit line driver circuit 226.

Figure 5A:
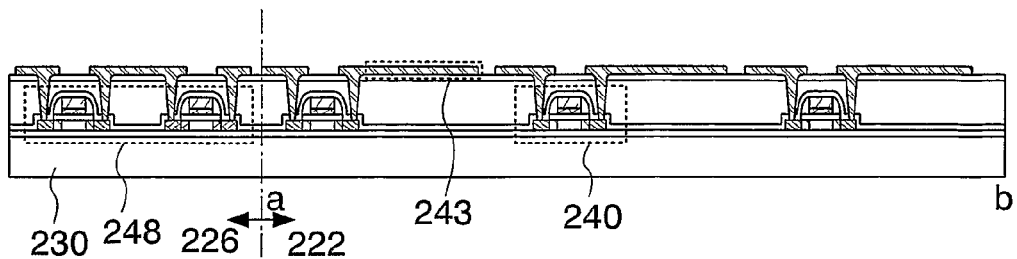
FIGS. 5A to 5E show an example of a method for manufacturing a semiconductor device of the present invention.

First, a plurality of transistors 240 each of which serves as a switching element of a memory element and transistors 248 partly constituting a CMOS circuit included in a bit line driver circuit 226 are formed over a substrate 230. Subsequently, a source electrode and a drain electrode are formed so as to connect to the source region and the drain region of the transistors 240, respectively (FIG. 5A). Here, one of the source and the drain electrodes of the transistor 240 is also used as the first conductive layer 243 included in the memory element. Further, in the case of using a different material for the first conductive layer 243 from the source electrode or the drain electrode, after the source electrode or the drain electrode is formed, the first conductive layer 243 may be separately formed so as to electrically connect to the source region or the drain region. The first conductive layer 243 can be formed by vapor deposition, sputtering, CVD, a droplet discharge method, spin coating, screen printing, gravure printing, or the like.

Figure 5B:
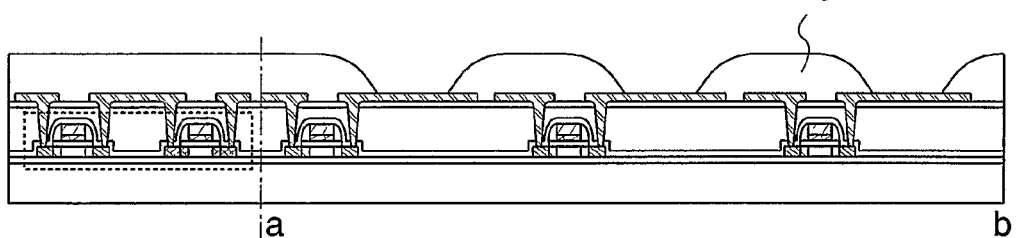

Next, an insulating layer 249 serving as a protective film is formed so as to cover an end portion of the first conductive layer 243 and the source electrodes and the drain electrodes of the transistors 240 and 248 (FIG. 5B). The insulating layer 249 may be formed by directly and selectively formed by, for example, a droplet discharge method, screen printing, or gravure printing. Alternatively, the insulating layer 249 may be formed by CVD, sputtering, or spin coating and selective etching so that part of the first conductive layer 243 is exposed.

Figure 5C:
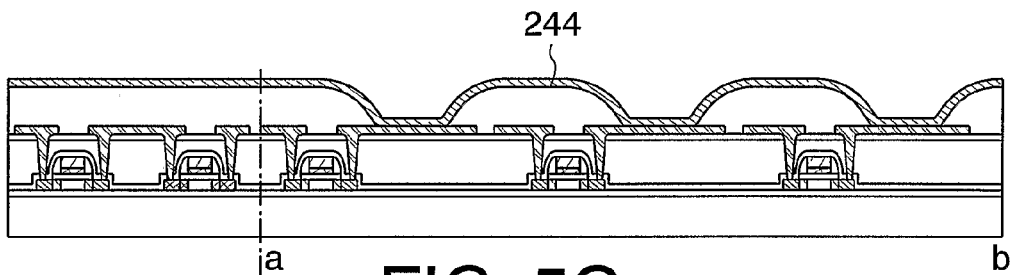

Subsequently, an organic compound layer 244 is formed over the first conductive layer 243 (FIG. 5C). Note that the organic compound layer 244 may be formed over the entire surface as shown in FIG. 5C, or may be selectively formed so that the organic compound layer provided in each memory cell is separated. The organic compound layer 244 can be formed by a droplet discharge method, screen printing, gravure printing, spin coating, vapor deposition, or the like. In the case of providing the organic compound layer 244 over the entire surface as shown in FIG. 5C, the operation efficiency can be improved by using spin coating or vapor deposition. Meanwhile, in the case of selectively providing the organic compound layer 244, the efficiency in the use of the material can be improved by a droplet discharge method, screen printing, gravure printing, or the like. Further, even in the case of using spin coating or vapor deposition, the organic compound layer can be selectively formed by selectively providing a mask in advance, or by forming it over the entire surface and etching it thereafter. A method to be employed may be determined by the practitioner.

Figure 5D:
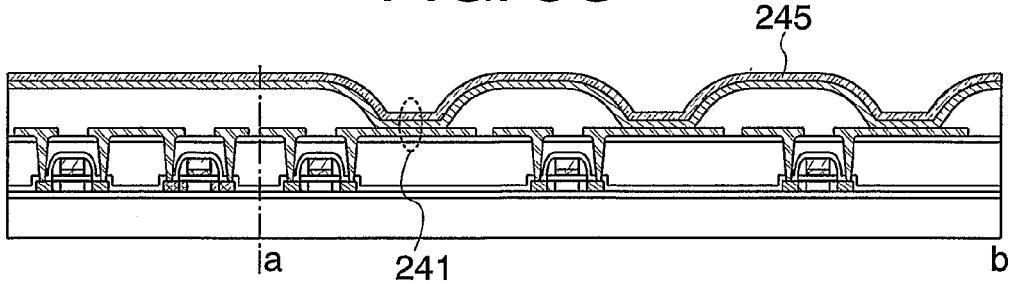

Next, a second conductive layer 245 is formed over the organic compound layer 244 (FIG. 5D). The second conductive layer 245 can be formed by vapor deposition, sputtering, CVD, a droplet discharge method, spin coating, screen printing, gravure printing, or the like similarly to the first conductive layer. The first conductive layer 243 and the second conductive layer 245 may be formed by different methods. Thus, a memory element 241 (an organic memory element) having a layered structure of the first conductive layer 243, the organic compound layer 244, and a second conductive layer 245 is formed.

Figure 5E:
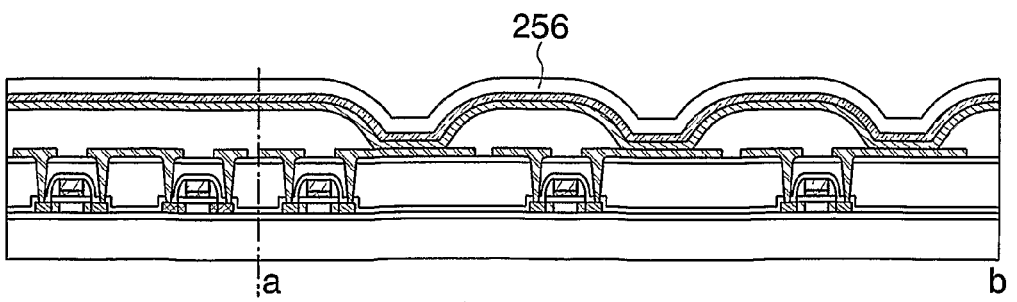

Next, an insulating layer 256 serving as a protective film is provided so as to cover the second conductive layer 245 (FIG. 5E). The insulating layer 256 can be formed to have a single layer or a layered structure by vapor deposition, sputtering, CVD, a droplet discharge method, spin coating, screen printing, gravure printing, or the like.

Through the above steps, a semiconductor device having an active matrix memory circuit can be formed. Materials used in each step above will be specifically described below.

As the substrate 230, for example, a glass substrate such as a barium borosilicate glass substrate or aluminoborosilicate glass substrate, a quartz substrate, a ceramic substrate, or the like can be used. Further, a metal substrate containing stainless-steel or a semiconductor substrate in each of which an insulating layer is formed on the surface may be used. Although a substrate made of a flexible synthetic resin, such as PET, generally has lower heat-resistance than the above-described substrate, it can be used as long as it can withstand process temperature in the manufacturing steps. The surface of the substrate 230 may be planarized in advance by polishing such as a CMP method.

The transistors 240 may have any structure as long as it can function as a switching element. For example, a glass substrate or a flexible substrate is used as the substrate 230, and thin film transistors (TFTs) may be formed over the substrate. Alternatively, a semiconductor substrate of Si or the like, or an SOI substrate is used, field effect transistors (FETs) using the substrate as a channel forming region of the transistors may be formed.

The structure of a semiconductor layer included in either the transistors 240 or the transistors 248 may have any structure; for example, an impurity region (including a source region, a drain region, and an LDD region) can be formed. As a type of the circuit, any of using a p-channel type only, an n-channel type only, or a CMOS type may be used. Further, an insulating layer (sidewall) may be provided so as to be in contact with a side of the gate electrode, or a silicide layer may be formed in the source region, drain region, or gate electrode. As a material of the silicide layer, nickel, tungsten, molybdenum, cobalt, platinum, or the like can be used.

As a material of the first conductive layer 243 or the second conductive layer 245, an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), and titanium (Ti), tantalum (Ta) or an alloy containing a plurality of the elements can be used in a single layer or a layered structure. As the alloy containing a plurality of the elements, for example, an alloy containing Al, Ti, and C, an alloy containing Al and Ni, an alloy containing Al and C, an alloy containing Al, Ni, and C, an alloy containing Al and Mo, or the like can be used. Alternatively, a known conductive polymer of which conductivity is improved by doping or the like, such as conductive polyaniline, conductive polypyrrole, or conductive polythiophen, a complex of polyethylene dioxythiophene (PEDOT) and polystyrenesulphonic (PSS), or the like can be used. A light-transmitting conductive material may also be used instead. Particularly, it is preferable to use a light-transmitting conductive material if writing data by optical action. As the light-transmitting conductive material, indium tin oxide (ITO), zinc oxide (ZnO), indium zinc oxide (IZO), zinc oxide added with gallium (GZO), or the like can be used. Indium tin oxide containing silicon oxide (hereinafter referred to as ITSO) or a material in which 2 to 20% of zinc oxide (ZnO) is mixed into ITSO may be used instead. The conductive layers can be each formed by a droplet discharge method, vapor deposition, sputtering, CVD, spin coating, screen printing or gravure printing using the above material. For example, the conductive layer may be formed by a droplet discharge method using Ag or may be formed by vapor deposition using Al.

As the organic compound layer 244, the same material as the organic compound layer 29 described in Embodiment Mode 1 can be used. For example, indium tin oxide containing silicon oxide is used for the first conductive layer 243, poly (9-vinylcarbazole) (PVK) is provided over the first conductive layer 243, and Ag is provided by a droplet discharge method as the second conductive layer 245 over the organic compound layer; thus, a memory element can be formed.

As the insulating layer 249 or 256, a layer or a stack of an inorganic material containing oxygen or nitrogen or the like, such as silicon oxide (SiOx), silicon nitride (SiNx), silicon oxynitride (SiOxNy)(x>y), or silicon nitride oxide (SiNxOy) (x>y), an organic material such as polyimide, polyamide, polyvinyl carbolic acid, benzocyclobutene, acrylic, epoxy, or siloxane, or the like can be used. The material of polyimide, polyamide, polyvinyl carbolic acid, benzocyclobutene, acrylic, epoxy, or siloxane, or the like can be efficiently formed by a droplet discharge method, a printing method, spin coating.

Further, in the above structure a rectifying element may be provided between the first conductive layer 243 and the organic compound layer 244 or between the organic compound layer 244 and the second conductive layer 245. The rectifying element may have any structure described in the above embodiment mode.

Figure 6A:
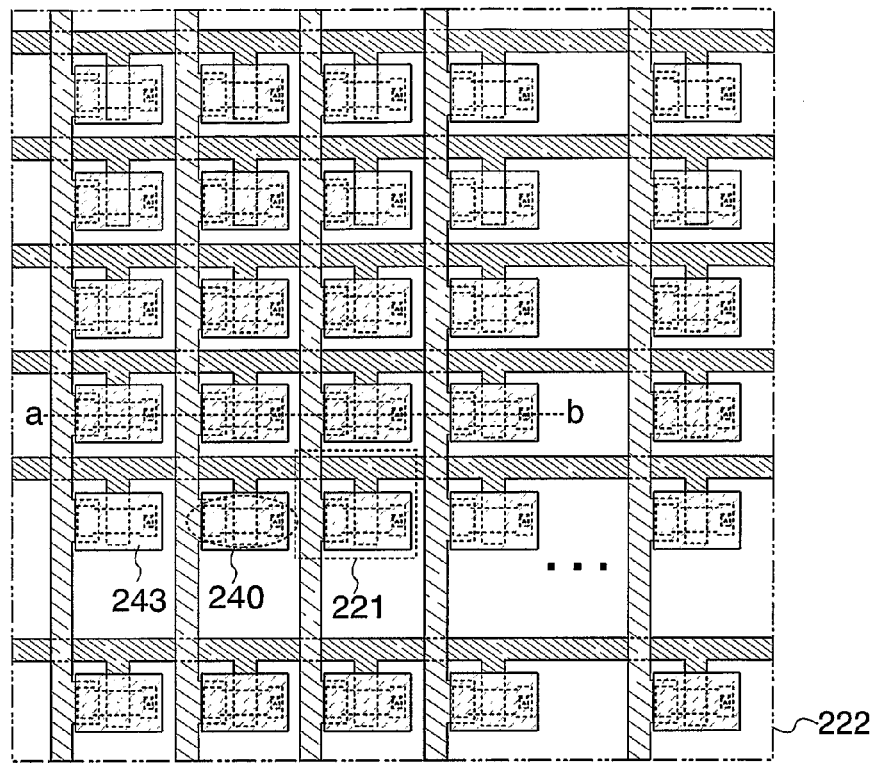
FIGS. 6A to 6C each shows an example of a structure of a semiconductor device of the present invention.
Figure 6B:
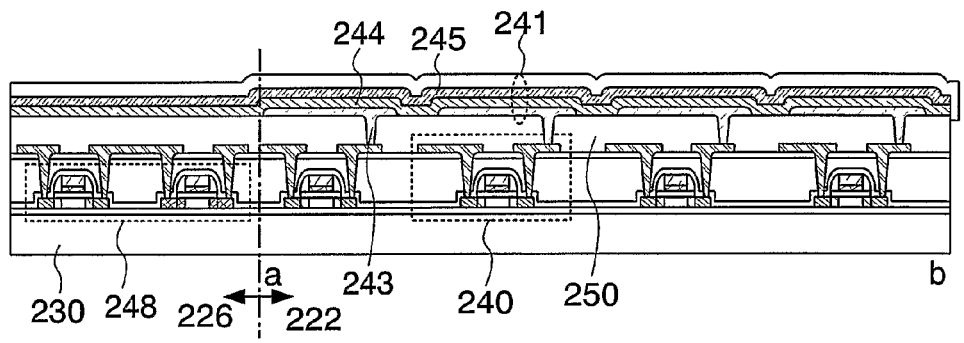
Figure 6C:
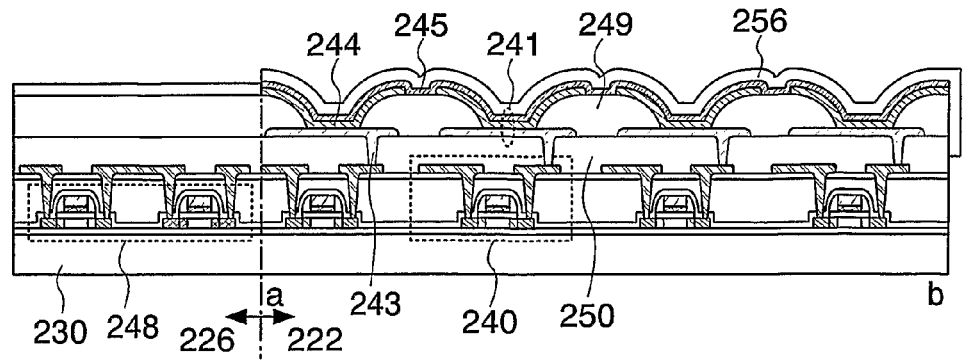

The structure of a semiconductor described in this embodiment mode is not limited to the above structure. For example, insulating layer 250 is provided so as to cover a source electrode and a drain electrode of transistor 240, and first conductive layers 243 can be provided over the insulating layers 250 (FIG. 6B and 6C). In this case, the organic compound layer 244 can be formed over the entire surface to cover the first conductive layers 243 by spin coating or vapor deposition (FIG. 6B). Further, disconnection of the organic compound layer 244 or influence of electric field in lateral directions between adjacent cells is concerned, insulating layers 249 may be provided to isolate the organic compound layer provided in each memory cells (FIG. 6C). In addition, in FIG. 6C, organic compound layers 244 are provided selectively in memory cells by a droplet discharge method, a printing method, or the like; however, the organic compound layer 244 may be provided over the entire surface as shown in FIGS. 5C to 5E.

In such a structure, where the first conductive layer 243 is provided so as to electrically connect to the source or drain electrode via the insulating layer 250, the first conductive layer can be provided more freely than the case of providing the first conductive layer 243 in one layer as the source electrode and the drain electrode. In the structure of FIG. 5A to 5E, the memory element 241 is necessarily provided in a region other than the source electrode or the drain electrode of each transistor 250; however, by providing the memory element 241 over the insulating layers 240, for example, the memory elements 241 can be formed above the transistors 250. Consequently, higher integration of the memory cell 221 can be achieved (FIG. 6A).

Further, as an another structure different from the above structure, a first conductive layer 243 and a second conductive layer 245 may be arranged in one layer to form a memory element 241. An example of the structure in this case will be explained with reference to FIG. 19A to 19C.

Figure 19A:
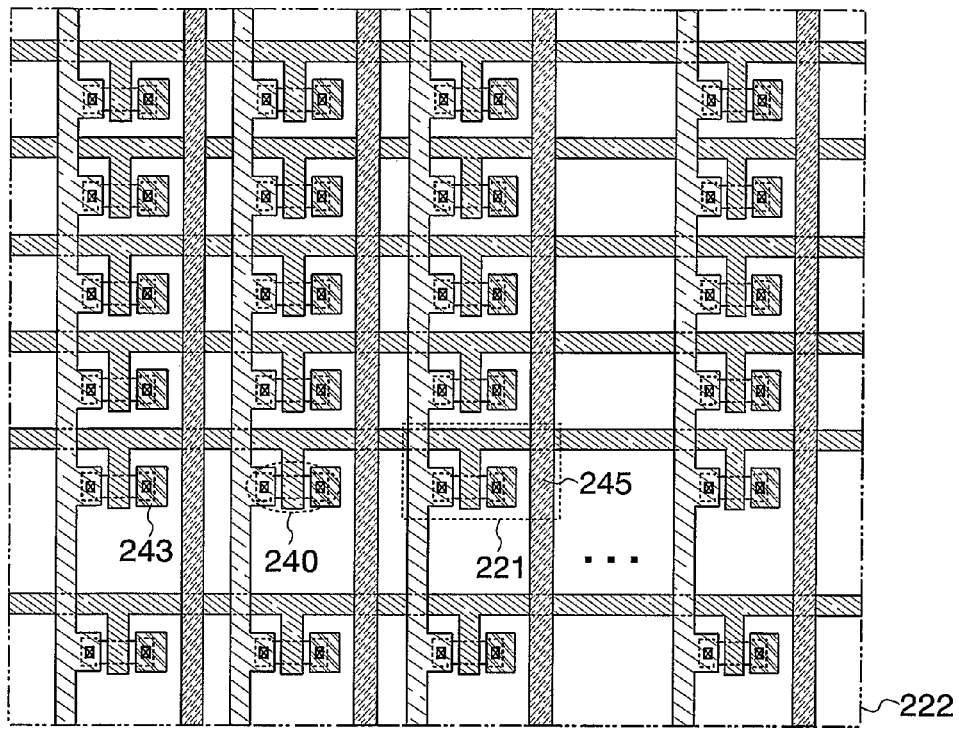
FIGS. 19A to 19C each show an example of a structure of a semiconductor device of the present invention.
Figure 19B:
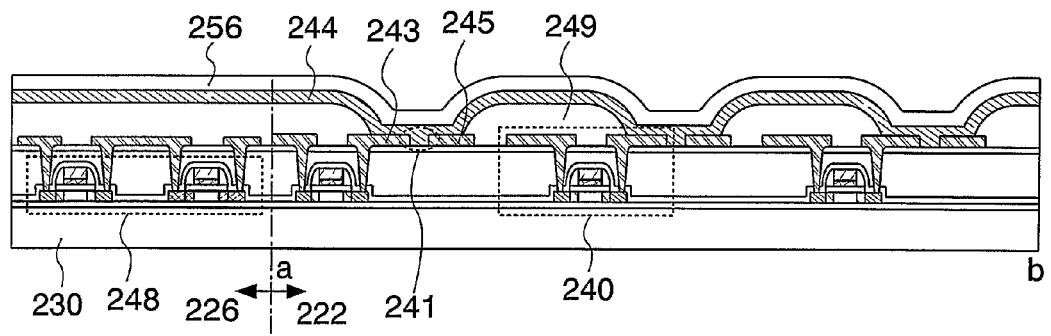
Figure 19C:
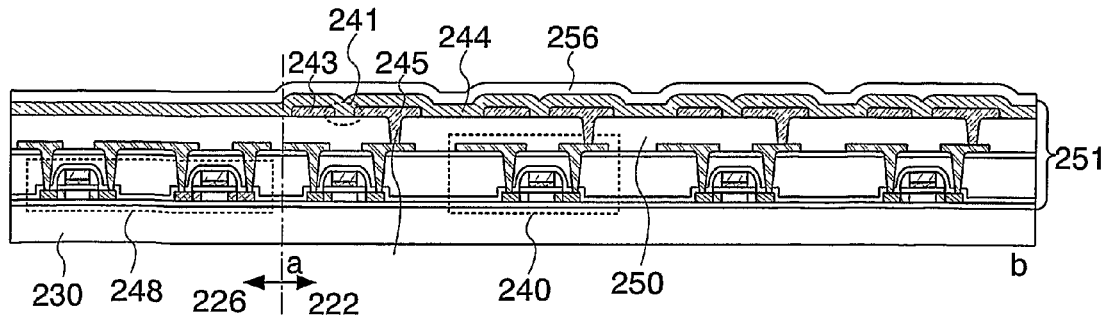

In FIG. 5A to 6C, memory element 241 is formed with a stack in which an organic compound layer is sandwiched between a first conductive layer 243 and a second conductive layer 245 provided above and below the organic compound layer. Here, the first conductive layer 243 and the second conductive layer 245 are provided on one layer to laterally sandwich the organic compound layer 244 thereby forming the memory element 241 (FIG. 19A to 19C). In this case, the first conductive layer 243 has a function of a source or drain electrode of a transistor 240 and the second conductive layer is also formed on the same layer as the source or drain electrode. If the conductive layer 243 and the second conductive layer 245 can be formed using the same material, the conductive layer 243 and the second conductive layer 245 can be formed concurrently; thus, the number of manufacturing steps can be reduced. Here, an example of providing the organic compound layer 244 over the entire surface is shown; however, the structure is not limited thereto, and the organic compound layer 244 can be formed selectively.

The insulating layers 250 can be provided so as to cover the source electrode and the drain electrode of transistor 240, and first conductive layer 243 and second conductive layers 245 can be provided over the insulating layers 250 (FIG. 19C). This structure is effective in the case of forming a source and drain electrodes and the first conductive layer 243 with different materials, for example, in the case of providing the first conductive layer 243 with a light-transmitting material. Further, by forming the first conductive layer 243 and the second conductive layer 245 over the insulating layers 250, the first conductive layer and the second conductive layer can be provided freely, so that a more highly integrated memory element 241 can be provided. Also in this case, if the first conductive layers 243 and the second conductive layer 245 are concurrently formed with the same material, the number of the manufacturing steps can be reduced.

Note that, in the structure of FIG. 19A to 19C, the conductive layer 243 and the second conductive layer 245 may not necessarily be provided on the same layer. For example, in the structure of FIG. 19C, the second conductive layer 245 may be formed above the organic compound layer 245, so that the first conductive layers 243 and the second conductive layers 245 are obliquely arranged with the organic compound layer 244 provided above the first conductive layers 243 and below the second conductive layers 245. With such a structure, even if a contaminant such as dust exists on the first electrode, the contaminant can be prevented from affecting the memory element.

This embodiment mode can be freely combined with any of the above embodiment modes.

Embodiment Mode 3

In this embodiment mode, another example of a semiconductor device different from the above embodiment mode will be explained with reference to drawings.

A semiconductor device shown in this embodiment mode is capable of non-contact reading and writing of data. Data transmission method is broadly classified into three, an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna that is used for transmitting data can be provided in two ways. One way is to provide the antenna over a substrate provided with a plurality of elements, memory elements, and the like, and the other way is to provide a terminal portion over a substrate provided with a plurality of elements, memory elements, and the like and to connect an antenna provided over another substrate to the terminal portion.

First, an example of a structure of a semiconductor device in the case of providing an antenna over a substrate provided with a plurality of elements, memory elements, and the like will be explained with reference to FIGS. 7A and 7B.

Figure 7A:
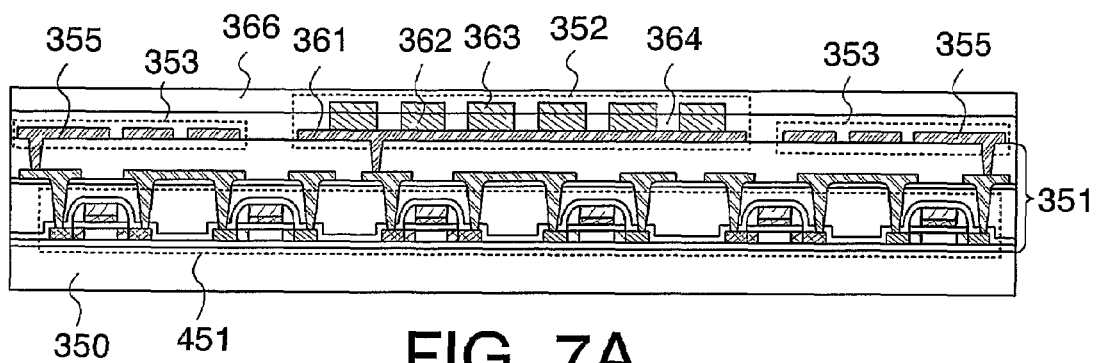
FIGS. 7A and 7B each shows an example of a structure of a semiconductor device of the present invention.

FIG. 7A shows a semiconductor device including a passive matrix organic memory. An element formation layer 351 including a plurality of transistors 451 is provided over a substrate 350, and a memory element portion 352 including a plurality of organic memories and an antenna portion 353 are provided above the element formation layer 351. The case of providing the memory element portion 352 or the antenna portion 353 above the element formation layer 351 is shown here; however, the structure is not limited thereto. The memory element portion 352 and the antenna portion 353 can be provided below the element formation layer 351 or in the same layer.

As the substrate 350, for example, a glass substrate such as a barium borosilicate glass substrate or aluminoborosilicate glass substrate, a quartz substrate, a ceramic substrate, or the like can be used. Further, a metal substrate containing stainless-steel or a semiconductor substrate in each of which an insulating layer is formed on the surface may be used. Although a substrate made of a flexible synthetic resin, such as PET generally has lower heat-resistance than the above-described substrate, it can be used as long as it can withstand process temperature in the manufacturing steps.

A plurality of organic memory elements included in the memory element portion 352 are provided with a stack of a first conductive layer 361, an organic compound layer 362, and a second conductive layer 363, and an insulating layer 366 which functions as a protective film is provided so as to cover the second conductive layer 363. Here, an insulating layer 364 is provided between memory cells (between the plurality of organic memory elements) so that an organic compound layer is provided in each memory cell; however, the organic compound layer 362 may be formed over the entire surface so as to cover the first conductive layer 361. Note that the memory element portion 352 can be formed using materials and methods shown in the above embodiment modes.

In the memory element portion 352, a rectifying element may be provided between the first conductive layer 361 and the organic compound layer 362 or between the organic compound layer 362 and the second conductive layer 363 shown in the above embodiment mode. The rectifying element can be one of the above-described ones.

In an antenna portion 353, a conductive layer 355 which functions as an antenna is provided. Here, the conductive layer 355 is provided on the same layer as the first conductive layer 361, and the same material may be used to form the conductive layer 355 and the first conductive layer 361. The conductive layer 355 may be formed on the insulating layer 364 or the insulating layer 366. When the conductive layer 355 is provided over the insulating layer 364, it can be formed using the same material as the second conductive layer 363.

The conductive layer 355 which functions as an antenna is connected to a transistor partly constituting a waveform shaping circuit or a rectifying circuit. Here, the conductive layer 355 which functions as an antenna is connected to any one of the plurality of the transistors 451. After the data sent from the outside without contact is processed in a waveform shaping circuit or a rectifying circuit, data exchange (data writing or data reading) is carried out in the organic memory element via a read circuit or a write circuit.

As the material of the conductive layer 355, an element selected from gold (Au), silver (Ag), platinum (Pt), nickel (Ni), tungsten (W), molybdenum (Mo), cobalt (Co), copper (Cu), aluminum (Al), manganese (Mn), or titanium (Ti) or an alloy containing a plurality of the elements can be used. Further, vapor deposition, sputtering, CVD, a droplet discharge method, gravure printing, screen printing, or the like may be used to form the conductive layer 355.

The element formation layer 351 includes at least a transistor. Using the transistor, any kind of integrated circuit such as a CPU (central processing unit), a memory, or a microprocessor can be provided. Further, in this embodiment mode, the transistors 451 included in the element formation layer 351 each can be a p-channel TFT or an n-channel TFT, both of a p-channel transistor and an n-channel transistor, which is called as a CMOS circuit. Further, any structure may be used for a semiconductor layer included in the transistors 451. For example, an impurity region (including a source region, a drain region, and an LDD region) may be formed. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

The transistors 451 included in the element formation layer 351 each may be an organic transistor in which the channel forming region is formed of an organic material. In this case, the element formation layer 351 having the organic transistors can be formed by printing or a droplet discharge method directly over the substrate 350 that is a flexible substrate such as a plastic substrate. Further, in that case, a semiconductor device can be manufactured at low cost by also forming the memory element portion 352 by a droplet discharge method, screen printing, gravure printing, or the like as described above.

Figure 7B:
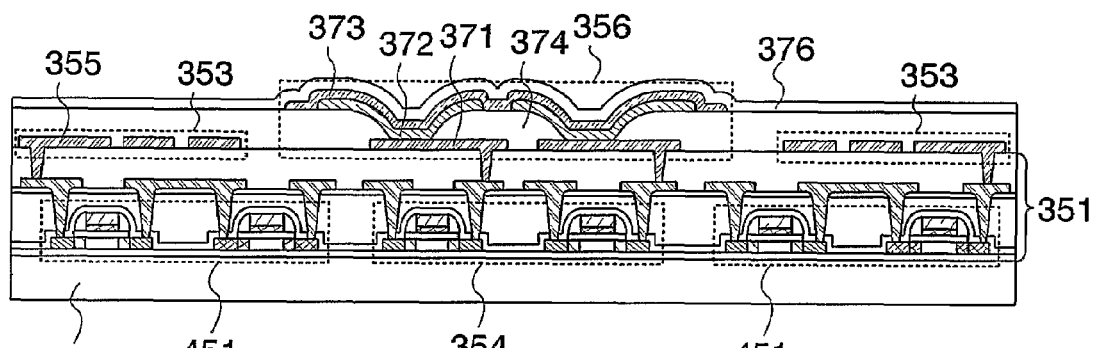

FIG. 7B shows an example of a semiconductor device having an active matrix organic memory. As for a semiconductor device shown in FIG. 7B, an element formation layer 351 including transistors 451 and 354 is provided over a substrate 350, a memory element portion 356 and an antenna portion 353 are provided above the element formation layer 351. Here, the transistor 354 which functions as a switching element of the memory element portion 356 is provided on the same layer as the transistor 451, and the memory element portion and the antenna portion 353 are formed above the element formation layer 351. However, the structure is not limited thereto, and the transistor 354 may be provided above or below the element formation layer 351, or the memory element portion 356 and the antenna portion 353 can be provided below or in the same layer as the element formation layer 351.

The plurality of organic memory elements included in the memory element portion 356 has a stack of a first conductive layer 371, an organic compound layer 372, and a second conductive layer 373, and an insulating layer 376 is provided as a protective film so as to cover the second conductive layer 373. Here, the insulating layer 374 is formed to cover an end of the first conductive layer 371, and the organic compound layer 372 is selectively formed in each memory cell; however, the organic compound layer 372 may be formed over the entire surface so as to cover the first conductive layer 371 and the insulating layer 374. The memory element portion 356 can be formed using materials and methods shown in the above embodiment modes. Further, in the memory element portion 356, a rectifying element may also be provided between the first conductive layer 371 and the organic compound layer 372 or between the second conductive layer 373 and the organic compound layer 372, as described above.

The conductive layer 355 provided in the antenna portion 353 may be formed on the same layer as the second conductive layer 373 or over the insulating layer 374 or the insulating layer 376. In the case where the conductive layer 355 is provided on the same layer as the first conductive layer 371 or the second conductive layer 373, the conductive layer 355 can be formed from the same material as the first conductive layer 371 or the second conductive layer 373 using at the same process step. The conductive layer 355 which functions as an antenna is connected to a transistor partly constituting a waveform shaping circuit or a rectifying circuit. Here, the conductive layer 355 which functions as an antenna is connected to any one of the transistors constituting a waveform shaping circuit or a rectifying circuit. After the data sent from the outside without contact is processed in a waveform shaping circuit or a rectifying circuit, data exchange (data writing or data reading) is carried out in the organic memory element via a read circuit or a write circuit.

The transistors 354 provided in the element formation layer 351 each function as a switching element in writing or reading data into the plurality of organic memory elements included the memory element portion 356. Therefore, the transistors 354 are a P-channel type or an N-channel type. Further, a semiconductor layer included in the transistors 354 may have any structure. For example, an impurity region (including a source region, a drain region, and an LDD region) may be formed, and either a P-channel type or an N-channel type may be used. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

Further, the element formation layer 351, the memory element portion 356, and the antenna portion 353 can be formed by vapor deposition, sputtering, CVD, a droplet discharge method, screen printing, gravure printing, or the like. In addition, different methods may be used to form different parts. For example, the transistors 451 which require high-speed operation are formed using a method of crystallizing a semiconductor layer such as a Si layer formed over a substrate, and thereafter the transistors 354, each of which function as a switching element, are provided as organic transistors above the element formation layer 351 with the use of a droplet discharge method, screen printing, gravure printing, or the like.

The memory element 356 shown in FIG. 7B has a structure in which the first conductive layer 371 is connected to a source or a drain electrode of a transistor of the element formation layer 351 with an insulating layer provided. However, the first conductive layer 371 may be provided on the same layer as the source or drain electrode of the transistor 354 as shown in FIG. 5E. In FIG. 7B, the organic compound layer 372 is selectively provided in each memory cell; however, the organic compound layer may be formed over the entire surface as shown in FIG. 5E. In the case where an organic compound layer is separately provided in each memory cell, a droplet discharge method, screen printing, gravure printing, or the like is preferably used. Meanwhile, in the case where an organic compound layer is provided over the entire surface, spin coating, vapor deposition, or the like is preferably used.

Next, an example of a structure of a semiconductor device in which a terminal portion is provided on a substrate provided with a plurality of elements and memory elements, and an antenna provided on another substrate is connected to the terminal portion will be described with reference to FIGS. 8A and 8B.

Figure 8A:
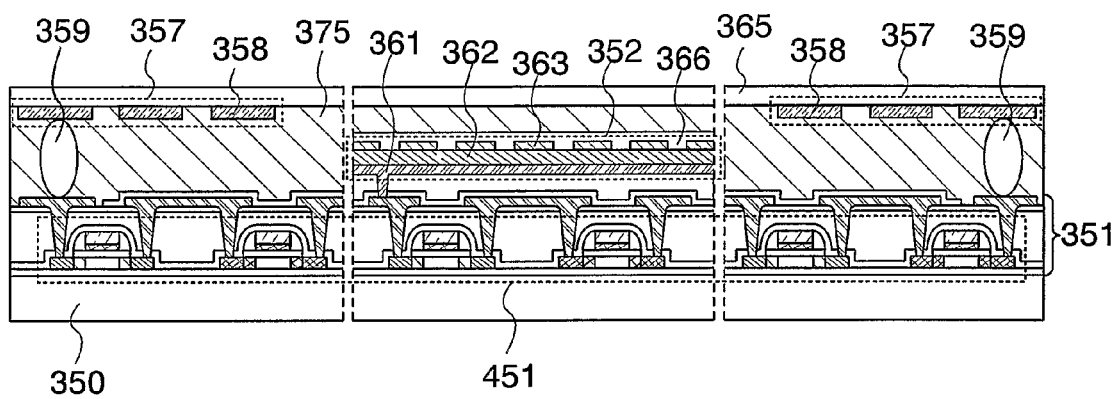
FIGS. 8A and 8B each shows an example of a structure of a semiconductor device of the present invention.

FIG. 8A shows a semiconductor device including a passive matrix organic memory. The element formation layer 351 including a plurality of transistors 451 is provided over a substrate 350, a memory element portion 352 including a plurality of organic memory elements is provided above the element formation layer 351, and an antenna portion 357 provided over a substrate 365 is provided so as to connect to the transistors 451 of the element formation layer 351. Here, the memory element portion 352 and the antenna portion 357 are provided above the element formation layer 351; however, the structure is not limited thereto. The memory element portion 352 may be provided below or in the same layer as the element formation layer 351, or the antenna portion 357 may be provided below the element formation layer 351.

The organic memory element of the memory element portion 352 has a stack of a first conductive layer 361, an organic compound layer 362, and a second conductive layer 363. When disconnection in the organic compound layer 362 or influence of electric field in lateral directions between adjacent memory cells is concerned, an insulating layer may be provided between memory cells to isolate the organic compound layer. Note that the memory element portion 352 can be formed using materials and methods shown in the above embodiment modes.

The substrate provided with the element formation layer 351 and the memory element portion 352 is attached to the substrate 365 provided with the antenna portion 357 with an adhesive resin 375. The element formation layer 351 and a conductive layer 358 are electrically connected via conductive fine particles 359 contained in the resin 375. Alternatively, the substrate provided with the element formation layer 351 and the memory element portion 352 may be attached to the substrate 365 provided with the antenna portion 357 by a conductive adhesive such as silver paste, copper paste, or carbon paste, or by solder bonding.

Figure 8B:
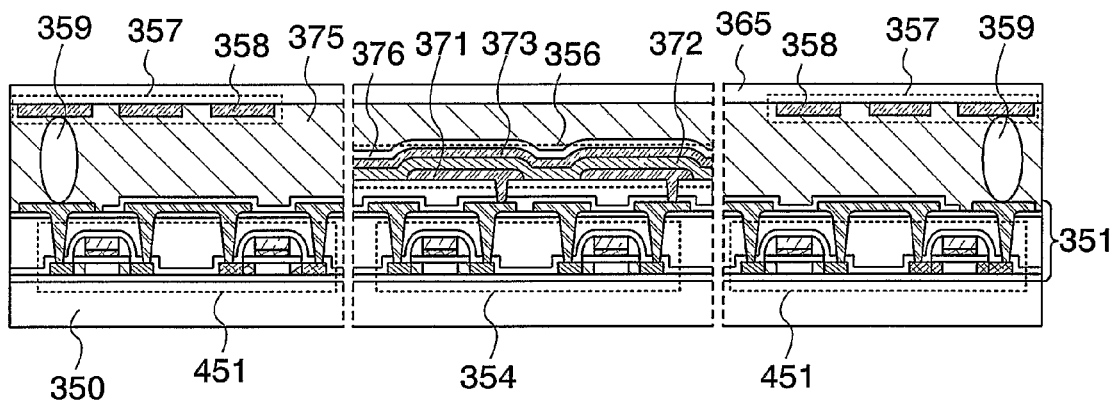

FIG. 8B shows a semiconductor device provided with an active matrix organic memory. The element formation layer 351 including transistors 451 and 354 is provided over a substrate 350, a memory element portion 356 including a plurality of organic memory elements is provided above the element formation layer 351, and an antenna portion 357 provided over a substrate 365 is provided so as to connect to the element formation layer 351. Here, the transistor 354 is provided in the same layer as the transistor 451 in the element formation layer 351, and the antenna portion 357 is provided above the element formation layer 351; however, the structure is not limited thereto. The memory element portion 356 may be provided below or on the same layer as the element formation layer 351, or the antenna portion 357 may be provided below the element formation layer 351.

The organic memory element included in the memory element portion 356 has a stack of a first conductive layer 371, an organic compound layer 372, and a second conductive layer 373. When influence of electric field in lateral directions between adjacent memory cells is concerned, an insulating layer may be provided between memory cells to isolate the organic compound layer. Note that the memory element portion 356 can be formed using materials and methods shown in the above embodiment modes.

Further, also in FIG. 8B, the substrate provided with the element formation layer 351 and the memory element portion 356 is attached to the substrate provided with the antenna portion 357 by resin 375 containing conductive fine particles 359.

Thus, a semiconductor device provided with an organic memory and an antenna can be formed. Further, in this embodiment mode, thin film transistors are provided as the transistors 354 and 451 over the substrate 350. Alternatively, a semiconductor substrate such as a Si substrate is used for the substrate 350 and filed effect transistors (FETs) may be formed over the substrate so as to provide the transistors 354 and 451. Furthermore, an SOI substrate may be used for the substrate 350 and the transistors 354 and 451 may be fabricated using the substrate. In this case, the SOI substrate can be formed by attaching wafers or by using a method called SIMOX by which an insulating layer is formed inside a substrate by implanting oxygen ions into a Si substrate.

This embodiment mode can be freely combined with any of the above embodiment modes.

Embodiment Mode 4

In this embodiment mode, a method of manufacturing a semiconductor device including a thin film transistor, a memory element, and an antenna according to the invention will be described with reference to the drawings.

Figure 21A:
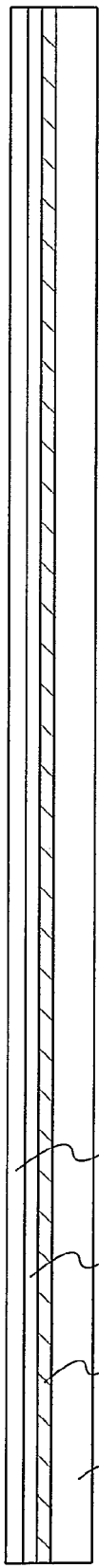
FIGS. 21A to 21C show an example of a method for manufacturing a semiconductor device of the present invention.

First, a release layer 702 is formed over a surface of a substrate 701 (FIG. 21A). The substrate 701 may be a glass substrate, a quartz substrate, a substrate in which an insulating layer is formed over a surface of a metal substrate, or a stainless-steel substrate, or a plastic substrate which can resist the treatment temperature of the manufacturing process. In the case of using such substrates, the area and the shape thereof are not particularly restricted; therefore, by using a rectangular substrate with at least one meter length on a side, the productivity can be drastically improved, for example. This merit is greatly advantageous as compared to the case of using a circular silicon substrate. In addition, the release layer 702 is formed over an entire surface of the substrate 701 in the process; however, the release layer 702 may be selectively provided by using photolithography after the release layer is formed over the entire surface of the substrate 701 as necessary. It is to be noted that the release layer 702 is formed so as to contact the substrate 701; however, an insulating layer may be formed as a base film to contact the substrate 701 as necessary and the release layer 702 may be formed to contact the insulating layer.

The release layer 702 is formed in a single layer or a layered structure with a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si), an alloy material or a compound material containing the above described element as its main component by using a known means (sputtering, plasma CVD, or the like). The structure of the layer containing silicon may have any structure of amorphous, microcrystal, or polycrystalline structure.

In the case where the release layer 702 has a single layer structure, a tungsten layer, a molybdenum layer, or a layer containing a mixture of tungsten and molybdenum may be formed, for example. Alternatively, a layer containing oxide or oxynitride of tungsten, a layer containing oxide or oxynitride of molybdenum, or a layer containing oxide or oxynitride of a mixture of tungsten and molybdenum may be formed. It is to be noted that a mixture of tungsten and molybdenum is an alloy of tungsten and molybdenum. Further, oxide of tungsten can be referred to as tungsten oxide.

In the case where the release layer 702 has a layered structure, a tungsten layer, a molybdenum layer, or a layer containing a mixture of tungsten and molybdenum may be formed as a first layer. A layer containing oxide, nitride, oxynitride, or nitride oxide of tungsten, a layer containing oxide, nitride, oxynitride, or nitride oxide of molybdenum, or a layer containing oxide, nitride, oxynitride, or nitride oxide of a mixture of tungsten and molybdenum may be formed as a second layer.

When a stack of a layer containing tungsten and a layer containing oxide of tungsten is formed as the release layer 702, the layer containing tungsten is formed and a layer containing silicon oxide may be formed so that oxide of tungsten is formed at the interface between the tungsten layer and the silicon oxide layer. This also applies to the case where a layer containing nitride, oxynitride, and nitride oxide of tungsten. In this case, after a layer containing tungsten is formed, a silicon nitride layer, a silicon oxynitride layer, a silicon nitride oxide layer may be formed thereover. The tungsten oxide is denoted by WOx and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. In forming an oxide of tungsten, the above value of X is not limited in particular, and composition can be determined based on an etching rate or the like. The layer containing tungsten oxide (WOx, 0<X<3) which is formed by sputtering in an oxygen atmosphere is preferable to obtain the most preferable etching rate. Therefore, in order to reduce time of manufacture, the release layer may preferably be formed with a layer containing tungsten oxide which is formed by sputtering in an oxygen atmosphere.

Next, an insulating layer 703 to be a base is formed to cover the release layer 702. The insulating layer 703 to be the base is formed by a layer containing oxide of silicon or nitride of silicon in a single layer or a layered structure with a layer containing oxide of silicon or nitride of silicon by a known means (sputtering, plasma CVD, or the like). Oxide of silicon is a material containing silicon (Si) and oxygen (O), such as silicon oxide, silicon oxynitride, or silicon nitride oxide. Nitride of silicon is a material containing silicon and nitrogen (N), such as silicon nitride, silicon oxynitride, or silicon nitride oxide. In the case where the insulating layer to be the base has a two-layer structure, a silicon nitride oxide layer may be formed as a first layer, and a silicon oxynitride layer may be formed as a second layer, for example. In the case where the insulating layer to be a base has a three-layer structure, a silicon oxide layer, a silicon nitride oxide layer, and a silicon oxynitride layer may be formed as a first-layer insulating layer, a second-layer insulating layer, and a third-layer insulating layer respectively. Alternatively, a silicon oxynitride layer, a silicon nitride oxide layer, and a silicon oxynitride layer may be formed as a first-layer insulating layer, a second-layer insulating layer, and a third-layer insulating layer respectively. The insulating layer to be the base functions as a blocking film for preventing impurities entering from the substrate 701.

Figure 21B:
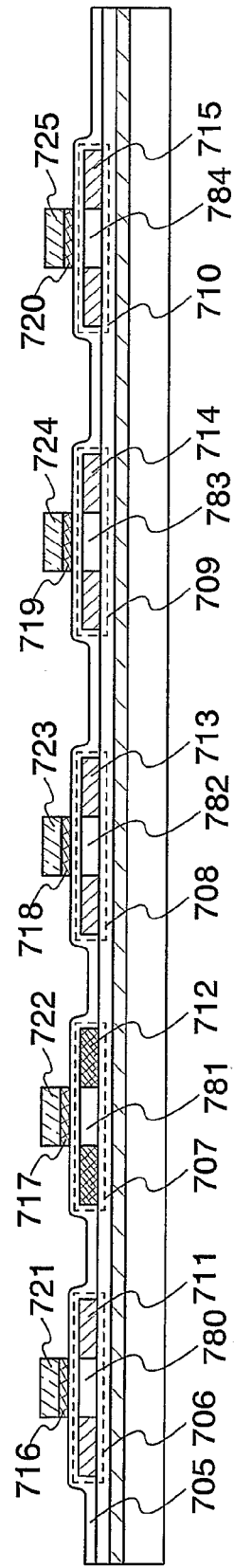

Subsequently, an amorphous semiconductor layer 704 (for example, a layer containing amorphous silicon) is formed over the insulating layer 703. The amorphous semiconductor layer 704 is formed to a thickness of 25 nm to 200 nm (preferably 30 nm to 150 nm) by a known means (sputtering, LPCVD, plasma CVD, or the like). The amorphous semiconductor layer 704 is crystallized by a known crystallization method (laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor layer. The obtained crystalline semiconductor layer is then etched into a desired shape, thereby crystalline semiconductor layers 706 to 710 are formed (FIG. 21B).

An example of formation steps of the crystalline semiconductor layers 706 to 710 will be described briefly as follows. First, an amorphous semiconductor layer is formed to a thickness of 66 nm by plasma CVD. Next, a solution containing nickel that is a metal element for promoting crystallization is applied onto the amorphous semiconductor layer, and dehydrogenation treatment (at 500° C., for 1 hour) and thermal crystallization treatment (at 550° C., for 4 hours) are performed on the amorphous semiconductor layer, thereby a crystalline semiconductor layer is formed. After that, the crystalline semiconductor layer is irradiated with laser light as needed, and photolithography and etching treatment are performed to form the crystalline semiconductor layers 706 to 710. In the case where the laser crystallization method is employed for forming the crystalline semiconductor layer, a continuous wave or pulsed gas laser or solid-state laser may be used. As the gas laser, an excimer laser, a YAG laser, a YVO$_4$ laser, a YLF laser, a YAlO$_3$ laser, a glass laser, a ruby laser, a Ti: sapphire laser, or the like may be used. As the solid-state laser, a laser using a crystal such as YAG, YVO$_4$, YLF, and YAlO$_3$ doped with Cr, Nd, Er, Ho, Ce, Co, Ti, or Tm may be used.

In addition, the crystallization of the amorphous semiconductor layer by using the metal element for promoting crystallization is advantageous because the crystallization can be performed at low temperature in short time and the direction of crystals becomes uniform. Meanwhile, there is also a problem that the characteristics are not stable because the off-state current is increased due to a residue of the metal element in the crystalline semiconductor layer. Therefore, it is preferable to form an amorphous semiconductor layer as a gettering site over the crystalline semiconductor layer. The amorphous semiconductor layer to be a gettering site is required to contain an impurity element such as phosphorous or argon; accordingly, it is preferably formed by sputtering by which argon can be contained at high concentration. Subsequently, heat treatment (RTA, thermal annealing using an annealing furnace, or the like) is performed to diffuse the metal element into the amorphous semiconductor layer, and the amorphous semiconductor layer containing the metal element is removed therefrom. In this manner, the content of the metal element in the crystalline semiconductor layer can be reduced or eliminated.

Then, a gate insulating film 705 is formed to cover the crystalline semiconductor layers 706 to 710. The gate insulating film 705 is formed with a single layer or a stack of a layer containing oxide of silicon or nitride of silicon by a known means (plasma CVD or sputtering). Specifically, a layer containing silicon oxide, a layer containing silicon oxynitride, or a layer containing silicon nitride oxide is formed in a single layer or layered structure.

Subsequently, a first conductive layer and a second conductive layer are stacked on the gate insulating film 705. The first conductive layer is formed to a thickness of 20 to 100 nm by a known means (plasma CVD or sputtering). The second conductive layer is formed to a thickness of 100 to 400 nm by a known means. The first conductive layer and the second conductive layer are formed by using an element selected from tantalum (Ta), tungsten (W), titanium (Ti), molybdenum (Mo), aluminum (Al), copper (Cu), chromium (Cr), niobium (Nb), or the like, an alloy material or a compound material containing the above-described element as its main component. Alternatively, a semiconductor material, typically poly-crystalline silicon doped with an impurity element such as phosphorus, may be used. As a combination of the first conductive layer and the second conductive layer, a tantalum nitride (TaN) layer and a tungsten (W) layer, a tungsten nitride (WN) layer and a tungsten layer, a molybdenum nitride (MoN) layer and a molybdenum (Mo) layer, or the like can be used for example. Since tungsten, tantalum nitride, or the like has high heat resistance, heat treatment for thermal activation can be performed after the first conductive layer and the second conductive layer are formed. Alternatively, in the case of employing a three-layer structure instead of a two-layer structure, a layered structure of a molybdenum layer, an aluminum layer, and a molybdenum layer may be employed.

Then, a resist mask is formed by photolithography and etching treatment for forming a gate electrode and a gate line is performed, thereby conductive layers 716 to 725 (also referred to as gate electrodes) functioning as gate electrodes are formed.

Next, another resist mask is formed by photolithography. Then, an impurity element imparting N-type conductivity is added into the crystalline semiconductor layers 706, and 708 to 710 at low concentration by ion doping or ion implantation to form N-type impurity regions 711, and 713 to 715 and channel forming regions 780, and 782 to 784. An element belonging to group 15 of Periodic Table may be used for the impurity element imparting N-type conductivity. For example, phosphorus (P) or arsenic (As) is used.

Next, another resist mask is formed by photolithography. Then, an impurity element imparting p-type conductivity is added into the crystalline semiconductor layer 707 to form a p-type impurity region 712 and a channel forming region 781. For example, boron (B) is used for the impurity element imparting p-type conductivity.

Figure 21C:
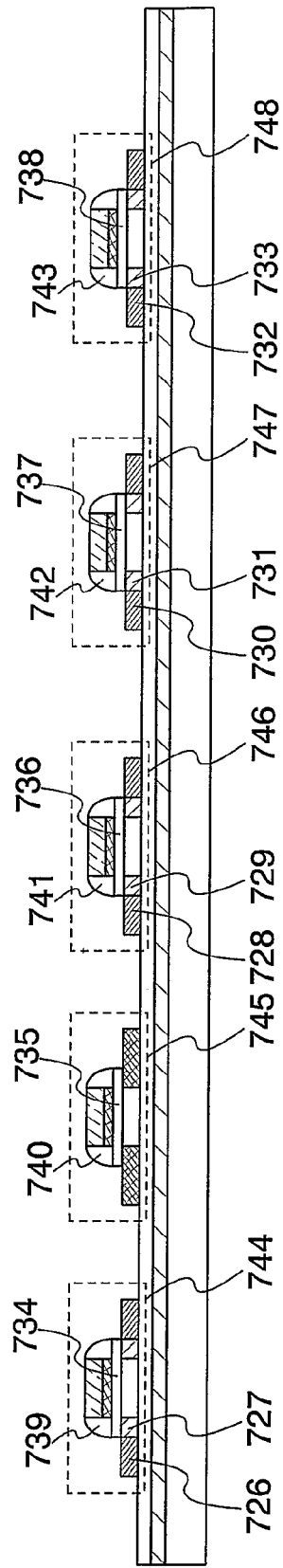

Next, an insulating layer is formed so as to cover the gate insulating film 705 and the conductive layers 716 to 725. The insulating layer is formed with a single layer or a stack of a layer containing an inorganic material such as silicon, oxide of silicon, or nitride of silicon, or a layer containing an organic material such as an organic resin by a known means (plasma CVD or sputtering). Then, the insulating layer is selectively etched by anisotropic etching mainly in the vertical direction, thereby insulating layers (also referred to as sidewalls) 739 to 743 in contact with the side faces of the conductive layers 716 to 725 are formed (see FIG. 21C). Concurrently with the formation of the insulating layers 739 to 743, insulating layers 734 to 738 are formed by etching the insulating layer 705. The insulating layers 739 to 743 are used as masks for doping in the formation of an LDD (Lightly Doped Drain) region subsequently.

Then, using the mask formed of a resist by photolithography and the insulating layers 739 to 743 as masks, an impurity element imparting N-type conductivity is added into the crystalline semiconductor layers 706, and 708 to 710 so that first N-type impurity regions (also referred to as LDD regions) 727, 729, 731, and 733 and second N-type impurity regions (also referred to as source and drain regions) 726, 728, 730, and 732 are formed. The concentration of the impurity element in the first N-type impurity regions 727, 729, 731, and 733 is lower than the concentration of the impurity element in the second N-type impurity regions 726, 728, 730, and 732. Through the above-described steps, N-type thin film transistors 744, and 746 to 748 and a p-type thin film transistor 745 are completed.

It is to be noted that there are the following two methods for forming the LDD region, for example. One is a method in which a gate electrode is formed in a layered structure having two or more layers, and taper etching or anisotropic etching is performed on the gate electrode so that a conductive layer of the lower layer included in the gate electrode is used as a mask. The other is a method in which a sidewall insulating layer is used as a mask. A thin film transistor that is formed by the former method has a structure in which an LDD region is overlapped with a gate electrode with a gate insulating layer interposed therebetween. In this structure, since the gate electrode is etched into a tapered shape or anisotropically etching is used, it is difficult to control the width of the LDD region, and the LDD region may not be formed if the etching step is not performed appropriately. On the other hand, the latter method which uses a sidewall insulating layer as a mask is, as compared with the former method, easy to control the width of the LDD region, and the LDD region can be formed without fail.

Then, an insulating layer is formed in a single layer, or layered structure so as to cover the thin film transistors 744 to 748 (FIG. 22A). The insulating layer covering the thin film transistors 744 to 748 is formed with a single layer or a stack using an inorganic material such as oxide of silicon or nitride of silicon, an organic material such as polyimide, polyamide, benzocyclobutene, acrylic, epoxy resin, and siloxane, or the like by a known means (an SOG method, a droplet discharge method, or the like). A siloxane material contains an Si—O—Si bond. Siloxane includes a skeleton formed by a bond of silicon (Si) and oxygen (O), in which an organic group containing at least hydrogen (such as an alkyl group or aromatic hydrocarbon) is contained as a substituent. Alternatively, a fluoro group may be used as the substituent. Further alternatively, a fluoro group and an organic group containing at least hydrogen may be used as the substituent. For example, in the case where the insulating layer covering the thin film transistors 744 to 748 has a three-layer structure, a layer containing silicon oxide may be formed as a first-layer insulating layer 749, preferably, a layer containing a resin may be formed as a second-layer insulating layer 750, and a layer containing silicon nitride may be formed as a third-layer insulating layer 751.

It is to be noted that before the insulating layers 749 to 751 are formed or after one or more of thin layers of the insulating layers 749 to 751 are formed, heat treatment for recovering the crystallinity of the semiconductor layer, for activating the impurity element which has been added into the semiconductor layer, or for hydrogenating the semiconductor layer is preferably performed. For the heat treatment, thermal annealing, laser annealing, RTA, or the like is preferably used.

Then, the insulating layers 749 to 751 are etched by using photolithography to form contact holes so that the N-type impurity regions 726, and 728 to 732 and the p-type impurity region 712 are exposed. Subsequently, a conductive layer is formed so as to fill the contact holes and patterned to form conductive layers 752 to 761 each functioning as a source or drain wiring.

The conductive layers 752 to 761 are formed with a single layer or a stack using an element selected from titanium (Ti), aluminum (Al), or neodymium (Nd); an alloy material or a compound material containing the above-described element as its main component by a known means (plasma CVD or sputtering). An alloy material containing aluminum as its main component is an alloy material containing nickel whose main component is aluminum or an alloy material containing nickel and one or both of carbon and silicon whose main component is aluminum, for example. Each of the conductive layers 752 to 761 preferably uses, for example, a layered structure of a barrier layer, an aluminum-silicon (Al—Si) layer, and a barrier layer, or a layered structure of a barrier layer, an aluminum-silicon (Al—Si) layer, a titanium nitride (TiN) layer, and a barrier layer. It is to be noted that a barrier layer corresponds to a thin layer formed using titanium, nitride of titanium, molybdenum, or nitride of molybdenum. Aluminum and aluminum silicon which have low resistance and are inexpensive, so that they are suitable for forming the conductive layers 752 to 761. In addition, generation of a hillock of aluminum or aluminum silicon can be prevented when upper and lower barrier layers are provided. Further, when the barrier layer is formed by using titanium that is a highly-reducible element, even if a thin natural oxide layer is formed on the crystalline semiconductor layer, the natural oxide film is reduced so that preferable contact with the crystalline semiconductor layer can be obtained.

Next, an insulating layer 762 is formed so as to cover the conductive layers 752 to 761 (FIG. 22B). The insulating layer 762 is formed with a single layer or a stack using an inorganic material or an organic material by a known means (an SOG method, a droplet discharge method, or the like). The insulating layer 762 is preferably formed to a thickness of 0.75 μm to 3 μm.

Subsequently, the insulating layer 762 is etched by using photolithography to form contact holes in which the conductive layers 757, 759, and 761 are exposed. Then, a conductive layer is formed so as to fill the contact holes. The conductive layer is formed by a known means (plasma CVD or sputtering) using a conductive material. The conductive layer is patterned to form conductive layers 763 to 765. It is to be noted that each of the conductive layers 763 and 764 correspond to one of a pair of conductive layers included in a memory element. Therefore, the conductive layers 763 to 765 are preferably formed with a single layer or a stack using titanium, an alloy material or a compound material containing titanium as its main component. Titanium which has low resistance, which enables size reduction of the memory element, thereby high integration can be realized. In addition, in the etching step for forming the conductive layers 763 to 765, it is preferable to perform wet etching in order to prevent damage to the thin film transistors 744 to 748 that are lower layers; hydrogen fluoride (HF) or mixed solution of ammonia and oxygenated water (NH$_3$ and H$_2$O$_2$) is preferably used as the etchant.

Then, an insulating layer 766 is formed so as to cover the conductive layers 763 to 765. The insulating layer 766 is formed with a single layer or a stack using an inorganic material or an organic material by a known means (an SOG method, a droplet discharge method, or the like). In addition, the insulating layer 766 is preferably formed to a thickness of 0.75 μm to 3 μm. The insulating layer 766 is then etched by using photolithography to form contact holes 767 to 769 in which the conductive layers 763 to 765 are respectively exposed.

Subsequently, a conductive layer 786 functioning as an antenna which is in contact with the conductive layer 765 is formed (FIG. 23A). The conductive layer 786 is formed by a known means (plasma CVD, sputtering, printing, or a droplet discharge method) using a conductive material. Preferably, the conductive layer 786 is formed with a single layer or a stack using an element selected from aluminum (Al), titanium (Ti), silver (Ag), or copper (Cu), an alloy material or a compound material containing the above-described element as its main component. Specifically, the conductive layer 786 is formed by screen printing using a paste containing silver and heat treatment thereafter at 50° C. to 350° C. Alternatively, an aluminum layer is formed by sputtering, and is patterned to form the conductive layer 786. The patterning of the aluminum layer is preferably performed by wet etching, and heat treatment at 200° C. to 300° C. is preferably conducted after the wet etching.

Next, an organic compound layer 787 is formed in contact with the conductive layers 763 and 764 (FIG. 23B). The organic compound layer 787 is formed by a droplet discharge method, spin coating, screen printing, or the like. Subsequently, a conductive layer 771 is formed in contact with the organic compound layer 787. The conductive layer 771 is formed by a known means (sputtering or vapor deposition).

Through the above-described steps, a memory element 789 which includes the conductive layer 763, the organic compound layer 787, and the conductive layer 771, and a memory element 790 which includes the conductive layer 764, the organic compound layer 787, and the conductive layer 771 are completed.

It is to be noted that according to the manufacturing steps described above, the step for forming the organic compound layer 787 is carried out after the step for forming the conductive layer 786 functioning as an antenna because the heat resistance of the organic compound layer 787 is not high.

Subsequently, an insulating layer 772 functioning as a protective film is formed by a known means (an SOG method, a droplet discharge method, or the like) so as to cover the memory elements 789 and 790 and the conductive layer 786 functioning as an antenna. The insulating layer 772 is formed with a layer containing carbon such as DLC (Diamond Like Carbon), a layer containing silicon nitride, a layer containing silicon nitride oxide, an organic material, or preferably formed of an epoxy resin.

The insulating layer is then etched by using photolithography or laser light irradiation to form openings 773 and 774 so that the release layer 702 is exposed (FIG. 24A).

Subsequently, the release layer 702 is removed by injecting an etchant into the openings 773 and 774 (FIG. 24B). As the etchant, a gas or a liquid containing halogen fluoride or an interhalogen compound is used; for example, chlorine trifluoride ($ClF_3$) is used as a gas containing halogen fluoride. Accordingly, a thin film integrated circuit 791 is separated from the substrate 701. It is to be noted herein that the thin film integrated circuit 791 includes an element group including the thin film transistors 744 to 748 and the memory elements 789 and 790, and the conductive layer 786 functioning as an antenna. The release layer 702 may be partially left without being removed entirely. By leaving a part of the release layer 702, time of manufacture can be shortened.

It is preferable to reuse the substrate 701 after the thin film integrated circuit 791 is separated, thereby reducing the cost. In addition, the insulating layer 772 is formed to prevent the thin film integrated circuit 791 from scattering after the release layer 702 is removed. The thin film integrated circuit 791 which is small, thin, and light easily scatters after the release layer 702 is removed since it is not attached firmly to the substrate 701. However, by forming the insulating layer 772 on the thin film integrated circuit 791, the thin film integrated circuit 791 is weighed and scattering from the substrate 701 can be prevented. In addition, by forming the insulating layer 772, the thin film integrated circuit 791 which is thin and light alone is not rolled after the substrate 701 is separated, and strength can be ensured.

Figure 25:
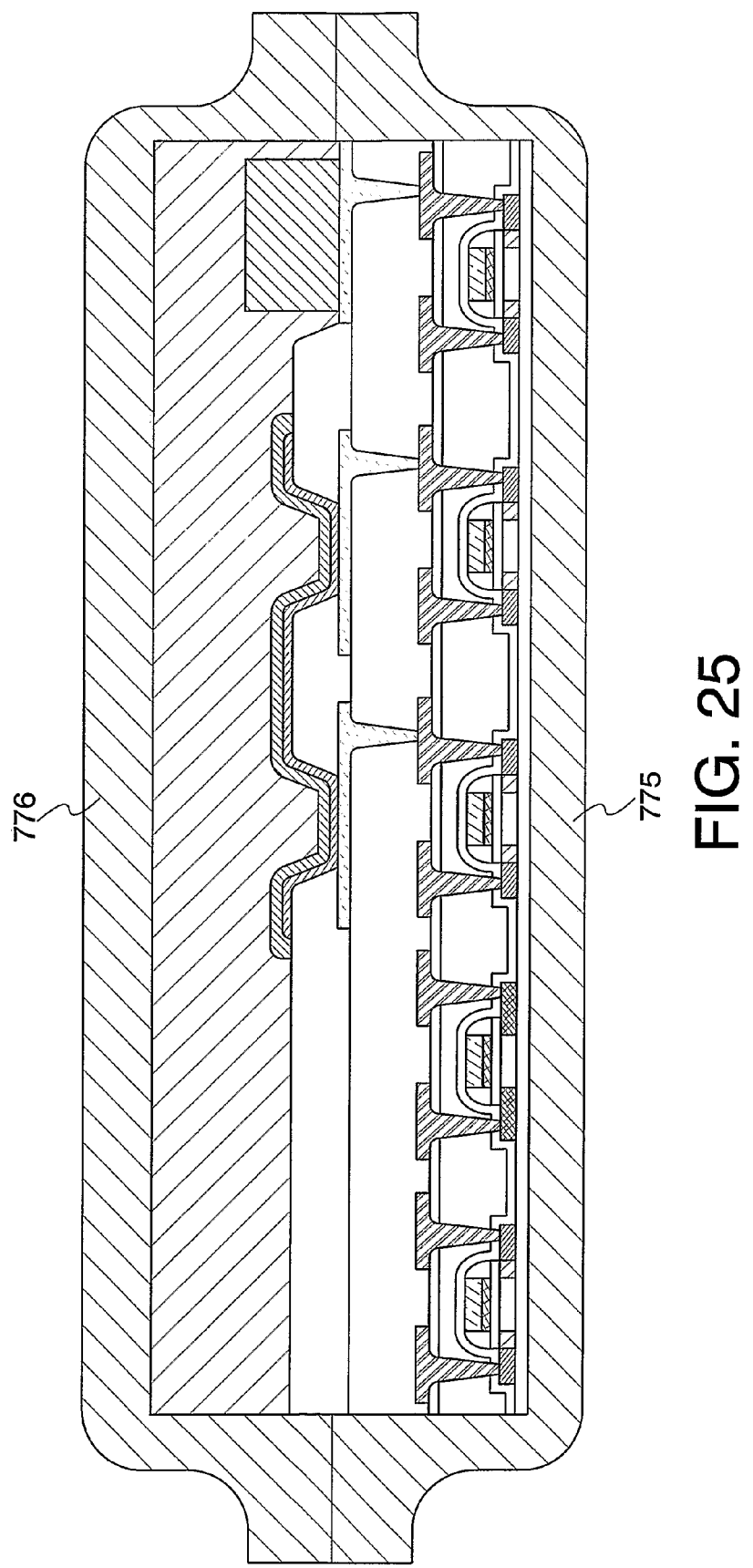
FIG. 25 shows an example of a method for manufacturing the semiconductor device of the present invention.

Subsequently, one surface of the thin film integrated circuit 791 is attached to a first support 776, and the thin film integrated circuit 791 is completely peeled off from the substrate 701 (FIG. 25). Then, a second support 775 is provided on the other surface of the thin film integrated circuit 791, and one or both of heat treatment and pressure treatment are performed to seal the thin film integrated circuit 791 with the first support 776 and the second support 775. Each of the first support 776 and the second support 775 is a film formed of polypropylene, polyester, vinyl, polyvinyl fluoride, polyvinyl chloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like. The films are subjected to heat treatment and pressure treatment by thermocompression bonding. An adhesive layer which is provided on the outermost surface of the adhesive layer or a layer (not an adhesive layer) which is provided on the outermost layer thereof is melted by heart treatment, and then is pressured, so that the films are attached. An adhesive layer may be provided on a surface of the first support 776 or the second support 775, or it may not be provided. The adhesive layer is a layer containing an adhesive such as a heat curable resin, an ultraviolet-curable resin, an epoxy resin-based adhesive, or a resin additive.

Through the above steps, a semiconductor device having a memory element and an antenna can be manufactured. Further, through the above steps, a flexible semiconductor device can be obtained.

This embodiment mode can be freely combined with any of the above embodiment modes.

Embodiment Mode 5

In this embodiment mode, a method for manufacturing a semiconductor device, which is different from the above embodiment modes will be described.

Figure 11A:
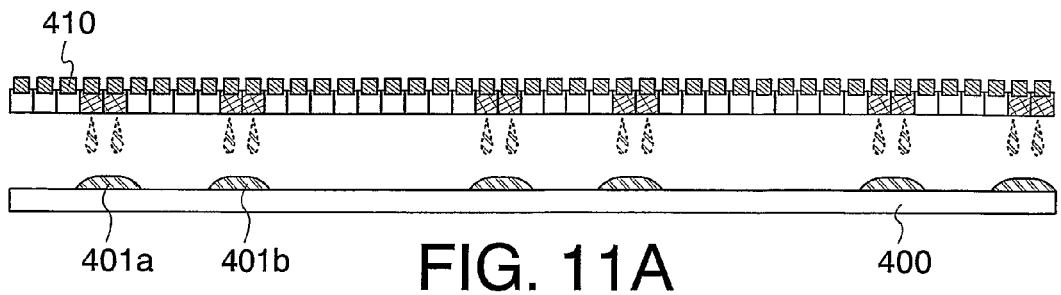
FIGS. 11A to 11E show an example of a method for manufacturing a semiconductor device of the present invention.
Figure 11B:
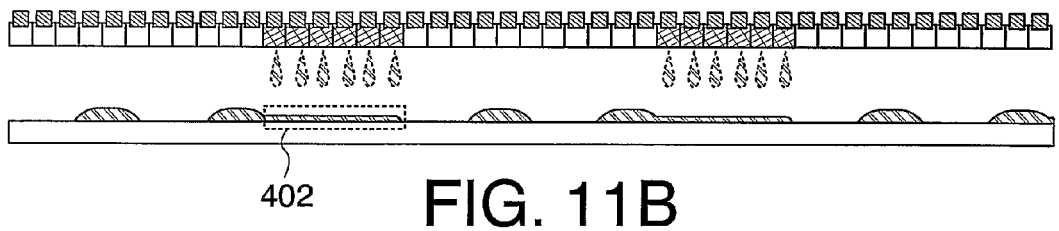
Figure 11C:
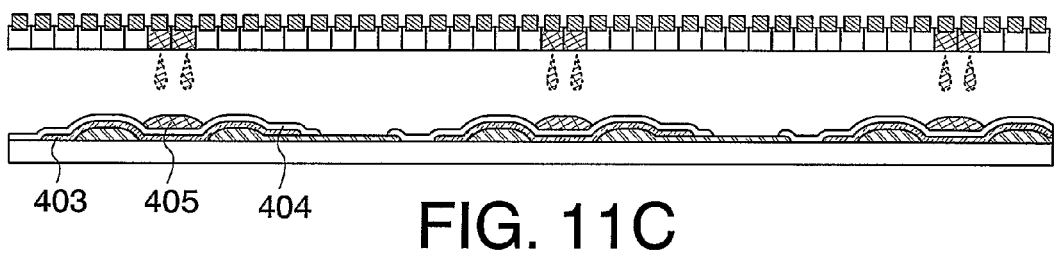
Figure 11D:
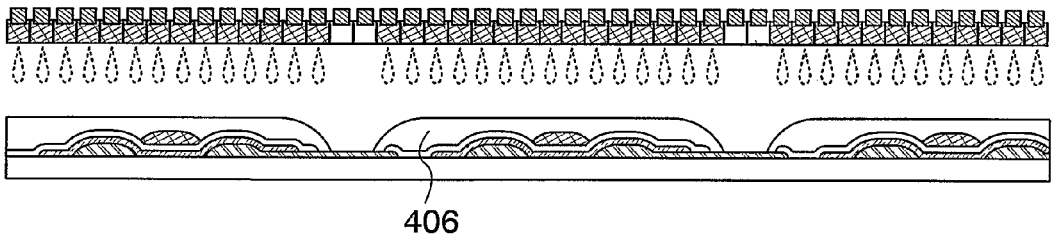
Figure 11E:
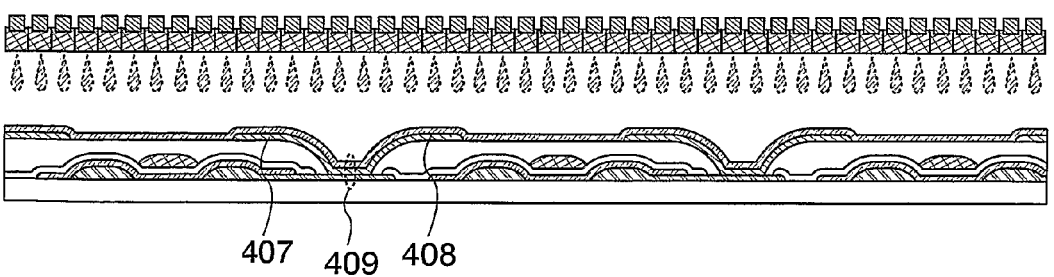

First, conductive layers 401a and 401b serving as a wiring and an electrode are formed by selectively discharging a conductive composition from a nozzle 410 onto a substrate 400 (FIG. 11A). A base insulating layer may be provided as a protective film over the substrate 400 beforehand. Alternatively, the base insulating layer may be irradiated with a short pulse laser such as a picosecond laser or a femtosecond laser to form a depression on the surface. This makes it possible to accurately control the position to dispose the conductive layers 401a and 401b in discharging the composition.

Next, a conductive layer 402 is formed by selectively discharging a conductive composition from a nozzle 410 (FIG. 1B). Note that the conductive layer 402 may be formed concurrently with the conductive layer 401b. In particular, if the same materials are used for the conductive layer 401b and the conductive layer 402, they are preferably formed at the same time.

Next, a semiconductor layer 403 is formed by selectively discharging a composition so as to cover the conductive layers 401a and 401b, and an insulating layer 404 is formed so as to cover the semiconductor layer 403. Subsequently, a conductive layer serving as a gate electrode (hereinafter referred to as a gate electrode 405) is formed between the conductive layers 401a and 401b (FIG. 1C). Since the depression is formed between the conductive layers 401a and 401b, the position to provide the gate electrode 405 by discharging a composition can be controlled.

Next, an insulating composition is selectively discharged to form an insulating layer 406 so as to cover the conductive layers 401a and 401b, the semiconductor layer 403, the insulating layer 404, and the gate electrode 405 (FIG. 1D).

Next, an organic compound layer 407 is formed so as to be in contact with the conductive layer 402 by selectively discharging a composition, and a conductive layer 408 is formed over the organic compound layer 407. The organic compound layer 407 may be provided over the entire surface or may be selectively provided so as to cover the conductive layer 402. Thus, a memory element 409 is formed with a stack of the conductive layer 402, the organic compound layer 407 and the conductive layer 408.

Through the above steps, an active matrix organic memory element can be formed. In FIG. 11A to 11D, the case of employing a droplet discharge method for the all steps is shown; however, this embodiment mode is not limited thereto, and vapor deposition, CVD, sputtering, spin coating, screen printing, or gravure printing can be used in each step. Further, different method may be used in each step, in other words, the methods above may be combined. For example, the conductive layers 401a and 401b may be formed by a droplet discharge method, the semiconductor layer 403 may be formed by vapor deposition, and the organic compound layer 407 can be formed by spin coating. Materials or the like used in each step will be described below.

As the substrate 400, for example, a glass substrate such as a barium borosilicate glass substrate or aluminoborosilicate glass substrate, a quartz substrate, a ceramic substrate, or the like can be used. Further, a metal substrate containing stainless-steel or a semiconductor substrate in each of which an insulating layer is formed on the surface may be used. Although a substrate made of a flexible synthetic resin, such as PET generally has lower heat-resistance than the above-described substrate, it can be used as long as it can withstand process temperature in the manufacturing steps. The surface of the substrate 400 may be planarized in advance by polishing such as a CMP method.

Materials of the conductive layers 401a and 401b are not particularly limited as long as each of which is a conductive material, and a conductive material containing an element selected from Ag, Au, Pd, Cr, Mo, Ti, Ta, W, or Al, or one of more metal compounds thereof can be used. Alternatively, a known conductive polymer of which conductivity is improved by doping or the like, such as conductive polyaniline, conductive polypyrrole, or conductive polythiophen, a complex of polyethylene dioxythiophene (PEDOT) and polystyrenesulphonic (PSS), or the like can be used.

The conductive layer 402 may be formed of the same material as the conductive layers 401a and 401b. Alternatively, a light-transmitting conductive material may be used instead. Particularly in writing data by optical action, it is preferable to use a light-transmitting conductive material. As the light-transmitting conductive material, indium tin oxide (ITO), zinc oxide (ZnO), indium zinc oxide (IZO), zinc oxide added with gallium (GZO), or the like can be used. Indium tin oxide containing silicon oxide (hereinafter referred to as ITSO) or a material in which 2 to 20% of zinc oxide (ZnO) is mixed into ITSO may be used instead.

A semiconductor element (silicon, germanium, or the like) alone or an alloy thereof, or an organic semiconductor material, or the like can be used for the semiconductor layer 403. An organic semiconductor material is an organic compound having a semiconducting property. A high molecular weight compound having a skeleton including a π-conjugated double bond is desirable. Specifically, a soluble high molecular weight material such as polyphenylene vinylene, polythiophen, or a poly (3-alkylthiophen) derivative can be used. A material such as pentacene or naphthacene may be used instead. In this specification, a transistor using an organic material such as an organic semiconductor material for a semiconductor layer is referred to as an organic transistor. In this embodiment mode, the organic semiconductor material can be formed by a droplet discharge method, screen printing, gravure printing, spin coating, vapor deposition, or the like.

An inorganic insulating layer of silicon oxide, silicone nitride, nitride oxide, an insulating layer of polyvinylphenol, polyimide, siloxane, or the like can be used. Polyvinylphenol, polyimide, siloxane, or the like can be efficiently formed by a droplet discharge method, a printing method, or spin coating. Siloxane may be, for example, classified by the structure into silica glass, an alkylsiloxanee polymer, a hydrogen silsesquioxane (HSQ) polymer, a hydrogen alkylsilsesquioxane, and the like. The insulating layer may be formed using a material containing a polymer containing an Si—N bond (polysilazane). Further, a stack using the above materials may be formed.

The organic compound layer 407 can be formed using an organic compound material shown in the above embodiment mode.

The conductive layer 408 can be formed using any one of the materials of the conductive layers 401a, 401b, and 402.

Further, in the above structure, a rectifying element may be provided between the conductive layer 402 and the organic compound layer 407 or between the organic compound layer 407 and the conductive layer 408. A transistor in which the gate electrode and the drain electrode are connected, or a diode can be provided as the rectifying element. For example, a PN junction diode including a stack of an n-type semiconductor layer and a p-type semiconductor layer can be used. In this manner, by providing a rectifying diode, current flows only in one direction; thus, errors are reduced and a reading accuracy is improved. In the case of providing a diode, a diode having another structure such as a PIN junction diode or an avalanche diode may be used instead of a PN junction diode.

Further, a top gate (staggered) structure in which a gate electrode is located in an upper position than the source and drain electrodes is shown. Naturally, a bottom gate (inverted staggered) structure in which a gate electrode is located in a lower position than the source and drain electrodes can be used instead. The case of using a bottom structure is shown in FIG. 3A.

Figure 13A:
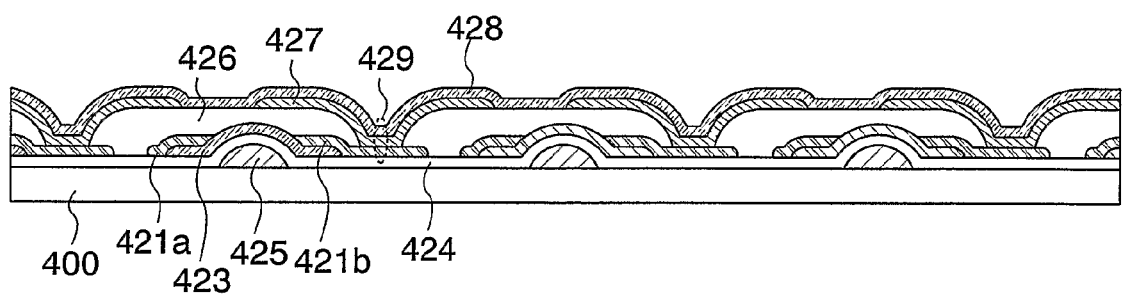
FIGS. 13A and 13B each shows an example of a structure of a semiconductor device of the present invention.

In FIG. 13A, a gate electrode 425, an insulating layer 424, a semiconductor layer 423, conductive layers 421a and 421b serving as a source electrode or a drain electrode, insulating layer 426, an organic compound layer 427, and a conductive layer 428 are sequentially stacked over the substrate 400. Further, the same materials and the formation method in FIGS. 11A to 11E can be used. Also in this case, a rectifying element may be provided between the conductive layer 421b and the organic compound layer 427 or between the organic compound layer 427 and the conductive layer 428.

Next, a structure different from the above structure will be described with reference to FIGS. 12A to 12E. Specifically, the case of providing a memory element below a transistor will be shown.

Figure 12A:
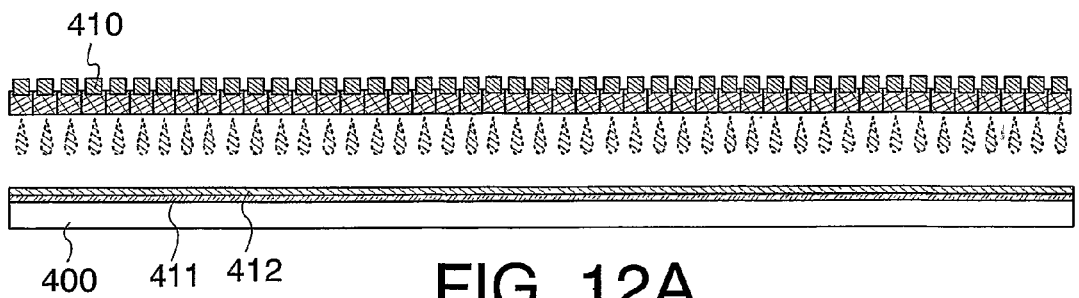
FIGS. 12A to 12E show an example of a method for manufacturing a semiconductor device of the present invention.

First, a conductive layer 411 and an organic compound layer 412 are provided in a stack over the substrate 400 (FIG. 12A). The conductive layer 411 and the organic compound layer 412 can be formed using any one of the above methods.

Figure 12B:
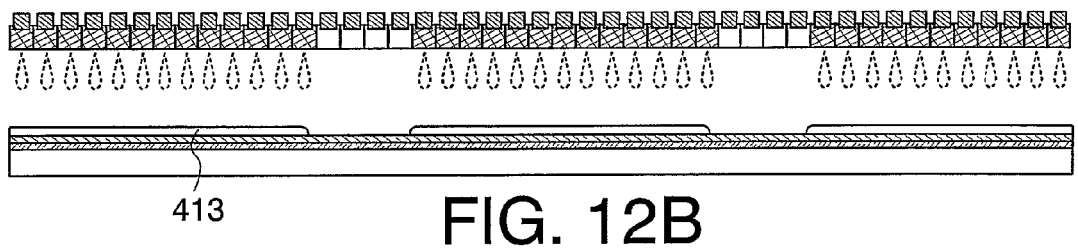

Next, an insulating layer 413 is formed by selectively discharging an insulating composition (FIG. 12B). Note that the insulating layer 413 is provided so as not to be formed in a region to be a memory element.

Figure 12C:
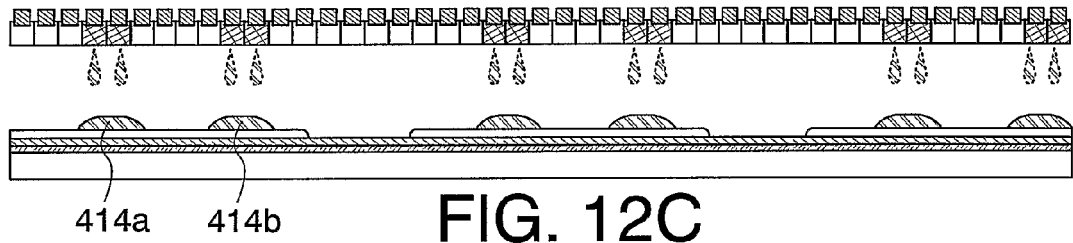

Subsequently, a conductive composition is selectively discharged onto the insulating 413 so as to selectively form conductive layers 414a and 414b each serving as a wiring or an electrode (FIG. 12C). In this case, the area in the insulating layer 413 where the conductive layers 414a and 414b are provided may be irradiated with laser light to form a depression beforehand.

Figure 12D:
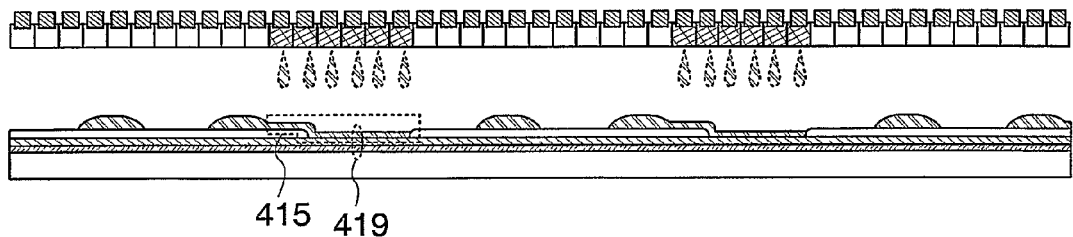

Next, a conductive layer 415 is formed so as to connect to the conductive layer 414*b* (FIG. 12D). The conductive layer 415 is provided over the organic compound layer 412. Accordingly, a memory element 419 having a layered structure of the conductive layer 411, the organic compound layer 412, and the conductive layer 415 can be obtained.

Figure 12E:
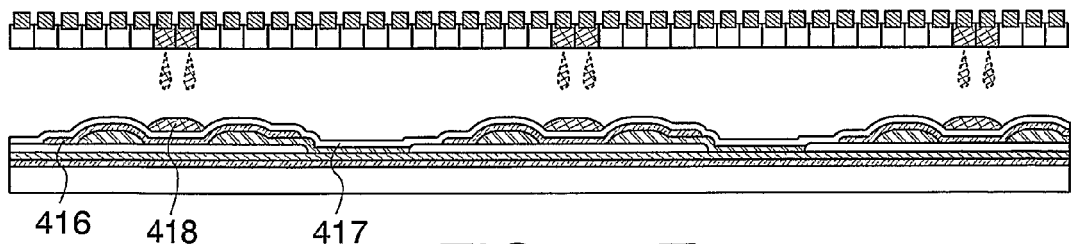

Next, a semiconductor layer 416 is formed so as to cover the conductive layers 414*a* and 414*b*. An insulating layer 417 is thereafter formed to cover the semiconductor layer 416, and a gate electrode 418 is formed between the conductive layer 414*a* and the conductive layer 414*b* (FIG. 12E). The conductive layer 414*a* and the conductive layer 414*b* are provided with a depression; therefore, the position to provide the gate electrode 418 can be easily controlled.

Through the above steps, an organic memory in which the memory element 419 is provided below the transistor is completed. In FIG. 12A to 12E, the case of using a droplet discharge method through each step is described; however, without limitation thereto, vapor deposition, CVD, sputtering, spin coating, a printing method such as screen printing or gravure printing, or the like may be used alternatively. Further, a combination of the above methods may be used in each step. In particular, the material which is to be formed over the entire surface of the substrate, such as the conductive layer 411 or the organic compound layer 412 can be formed by spin coating.

In FIGS. 12A to 12E, the conductive layers 411, 413*a*, 413*b*, and 419, insulating layers 413, 417, and the semiconductor layer 416 can use any of the materials described using FIGS. 11A to 11E. The organic compound layer 412 can be formed using any of the materials described in the above embodiment modes.

Figure 13B:
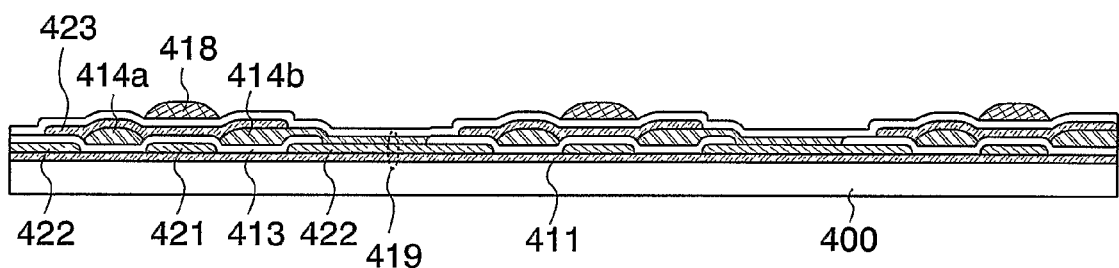

Next, an organic memory having a structure partly different from the one shown in FIG. 12E will be shown in FIG. 13B.

As for a highly integrated memory element, the influence of electric field in lateral directions between adjacent memory cells may be concerned. Accordingly, the organic compound layer provided in each memory element 419 can be separated as shown in FIG. 13B. Here, an organic compound layer is selectively formed after the conductive layer 411 is formed over the substrate 400. In FIG. 13B, the organic compound layer 422 partly constituting each memory element 419 is formed.

In FIG. 13B, an organic compound layer 421 is provided. The organic compound layer 421 is provided so that the position to form the conductive layers 414*a* and 414*b* over the insulating layer 413 can be controlled more easily by using a droplet discharge method or the like. Accordingly, by providing the organic compound layer 421, depressions can be formed at positions where the conductive layers 414*a* and 414*b* are provided. Note that if another method such as vapor deposition or sputtering is used or flatness is considered, the organic compound layer 421 may not be provided. In this case, as described above, the positions in the insulating 413, which are to be provided with the conductive layers 414*a* and 414*b* are preferably irradiated with laser light to form depressions in advance. Further, using a conductive material for the organic compound layer 421, a dual-gate structure in which the semiconductor layer 423 is sandwitched between above and below conductive layers.

In structures shown in FIGS. 12A to 12E and FIG. 13B, as described above, a rectifying element may be provided between the conductive layer partly constituting the memory element and the organic compound layer.

Thus, by providing a memory element and a transistor using an organic compound, an organic memory and a semiconductor device equipped with the organic memory can be manufactured through a simple process at low cost. Further, by providing a transistor using an organic compound, an organic memory and a semiconductor device equipped with the organic memory can be manufactured directly on a flexible substrate.

This embodiment mode can be freely combined with any of the embodiment modes above.

Embodiment Mode 6

In this embodiment mode, the case of applying a semiconductor device described in the above embodiment mode to a display device having a pixel area will be described with reference to drawings.

Figure 26A:
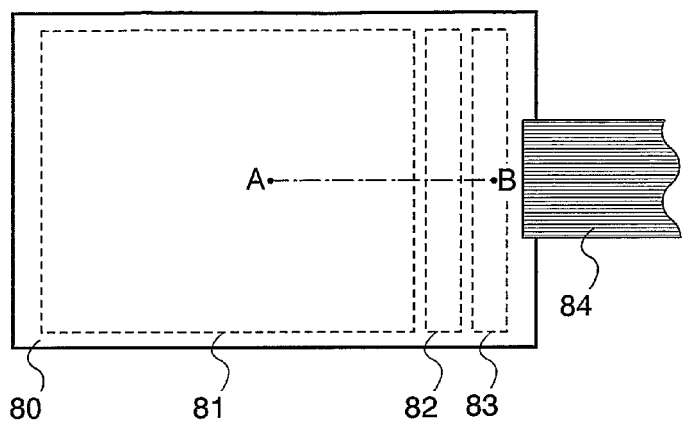
FIGS. 26A to 26C each shows an example of a structure of a display device provided with a semiconductor device of the present invention.
Figure 26B:
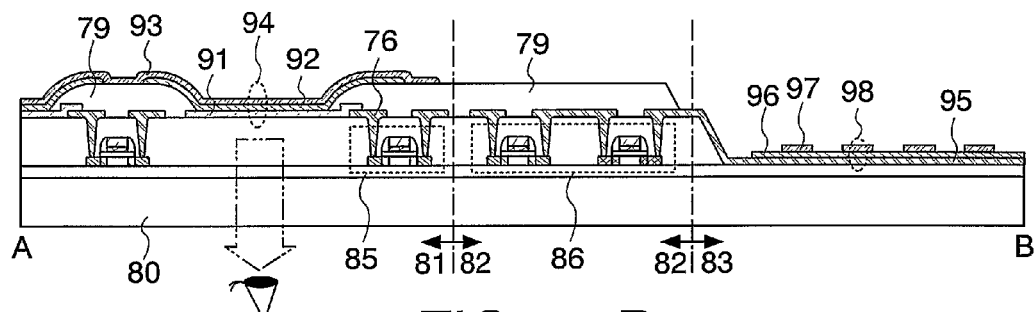

FIGS. 26A and 26B show the case where the pixel area is an active matrix type and the memory elements are passive matrix. Incidentally, FIG. 26B corresponds to the cross-sectional view taken along line A-B in FIG. 26A.

In the pixel area 81, the light emitting element 94 is provided, and the light emitting element 94 includes a first conductive layer 91, an organic compound layer 92, and a second conductive layer 93. The first conductive layer 91, the organic compound layer 92, and the second conductive layer 93 are stacked. The first conductive layer 91 included in the light emitting element 94 is connected to a conductive layer 76 that functions as a source or drain electrode of the driving transistor 85. An insulating layer 79 functioning as a partition wall is provided between adjacent light emitting elements 94.

An element formation layer including a plurality of transistors is provided in a driver circuit area 82. The element formation layer partly constitutes a driver circuit for controlling the operation of the pixel area 81 and the memory cell 83. The driver circuit for controlling the operation of the pixel area 81 is, for example, a shift register, a decoder, a buffer, a sampling circuit, a latch, or the like. Meanwhile, the driver circuit for controlling the operation of the memory cell 83 is, for example, a decoder, a sense amplifier, a selector, a buffer, a read circuit, a write circuit, or the like.

In the memory cell 83, the memory element 98 is provided. Each memory element 98 includes a first conductive layer 95 serving as a word line Wy, an organic compound layer 96, and a second conductive layer 97 serving as a bit line Bx. The first conductive layer 95, the organic compound layer 96, and the second conductive layer 97 are stacked. In the structure of FIG. 26B, the memory element 98 may be provided over the insulating layer 79; thus, the memory cell 83 can be provided above the driver circuit area 82. With this structure, the area of them pixel area 81 can be increased.

Further, a connection film 84 is provided over the substrate 80. The connection film specifically corresponds to a flexible printed circuit or the like. A signal and the supply potentinal for controlling a plurality of elements constituting the pixel area 81 and the memory cell 83 are input from the external through the connection film 84.

Data in the memory element 98 included in the memory cell 83 is read by applying electrical action. Specifically, voltage is applied between the first conductive layer 95 and the second conductive layer 97 of the memory element 98, and data is read by reading a resistance value of the memory element 98. When data is read in such a manner, the memory element 98 would emit light depending on the material used for the organic compound layer 96. Therefore, in the case where the organic compound layer 92 included in the memory element 98 and the organic compound layer 96 included in the memory element 98 are formed using the same material, an enclosure of black matrix or the like may be preferably disposed to prevent light emitted from the memory element from being seen. Alternatively, only the light emitting element 94 may be made to emit light by using different materials for the organic compound layer 92 included in the memory element 99 and the organic compound layer 96 included in the memory element 98.

Figure 26C:
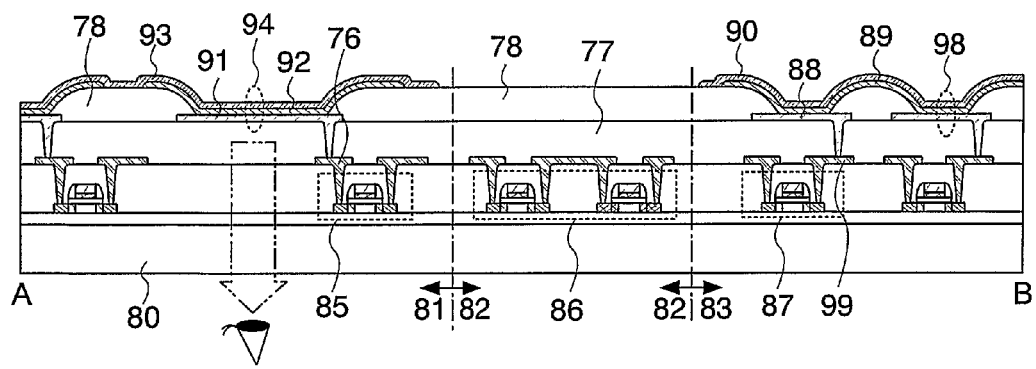

The case of providing a pixel area and a memory element portion which are both an active matrix type is shown in FIG. 26C.

In the pixel area 81, the light emitting element 94 is provided, and the light emitting element 94 includes a first conductive layer 91, an organic compound layer 92, and a second conductive layer 93. The first conductive layer 91, the organic compound layer 92, and the second conductive layer 93 are stacked. The first conductive layer 91 included in the light emitting element 94 is connected to a conductive layer 76 that functions as a source or drain wiring of the driving transistor 85 through an insulating layer 77. An insulating layer 78 functioning as a partition wall is provided between adjacent light emitting elements 94.

An element formation layer including a plurality of transistors is provided in a driver circuit area 82. The element formation layer partly constitutes a driver circuit for controlling the operation of the pixel area 81 and the memory cell 83. The driver circuit for controlling the operation of the pixel area 81 is, for example, a shift register, a decoder, a buffer, a sampling circuit, a latch, or the like. Meanwhile, the driver circuit for controlling the operation of the memory cell 83 is, for example, a decoder, a sense amplifier, a selector, a buffer, a read circuit, a write circuit, or the like.

In the pixel area 81, a memory is provided, and the memory element 98 includes a first-conductive layer 88, an organic compound layer 89, and a second conductive layer 90. The first conductive layer 88, the organic compound layer 89, and the second conductive layer 90 are stacked. The first conductive layer 88 included in the memory element 98 is connected to a conductive layer 99 that functions as a source or drain wiring of the switching transistor 87 through the insulating layer 77. An insulating layer 78 functioning as a partition wall is provided between adjacent memory elements 98. Further, in the structure shown in FIG. 26C, the first conductive layer 91 may be provided on the same layer as the conductive layer 76 serving as a source or drain electrode without providing the insulating layer 77, or the first conductive layer 88 may be provided on the same layer as the conductive layer 99 serving as a source or drain electrode of the switching transistor 87.

Further, the structure of a bottom emission type in which light emitted from the light emitting element 94 is directed toward the substrate 80 is shown, however, may be a top emission type in which the light is directed opposite to the substrate 80, or may be a dual emission type combining top emission and bottom emission.

In the above structure, compound layers 96, 92, and 89 can be formed by a droplet discharge method, spin coating, screen printing, gravure printing, vapor deposition, or the like. In FIG. 26B and 26C, examples of selectively forming the compound layers 96, 92, and 89 by a droplet discharge method, a printing method such as screen printing or gravure printing or the like are shown. In this case, organic compound layers can be each formed selectively in each memory pixel or each cell; thus, the efficiency in the use of materials can be improved. Further, different materials may be used to provide the organic compound layers 96, 92, and 89.

Figure 27A:
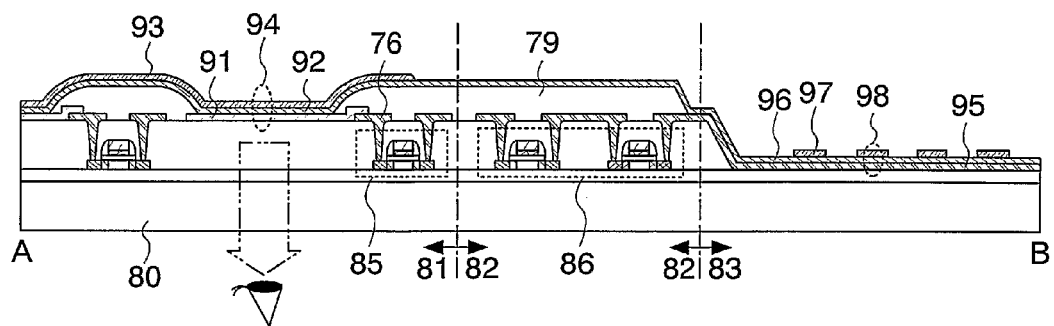
FIGS. 27A and 27B each shows an example of a structure of a display device provided with a semiconductor device of the present invention.
Figure 27B:
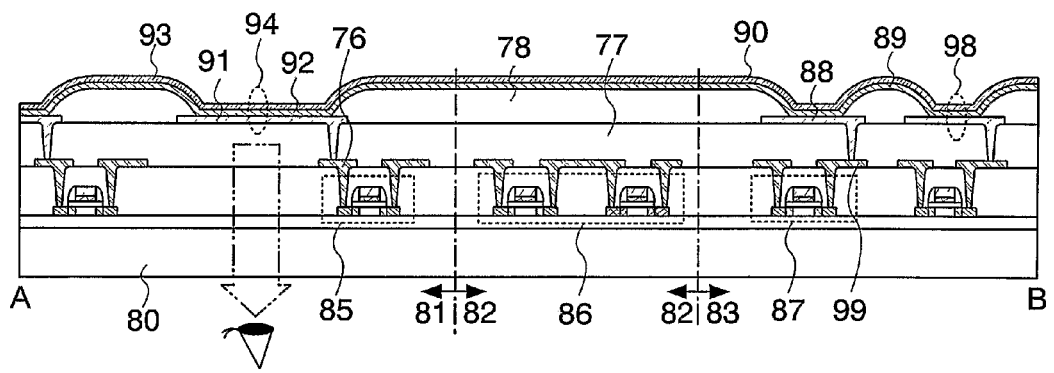

On the other hand, the case of forming the organic compound layers 96, 92, and 89 by spin coating, vapor deposition, or the like is shown in FIGS. 27A and 27B. In FIGS. 27A and 27B, the organic compound layers 96, 92, and 89 are formed using the same material. The operation efficiency can be greatly improved if spin coating is used.

One feature of a light emitting device having the above structure is that the display device has a memory circuit including a memory element portion with a structure in which an organic compound layer is interposed between a pair of conductive layers. Since the memory element portion has the same structure as or a similar structure to that of a light emitting element and further has a simple structure, the memory element portion can be manufactured easily without increasing the number of manufacturing steps, so that an low-cost display device can be provided. In addition, since the area of a memory cell can be easily reduced, memory cells can be highly integrated easily. Therefore, a display device including a high-capacity memory circuit can be provided.

Further, another feature of a display device of the invention is that a plurality of pixels for displaying images and a memory circuit are provided over one substrate. Due to this feature, the number of IC chips that are connected to the external can be reduced, and hence, a small, thin and lightweight display device can be provided.

Note that this embodiment mode can be freely combined with any of the above embodiment modes. Accordingly, the materials and the structures of the semiconductor device described in the above embodiment modes may be freely combined in this embodiment mode.

Embodiment Mode 7

In this embodiment mode, reading or writing data using a semiconductor device having the above structure will be described.

First, the case of writing data by electric action will be explained (FIG. 4A). Writing is conducted by changing electric characteristics of a memory cell, and an initial state (state without electric action) of the memory cell is used as data "0" and a state where electric characteristics have been changed is used as data "1".

Here, the case of writing data into the memory cell 221 in the y-th row and x-th column will be explained. In the case of writing data "1" into the memory cell 221, the memory cell 221 is selected first by the row decoder 224a, the column decoder 226a, and the selector 226c through an interface 223. Concretely, a predetermined voltage V22 is applied to a word line Wn connected to the memory cell 221 by the row decoder 224a. In addition, a bit line Bm connected to the memory cell 221 is connected to a read circuit 226b by the column decoder 226a and the selector 226c. Then, a write voltage V21 is output from the read circuit 226b into a bit line Bm.

In this manner, a transistor 240 included in the memory cell is turned on, and an organic memory element 241 is electrically connected to a common electrode and a bit line to apply electric potential of approximately Vw=Vcom−V21. An organic compound layer 29 provided between the conductive layers is changed physically or electrically by appropriately selecting electric potential Vw so that data "1" is written. Concretely, in a reading operation voltage, electric resistance between the first conductive layer and second conductive layer in the state of data "1" may be changed so as to be drastically lowered compared with the electric resistance in the state of data "0", or simply, short circuit may be established. The voltage may be appropriately selected from the range of (V21, V22, Vcom)=(5 V to 15 V, 5 V to 15 V, 0 V) or (−12 V to 0 V, −12 V to 0 V, 3 V to 5 V). The electric potential Vw may be 5 V to 15 V or −5 V to −15 V.

In the case where data "1" is written in the organic memory element 241, the distance between the pair of conductive layers provided so as to interpose the organic compound layer changes in some cases. Concretely, in a layered structure in which an organic compound layer is provided between a pair of conductive layers, by changing the organic compound layer physically or electrically, the distance L between the pair of conductive layers changes. For example, in a structure shown in FIG. 3A, data "1" is written between a first conductive layer 26 and a second conductive layer 28 and physical or electric change is caused on an organic compound layer 29; thus, the distance L between the fist conductive layer and the second conductive layer changes.

A non-selected word line and a non-selected bit line are controlled so that data "1" is not written into a memory cell which is to be connected to each of the non-selected word line and the non-selected bit line. Concretely, an electric potential (for example, 0 V) for turning off the transistor in the memory cell which is to be connected may be applied to the non-selected word line, and the non-selected bit line may be in a floating state or an electric potential equivalent to Vcom may be applied to the non-selected bit line.

On the other hand, in the case of writing data "0" into the memory cell 221, all that is required is that electric action is not applied to the memory cell 221. In circuit operation, for example, although the memory cell 221 is selected by the row decoder 224a, the column decoder 226a, and the selector 226c through an interface 223 in the same way as the case of writing data "1", an output electric potential from the read circuit 226b to the bit line Bx is set to be equivalent to Vcom or the bit line B3 is set to be in a floating state. As a result, a low electric potential (for example, −5 V to 5 V) or no electric potential is applied to the memory element 241; therefore, electric characteristics do not change and writing of data "0" is realized.

Next, the case of writing data by optical action will be explained.

Figure 9A:
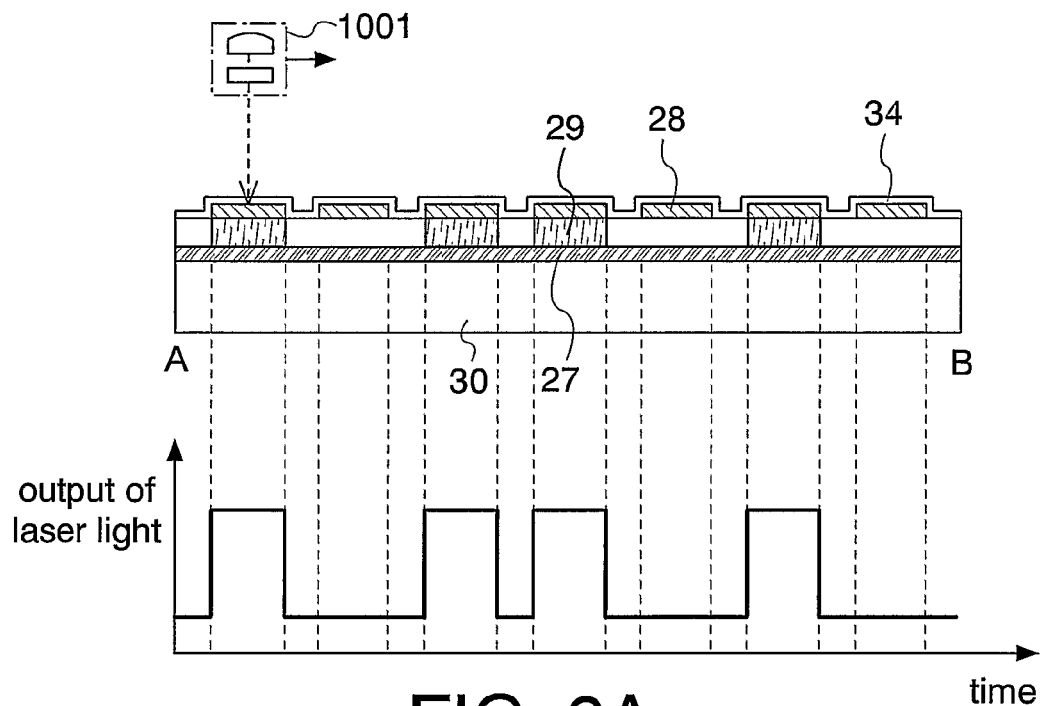
FIGS. 9A and 9B each shows an example of writing data into a semiconductor device of the present invention with the use of a laser.

As shown in FIG. 3A, in this case of writing data by applying optical action, an organic compound layer 29 included in an organic memory element is irradiated with laser light from a conductive layer side where the conductive layer has a light-transmitting property (second conductive layer 28 here) (FIG. 9A). Here, the organic compound layer 29 included in an organic memory element in a desired portion is selectively irradiated with laser light to destroy the organic compound layer 29 by using a laser irradiation apparatus 1001. The destroyed organic compound layer is carbonized and insulated; therefore, the resistance between the first conductive layer and the second conductive layer is significantly increased compared with the resistance of another organic memory element which has not been destroyed. Data is written by utilizing the phenomenon that electric resistance between two conductive layers provided so as to interpose the organic compound layer 29 is changed by laser light irradiation. For example, in the case where an organic memory element including an organic compound layer which is not irradiated with laser light is used for "0", an organic compound layer included in an organic memory element in a desired portion is selectively irradiated with laser light and destroyed to heighten the electric resistance in the case of writing data "1".

In the case of laser light irradiation, the change of electric resistance of an organic memory element depends on the size of the memory cell 21; however, the change is realized by irradiation with laser light focused to a diameter of micrometer size or nanometer size. For example, when a laser beam having a diameter of 1 μm passes at a velocity of 10 m/sec, the period of irradiating the organic memory element included in one memory cell 21 with laser light is 100 nsec. In order to change the phase within time as short as 100 nsec, the laser power is preferably 10 mW and the power density is preferably 10 kW/mm$^2$, for example. When the organic memory element is selectively irradiated with laser light, it is preferable to use a pulsed laser irradiation apparatus.

Figure 9B:
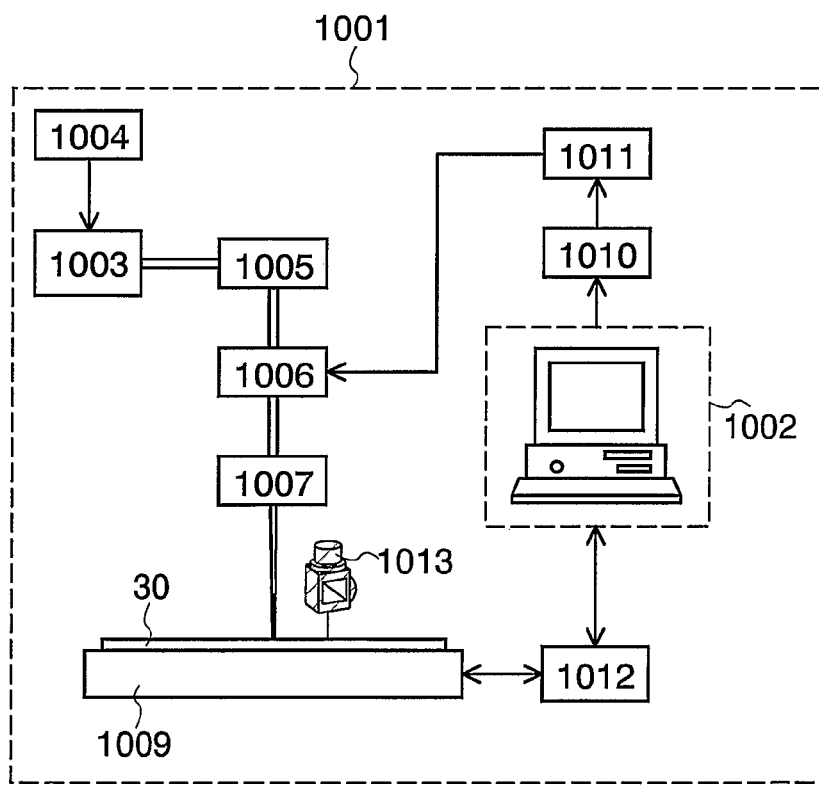

Here, an example of a laser irradiation apparatus will be explained with reference to FIG. 9B. A laser irradiation apparatus 1001 is provided with a personal computer (hereinafter, referred to as a PC) 1002 for conducting various controls when laser light is emitted; a laser oscillator 1003 for emitting laser light; a power supply 1004 of the laser oscillator 1003; an optical system (ND filter) 1005 for attenuating the laser light; an acousto-optic modulator (AOM) 1006 for modulating the intensity of the laser light; an optical system 1007 including a lens for reducing the area of the cross section of the laser light, a mirror for changing a light path, and the like; a transfer mechanism 1009 having an X axis stage and a Y axis stage; a D/A converter 1010 for converting control data output from the PC from digital to analog; a driver 1011 for controlling the acousto-optic modulator 1006 in accordance with the analog voltage output from the D/A converter; a driver 1012 for outputting a driving signal for driving the transfer mechanism 1009; and an autofocusing mechanism 1013 for focusing laser light on an object to be irradiated.

A laser oscillator which can emit ultraviolet light, visible light, or infrared light can be used as the laser oscillator 1003. An excimer laser oscillator using KrF, ArF, XeCl, Xe, or the like; a gas laser oscillator using He, He—Cd, Ar, He—Ne, HF, or the like; a solid-state laser oscillator using a crystal such as YAG, GdVO$_4$, YVO$_4$, YLF, or YAlO$_3$ doped with Cr, Nd, Er, Ho, Ce, Co, Ti, or Tm; or a semiconductor laser oscillator using GaN, GaAs, GaAlAs, InGaAsP, or the like can be used as the laser oscillator. Note that a fundamental wave or a second harmonic to a fifth harmonic is preferably applied to a solid-state laser oscillator.

Next, an irradiation method using the laser irradiation apparatus will be described. When a substrate 30 provided with an organic compound layer is set on the transfer mechanism 1009, the PC 1002 detects a position of the organic compound layer which is to be irradiated with laser light by a camera which is not shown in the figures. Then, the PC 1002 generates movement data for moving the transfer mechanism 1009 based on the detected position data.

Thereafter, the PC 1002 controls the amount of light which is to be emitted from the acousto-optic modulator 1006 through the driver 1011; thus, laser light emitted from the laser oscillator 1003 is attenuated by the optical system 1005. Then, the amount of light is controlled by the acousto-optic modulator 1006 so as to obtain a predetermined amount of light. Meanwhile, the light path and the shape of a beam spot of the laser light output from the acousto-optic modulator 1006 are changed with the optical system 1007 and the laser light is collected by the lens. Then, the substrate 30 is irradiated with the laser light.

At this time, the transfer mechanism 1009 is controlled to move in an X direction and a Y direction in accordance with the movement data generated by the PC 1002. As a result, a predetermined position is irradiated with the laser light, and the light energy density of the laser light is converted to heat energy. Thus, the organic compound layer provided over the substrate 30 can be selectively irradiated with laser light. It is to be noted that laser light irradiation is conducted by moving the transfer mechanism 1009; however, laser light may be moved to an X direction and a Y direction by adjusting the optical system 1007.

Figure 10A:
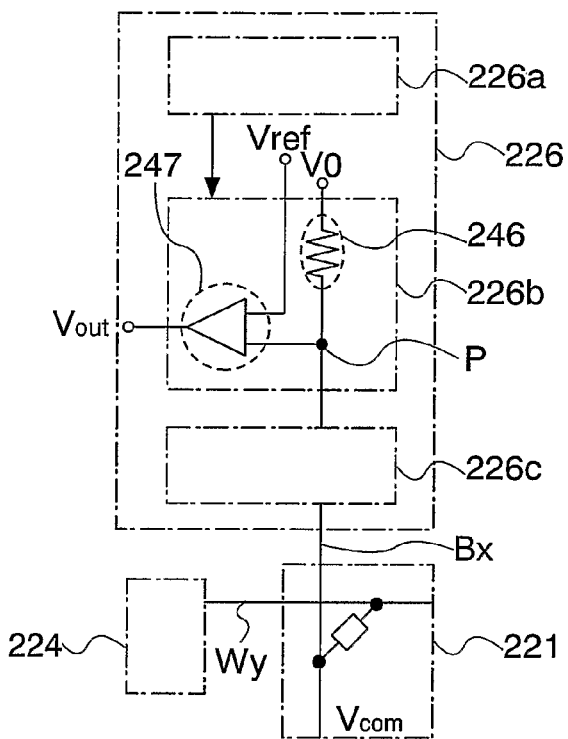
FIGS. 10A and 10B each shows a structure of a semiconductor device of the present invention.
Figure 10B:
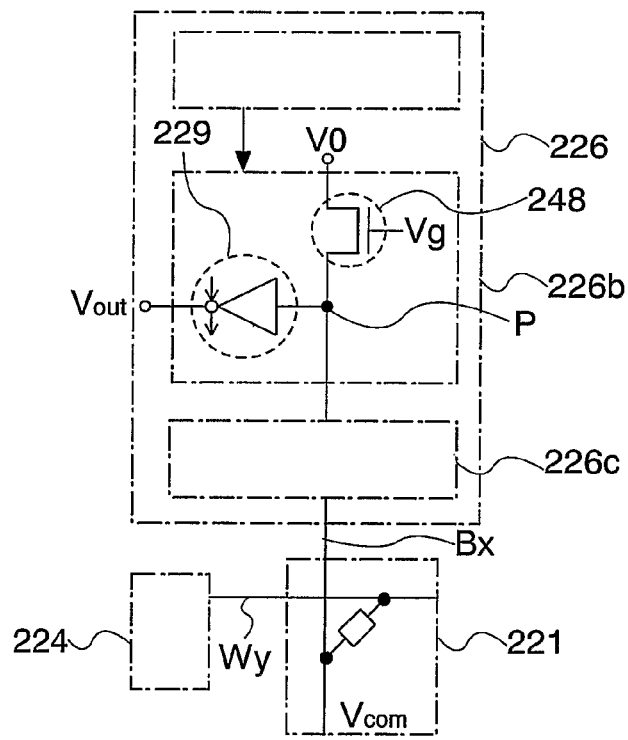

Next, operation of reading data by electric action will be explained. Reading of data is carried out by using electronic characteristics of the organic memory element 241, which are different between a memory cell with data "0" and a memory cell with data "1". For example, a reading method by utilizing the difference in electric resistance will be explained, provided that electric resistance of the memory element included in the memory cell with data "0" is R0 at a reading voltage, and electric resistance of the memory element included in the memory cell with data "1" is R1 at a reading voltage (R1<<R0). As for a read circuit 226b, for example, a bit line driver circuit 226 using a resistor 246 and a differential amplifier 247 shown in FIG. 10A is conceivable as a structure of its reading portion. The resistor has a resistance value of Rr (R1<Rr<R0). A transistor 248 may be used instead of the resistor 246 and a clocked inverter 249 can be used instead of the differential amplifier (FIG. 10B). Naturally, a circuit configuration is not limited to FIGS. 10A and 10B.

In the case of reading data from the memory cell 221 in the y-th row and x-th column, the memory cell 221 is selected first by the row decoder 224a, the column decoder 226a, and the selector 226c through the interface 223. Concretely, a predetermined voltage V24 is applied to a word line Wy connected to the memory cell 221 by the row decoder 224a. In addition, a bit line Bx connected to the memory cell 221 is connected to a terminal P of the read circuit 226b by the column decoder 226a and the selector 226c. Accordingly, the electric potential Vp of the terminal P is a value determined by dividing Vcom and V0, which is applied to one terminal of the resistor 246, by the resistor 246 (resistance value: Rr) and the organic memory element 241 (resistance value: R0 or R1). Therefore, the equation Vp0=Vcom+(V0−Vcom)*R0/(R0+Rr) holds in the case where the memory cell 221 has data "0". Alternatively, the equation Vp1=Vcom+(V0−Vcom)*R1/(R1+Rr) holds in the case where the memory cell 221 has data "1". As a result, by selecting Vref so as to be between Vp0 and Vp1 in FIG. 10B or by selecting the change point of the clocked inverter so as to be between Vp0 and Vp1 in FIG. 10B, Lo/Hi (or Hi/Lo) of output electric potential Vout is output in accordance with data "0"/"1" so that reading can be conducted.

For example, the differential amplifier is operated at Vdd=3V, and Vcom, V0, and Vref are 0 V, 3 V, and 1.5 V, respectively. On the condition that the equation R0/Rr=Rr/R1 =9 holds, Hi is output as Vout at Vp0=2.7. V when a memory cell has data "0", or Lo is output as Vout at Vp1=0.3 V when a memory cell has data "1". In this way, reading from a memory cell can be conducted.

In accordance with the above method, reading is conducted by a voltage value utilizing the difference in a resistance value of the organic memory element and resistance division. Naturally, the reading method is not limited thereto. For example, reading may be conducted by utilizing the difference in current values other than the method utilizing the difference in electric resistances. In the case where electric characteristics of the memory cell have different diode characteristics in threshold voltages in the case of data "0" and data "1", reading may be carried out by using difference in the threshold voltages.

An organic memory or a semiconductor device equipped with the organic memory which has the above structure is a nonvolatile memory; therefore, a battery for storing data is not required to be incorporated, and a small-sized, thin, and lightweight semiconductor device can be provided. Further, by using an organic compound material described in the above embodiment modes for the organic compound layer, a memory element in which data cannot be rewritten though data can be written (additionally) can be obtained. Accordingly, counterfeits can be prevented, and a semiconductor device with ensured security can be provided.

In this embodiment mode, a passive matrix organic memory in which the memory circuit has a simple structure and a semiconductor device equipped with the organic memory have been taken as examples. However, even in the case of using an active matrix memory circuit, data can be written or read in a similar manner.

Here, in the case of an active matrix type, an example of reading data in a memory element portion by electric action will be explained with reference to FIGS. 20A and 20B.

Figure 20A:
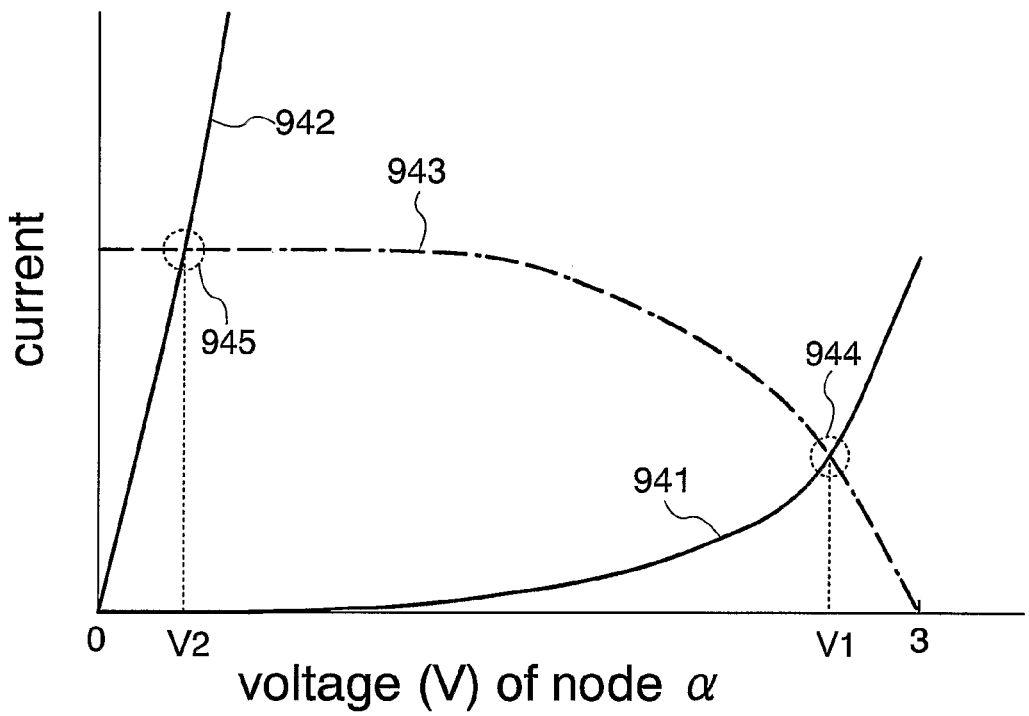
FIGS. 20A and 20B shows a graph showing current-voltage characteristics of memory and so on and a structure of a semiconductor device of the present invention, respectively.

FIG. 20A shows the current-voltage characteristics 941 of a memory element when data [0] is written in the memory element, the current-voltage characteristics 942 of the memory element when data [1] is written in the memory element, and the current-voltage characteristics 943 of a resistor 246. The horizontal axis shows the potential of node a. Here, the case of using a transistor as a resistor 246 will be described. In addition, the case of applying 3 V between a first conductive layer 243 and a second conductive layer 245 as operation voltage in reading data will be described.

Figure 20B:
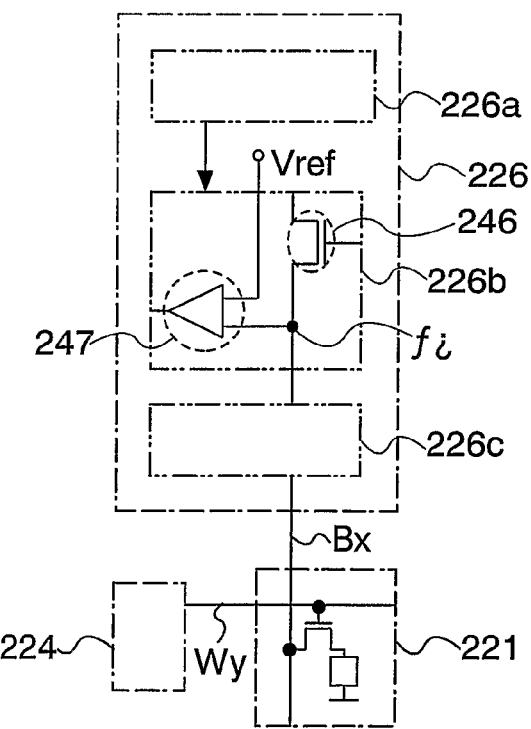

In FIGS. 20A and 20B, as for a memory cell having a memory element portion into which data [0] is written, an intersection point 944 of the current-voltage characteristics 941 of the memory element and the current-voltage characteristics 943 of the transistor is an operational point, and the potential of a node α at this time is V1 (V). The potential of the node α is supplied to a differential amplifier 247. The data stored in the memory cell is recognized as [0] in the differential amplifier 247.

Meanwhile, as for a memory cell having a memory element portion into which data [1] is written, an intersection point 945 of the current-voltage characteristics 942 of the memory element and the current-voltage characteristics 943 of the transistor is an operational point, and the potential of a node a at this time is V2 (V) (V1>V2). The potential of the node a is supplied to a differential amplifier 247. The data stored in the memory cell is recognized as [1] in the differential amplifier 247.

Thus, the data stored in the memory cell is distinguished by reading the potential divided by resistance in accordance with the resistance value of the organic memory element 241.

This embodiment mode can be freely combined with any of the structures of an organic memory described in the above embodiment modes and a semiconductor device equipped with the organic memory.

Embodiment Mode 8

In this embodiment mode, the case of using a semiconductor device of the invention as an RFID tag capable of non-contact data transmission and reception will be described with reference to FIGS. 14A to 14C.

Figure 14A:
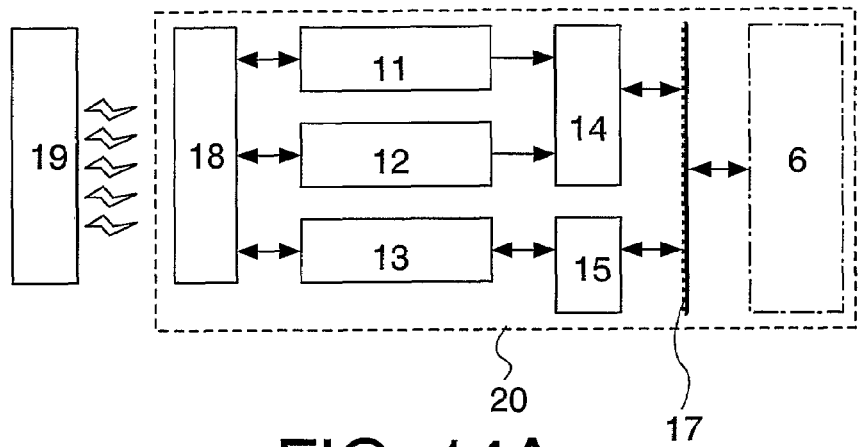
FIGS. 14A to 14C each shows an example of use of a semiconductor device of the present invention.
Figure 14B:
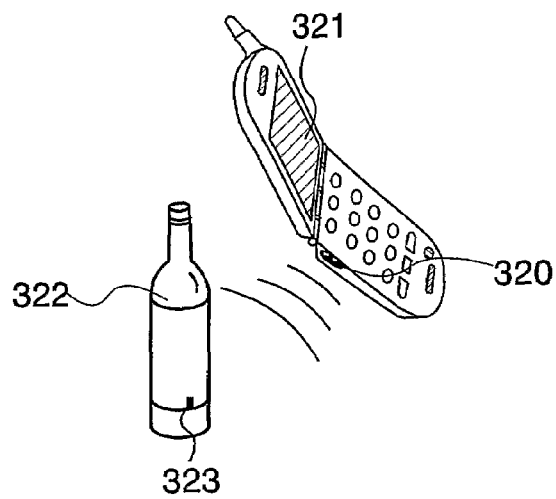
Figure 14C:
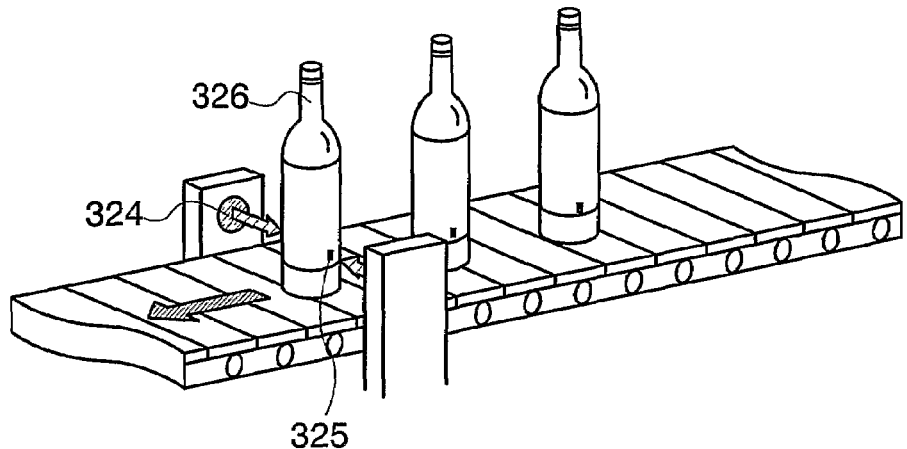

The RFID tag 20 has a function to communicate data without contact and includes a power supply circuit 11, a clock generating circuit 12, a data demodulation/modulation circuit 13, a control circuit 14 for controlling other circuits, an interface circuit 15, a memory 6, a data bus 17, and an antenna 18 (antenna coil) (FIG. 14A).

The power supply circuit 11 generates various kinds of power to be supplied to each circuit in the semiconductor device based on an AC electrical signal input from the antenna 18. The clock generating circuit 12 generates various clock signals to be supplied to each circuit in the semiconductor device based on the AC electrical signal input from the antenna 18. The data demodulation/modulation circuit 13 has a function to demodulate/modulate data to communicate with a reader/writer 19. The control circuit 14 has a function to control the memory 6. The antenna 18 has a function to transmit and receive electric filed or electromagnetic waves. The reader/writer 19 controls the process regarding communication with the semiconductor device and control of the semiconductor device, and data thereof.

The memory 6 has one of the structures of each organic memory shown in the above embodiment modes. An RFID tag 20 is not limited to the aforementioned structure and may be additionally provided with other elements such as a limiter circuit of power supply voltage and a decoding hardware.

As for the RFID tag in this embodiment mode, a type in which power supply voltage is supplied to each circuit by electric waves without mounting a power supply (buttery); another type in which power supply voltage is supplied to each circuit by mounting a power supply (buttery) instead of an antenna, or still another type in which power supply voltage is supplied by electric waves and a power supply may be used.

It is advantages to use a semiconductor device of the present invention for an RFID tag or the like since non-contact communication is possible; multiple reading is possible; writing data is possible; processing into various shapes is possible; directivity is wide and a wide recognition range is provided depending on the selected frequency; and the like. The RFID tag can be applied to an IC tag which can identify individual information of a person or a thing in non-contact wireless communication, a label which is enabled to be attached to an article by label processing, a wristband for an event or an amusement, or the like. In addition, the RFID tag may be processed with a resin material and may be directly fixed to a metal obstructing wireless communication. Further, the RFID tag can be utilized for operating a system such as an entering-leaving management system or a checkout system.

Next, one mode of the actual use of the semiconductor device of the present invention as the RFID tag will be explained. A reader/writer 320 is provided on the side of a portable terminal including a display area 321, and an RFID tag 323 is provided on the side of an article 322 (FIG. 14B). When the reader/writer 320 is held against the RFID tag 323 included in the article 320, information relating to a product, such as a raw material and a place of origin of the article, a test result in each production process, a history of distribution process, or further, description of the product is displayed in the display area 321. In addition, a product 326 can be inspected by using a reader/writer 324 and an RFID tag 325 provided on the product 326 when the product 326 is transported with a belt conveyor (FIG. 14C). In this manner, information can be easily obtained, and high functions and high added values are realized by utilizing an RFID tag for a system.

This embodiment mode can be freely combined with any of the above embodiment modes.

Embodiment Mode 9

In this embodiment mode, a semiconductor device having the above structure, which is provided with a sensor capable of measuring various information such as temperature or pressure will be described with reference to FIGS. 28A and 28B.

Figure 28A:
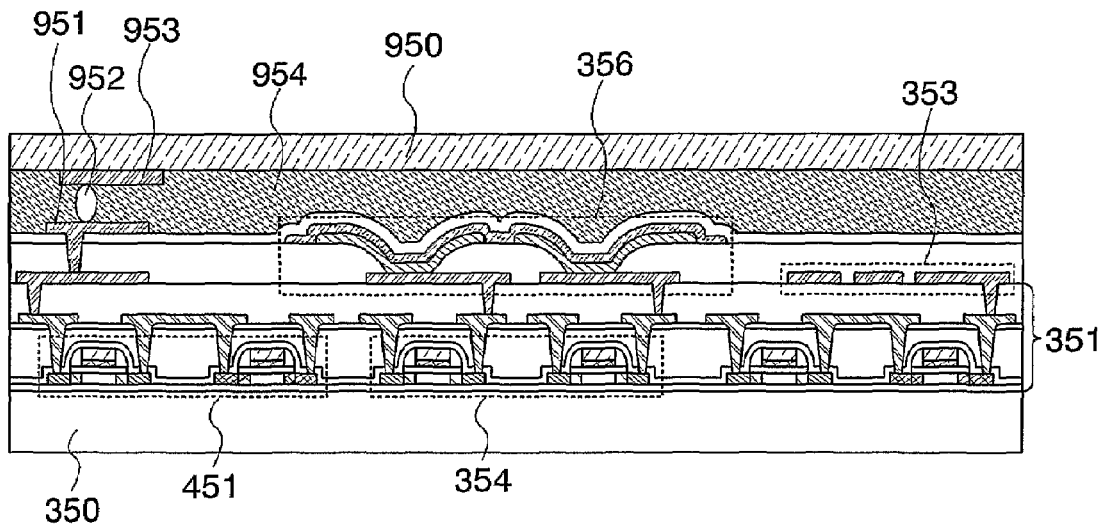
FIGS. 28A and 28B each shows an example of a structure of a semiconductor device of the present invention.

FIG. 28A shows a structure example of the case of providing the semiconductor device described in the above embodiment modes with a sensor portion. An element formation layer 351 including transistors 451 and 354 over a substrate 350, and a memory element portion 356 and an antenna portion 353 are provided above the element formation layer.

A sensor portion 950 is provided above the memory element portion 356. The memory element portion 356 and the transistors 451 and 354 may use any of the structures described in the above embodiment modes. For example, the memory element portion may have a structure shown in FIGS. 19A to 19C.

The sensor portion 950 can detect temperature, humidity, illuminance, gas, gravity, pressure, sound, oscillation, acceleration, and other characteristics by physical or chemical means. Further, the sensor portion 950 includes a sensor and a sensor circuit for controlling the sensor. The sensor is formed with a resistor, a photoelectronic conversion element, a thermoelectromotive force element, a transistor, a thermistor, a diode, or the like.

The sensor portion 950 is connected to the transistor 451 included in the element formation layer 351. Here, the sensor portion is attached to the transistor 451 with an adhesive resin 954. The conductive layer 953 electrically connected to the sensor portion 950 is connected to the conductive layer 951 electrically connected to the source or drain region of the transistor 451 through a conductive particle 952 contained in the resin 954; thus, the sensor portion 950 and the transistor 451 are electrically connected.

The sensor portion 950 may be arranged in any manner without limitation to the above structure. For example, the sensor portion 950 may be provided in the same layer as the memory element portion 356, or it may be provided in the same layer as the transistor 451. Further, the sensor portion 950 can be provided below the substrate 350. In the case where the sensor portion 950 is provided in the same layer as the transistor 451 or the memory element portion 356, the sensor portion 950 may be integrated with the transistor 451 or the memory element portion 356 to be provided at the same time; thus, the manufacturing process can be simplified and the cost can be reduced.

Further, in the above structure, in order to connect the sensor portion 950 and the transistor 451, other than the above manner, a method in which a conductive adhesive such as silver paste, copper paste, carbon paste may be used, solder bonding is carried out, a known method such as a TCP (Tap carrier package) method or wire bonding may be used.

With the above structure, an example of providing a sensor portion separately from a semiconductor device and thereafter attaching them together has been described; alternatively, the sensor portion can be fabricated in the semiconductor. This case will be described with reference to FIGS. 29A and 29B.

Figure 29A:
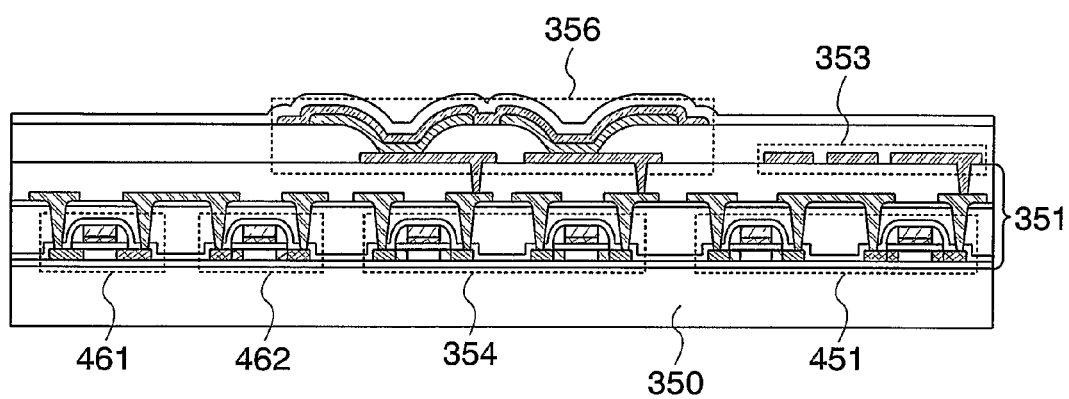
FIGS. 29A and 29B each shows an example of a structure of a semiconductor device of the present invention.

In FIG. 29A, a light sensor is provided in the same layer as the element formation layer 351 including the transistors 354 and 451. Here, a photodiode 461 including a p-type impurity region, an intrinsic semiconductor region, and an n-type impurity region is provided as the light sensor. Current value of the photodiode 461 changes when irradiated with light, so that light can be detected by measuring the change in the current value of a transistor 462 connected to the photodiode 461. The photodiode may have a junction structure of a p-type impurity region and an intrinsic semiconductor region, another p-type impurity region; or an n-type impurity region, an intrinsic semiconductor region, another n-type impurity region or a p-type impurity region, and an n-type impurity region. Further, a phototransistor may be provided instead of the photodiode. For example, in the case where thin film transistors are used for the transistors 354 and 451, it is preferable that the transistors are integrated with a photodiode or a phototransistor, so that the manufacturing process can be simplified and the cost can be reduced.

Figure 29B:
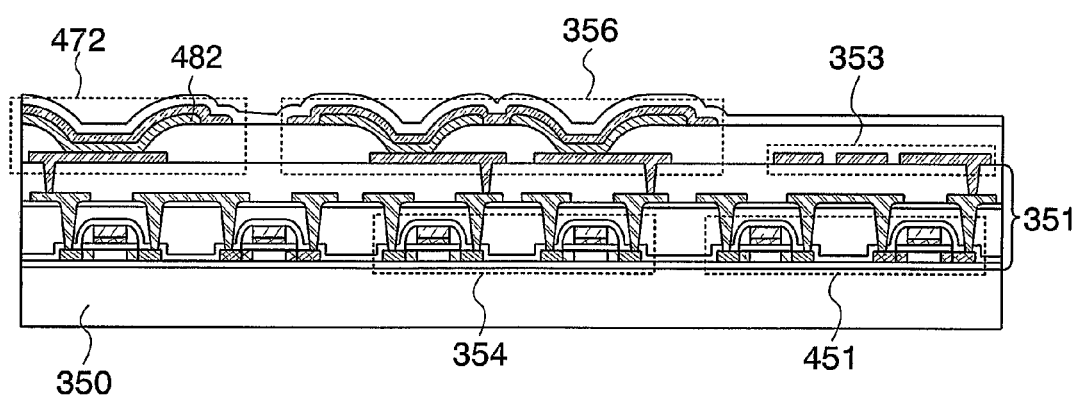

In FIG. 29B, a temperature sensor 472 is provided in the same layer as the memory element portion 356. Here, as the temperature sensor, an organic compound layer 482 is provided between a pair of conductive layers. The organic compound layer 482 has a property that the resistance changes correspondingly to the ambient temperature. Specifically, assuming that the room temperature is the normal temperature, the resistance value decreases when the temperature is higher than the room temperature, and the resistance increases when the temperature is lower than the room temperature. Accordingly, the change in the temperature can be detected by measuring the voltage when a certain value of current is flown through the pair of the conductive layers. Further, in FIG. 29B, an organic compound layer of the memory element portion 356 and an organic compound layer of the temperature sensor 472 can be formed using the same material. In the case of providing the memory element portion 356 and an organic compound layer of the temperature sensor 472 using the same material, when change in the resistance of the organic compound layer is detected, since the resistance of the organic compound of the memory element portion 356 is also changed, a circuit for compensating the change in voltage due to the change in resistance of the organic compound layer in reading data stored in the memory element portion 356 may preferably be provided. In the structure shown in FIGS. 29A and 29B, another sensor of the above may be formed without limitation to the light sensor and the temperature sensor.

Figure 28B:
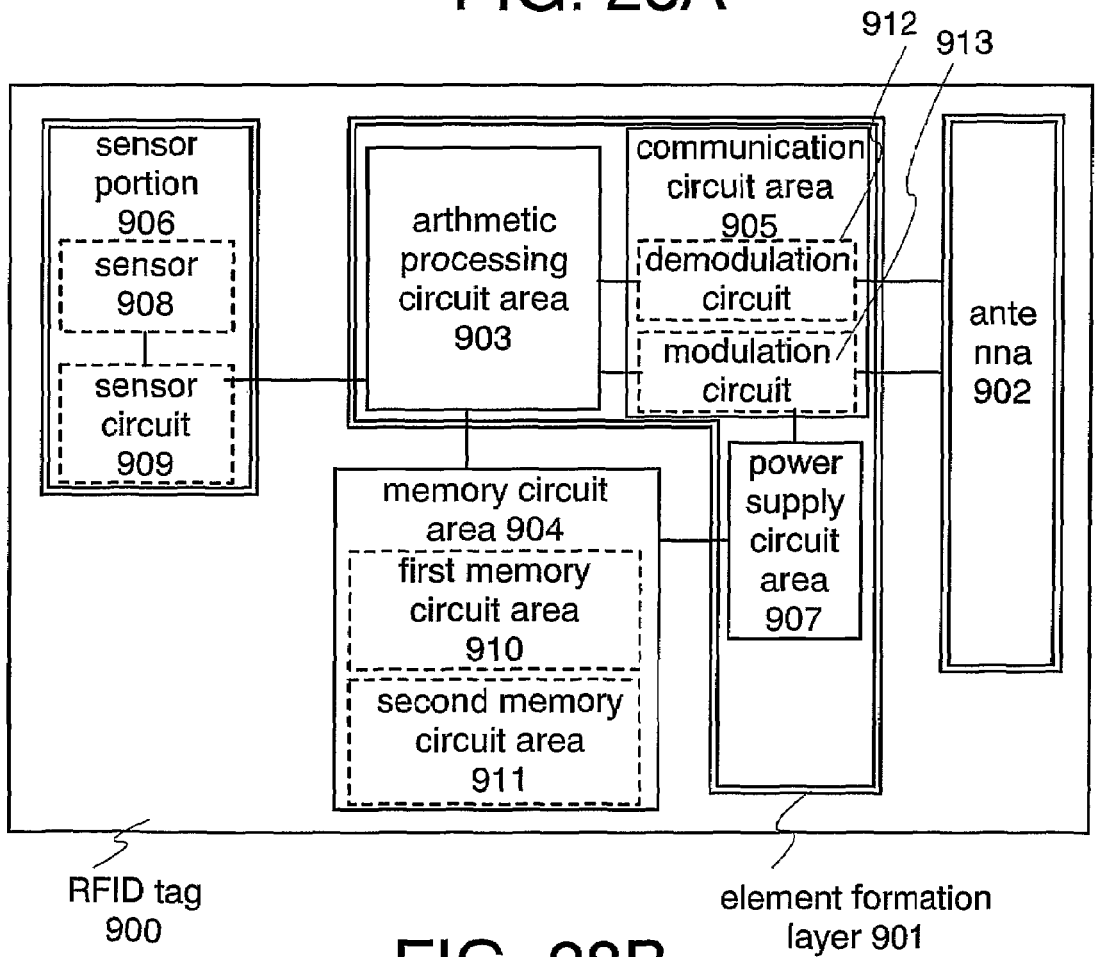

In FIG. 28B, a structure of an RFID tag 900 equipped with an element formation layer 901, a memory circuit area 904, a sensor 908, and an antenna 902 is shown. The sensor portion 906 detects temperature, humidity, illuminance, gas, gravity, pressure, sound, oscillation, acceleration, and other characteristics by physical or chemical means. The sensor portion 906 includes a sensor 908 and a sensor circuit 909 for controlling the sensor 908. The sensor is formed with a resistor, a photoelectronic conversion element, a thermoelectromotive force element, a transistor, a thermistor, a diode, or the like. The sensor circuit 909 detects change in impedance, reactance, inductance, voltage, or current, and carries out analog-to-digital conversion (A/D conversion) and outputs a signal to the arithmetic processing circuit area 903.

The element formation layer includes an arithmetic processing circuit area 903, a communication circuit area 905, and a power supply circuit area 907. The memory circuit area 904 can be provided in the element formation layer 901. The memory circuit area 904 can store information received from the outside via the sensor portion 906 or the antenna 902 at any time. The memory circuit area 904 includes a first memory circuit area 910 which stores the signal detected by the sensor portion 906, and a second memory circuit area 911 which stores information written by a reader/writer device.

The first memory circuit area 910 may preferably include a flash memory or the like in which sequential write can be carried out and data is not destroyed so as to store information detected in the sensor portion 906. Further, a write-once memory element is preferably applied.

The communication circuit area 905 includes a demodulation circuit 912 and a modulation circuit 913. The demodulation circuit 912 demodulates a signal which is input through the antenna 902 and outputs the signal to the arithmetic processing circuit area 903. The signal includes a signal controlling the sensor portion 906 and information which is to be stored in the memory circuit area 904. In addition, the signal output from the sensor circuit 909 and information read out from the memory circuit area 904 are output to the modulation circuit 913 through the arithmetic processing circuit area 903. The modulation circuit 913 modulates this signal to a signal which is wirelessly communicable and outputs the signal to an external device through the antenna 902.

Power which is necessary for operating the arithmetic processing circuit area 903, the sensor portion 906, the memory circuit area 904, and the communication circuit area 905 is supplied through the antenna 902. Depending on use, a battery may be built in.

Thus, by providing a sensor, which can detect information of temperature, pressure, and the like, on the semiconductor device shown in the above embodiment modes, various information detected by the sensor can be stored and managed in the memory element portion. For example, a semiconductor device including a gas sensor is provided to a food and food condition can be managed. Specifically, the semiconductor device having a gas sensor is provided on a perishable food or the like, and detects septic gas which is generated from the food. The stored data is regularly read by a reader/writer provided at the side of a display cabinet or a belt conveyor; thus, the freshness of foods can be controlled and foods which have started to rot can be sorted.

In addition, by providing a surface of a human body or inside the body with a semiconductor device having a sensor such as a temperature sensor or a pressure sensor, biological information such as pulse rate, heart rate, body temperature, blood pressure, an electrocardiogram, or an electromyogram can be stored in the memory element portion provided in the semiconductor device. The semiconductor device of the present invention can read biological information without body restraint since the semiconductor device is thin and minute. Management of a physical condition and an exercise condition of a body and prevention and prediction of a disease can be enabled by regularly reading stored information with the reader/writer. A home healthcare monitoring system or the like can be used by obtaining biological information which is read with the reader/writer using a network such as Internet. Note that a semiconductor device equipped with a sensor may be provided on an animal such as a domestic animal instead of a human body and a variety of information can be stored; thus, the animal can be controlled.

This embodiment mode can be freely combined with the above embodiment modes. This embodiment mode can be implemented in combination with any of the semiconductor devices described in the embodiment modes above.

Embodiment Mode 10

Figure 15:
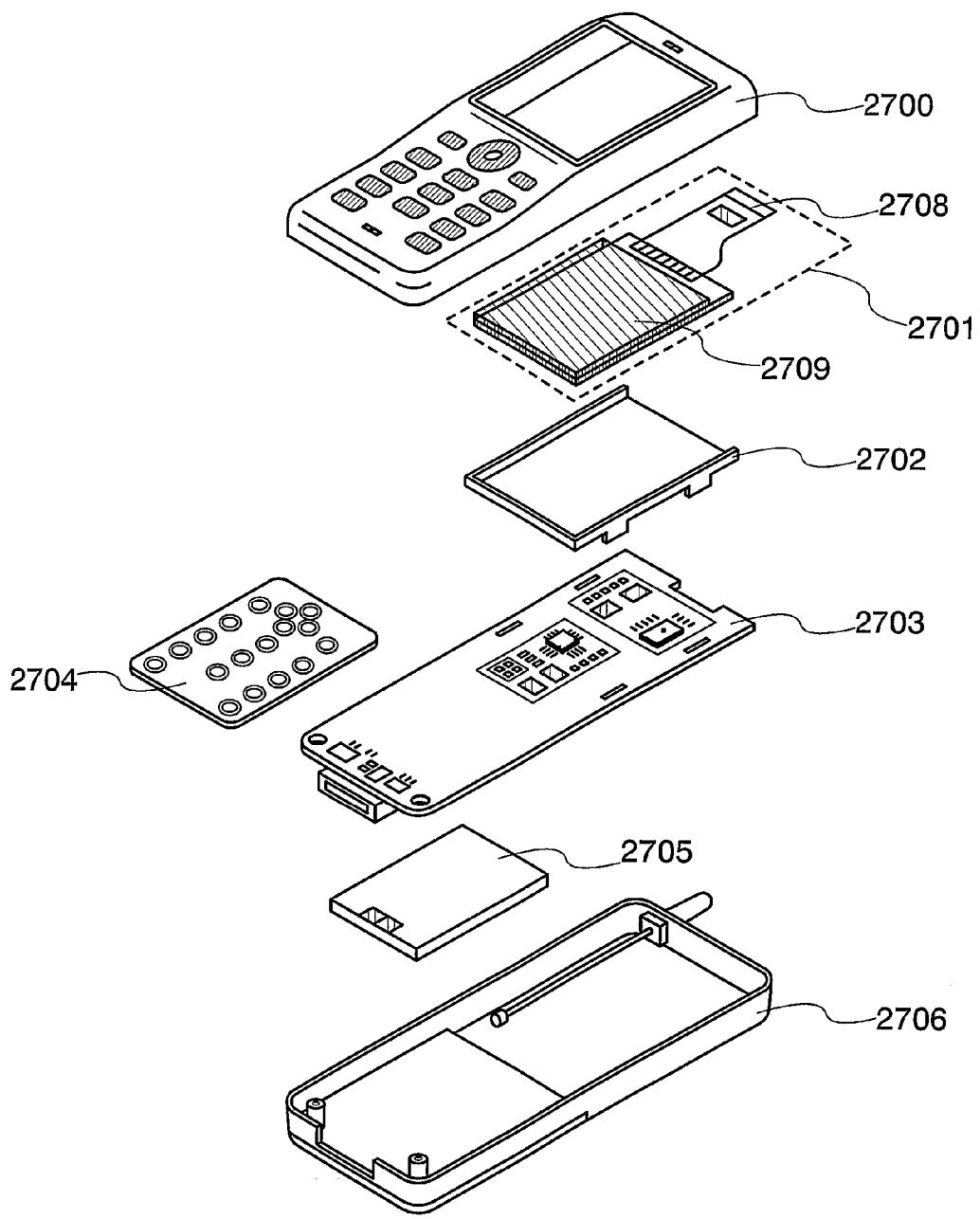
FIG. 15 shows an example of a semiconductor device of the present invention.

The usage of a semiconductor device according to the present invention is wide-ranging. For example, the semiconductor device can be used for an electronic apparatus in which information is stored and displayed. For example, the semiconductor device can be used for an electronic device such as a television receiver, a portable information terminal including a cellular phone, a digital camera, a video camera, a navigation system. The case of applying the semiconductor device of the invention to a cellular phone will be described with reference to FIG. 15.

The cellular phone includes chassis 2700 and 2706, a panel 2701, a housing 2702, a printed wiring board 2703, an operation button 2704, a buttery 2705, and the like. The panel 2701 is incorporated into the housing 2702 so as to be freely detached/attached, and the housing 2702 is fitted into the printed wiring board 2703. The shape and size of the housing 2702 can be appropriately changed depending on an electronic apparatus into which the panel 2701 is incorporated. A plurality of packed semiconductor devices are mounted on the printed wiring board 2703, and the semiconductor device according to the invention can be used as one of the plurality of semiconductor devices. The plurality of semiconductor devices mounted on the printed wiring board 2703 each serves as a controller, a central processing unit (CPU), a memory, a power supply circuit, a audio-processing circuit, a sending/receiving circuit, or the like.

The panel 2701 is connected to the printed wiring board 2703 through a connection film 2708. The panel 2701, the housing 2702, and the printed wiring board 2703 described above are placed inside the chassis 2700 and 2706 along with the operation button 2704 and the buttery 2705. A pixel area 2709 included in the panel 2701 is disposed so as to be seen through an opening window provided on the chassis 2700.

The semiconductor device according to the invention has features of small size, thinness, and lightweight. According to the features, limited space inside the chassis 2700 and 2706 of an electronic apparatus can be effectively utilized. A semiconductor device according to the invention has a feature of including a memory circuit having a simple structure, and according to the above feature, an electronic apparatus using a semiconductor device having an inexpensive and highly integrated memory circuit can be provided. Further, the semiconductor device according to the invention has a feature of including a memory circuit which is nonvolatile and able to write once and be read many, and due to the above features, an electronic apparatus in which high functions and high added values are realized can be provided. Further, in a semiconductor device of the present invention, a transistor in which a single crystal semiconductor layer with preferable mobility and response speed is used as the channel region can be provided. In this case, an electronic device using a semiconductor device capable of high-speed operation and of which operation frequency is improved can be provided.

The semiconductor device according to the invention can be utilized as an RFID tag. For example, the semiconductor device can be used by being provided on paper money, coin, securities, certificates, bearer bonds, packing containers, documents, recording media, commodities, vehicles, foods, garments, health articles, livingwares, medicines, electronic apparatuses, and the like. These examples each having an RFID tag 20 will be explained with reference to FIGS. 16A to 16H.

Figure 16A:
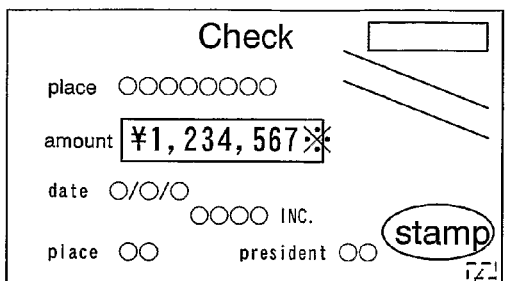
FIGS. 16A to 16H each shows an example of use of a semiconductor device of the present invention.
Figure 16B:
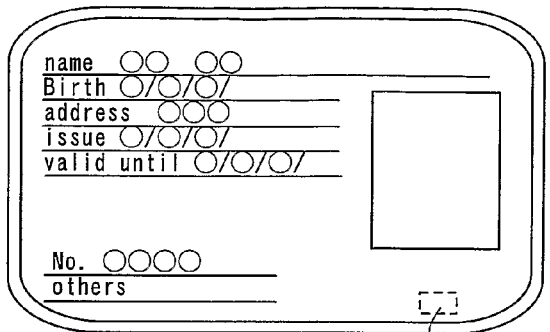
Figure 16C:
Figure 16D:
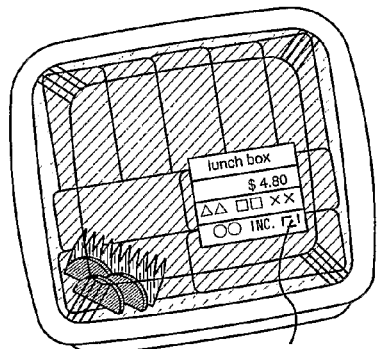
Figure 16E:
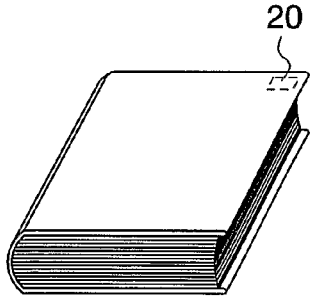
Figure 16F:
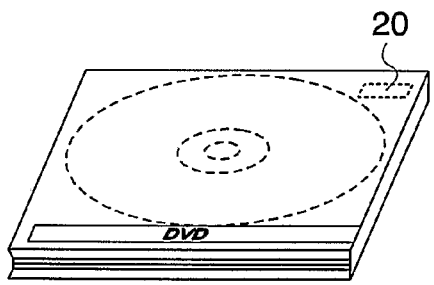
Figure 16G:
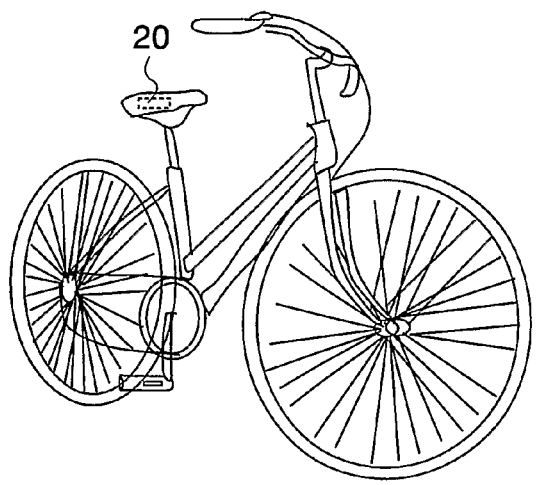
Figure 16H:
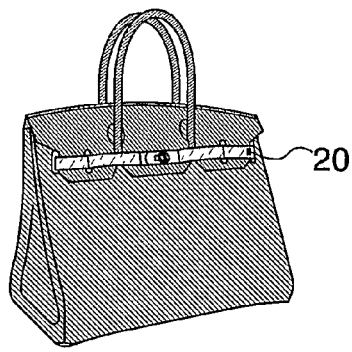

The paper money and coins are money distributed in the market and include currency (cash vouchers) available in a certain area in a similar way to money, and memorial coins. The securities refer to checks, stock certificates, promissory notes, and the like (FIG. 16A). The certificates refer to driver's licenses, certificates of residence, and the like (FIG. 16B). The bearer bonds refer to stamps, rice coupons, various merchandise coupons, and the like (FIG. 16C). The packing containers refer to wrapping paper for a box lunch, plastic bottles, and the like (FIG. 16D). The documents refer to volumes, books and the like (FIG. 16E). The recording media refer to DVD software, video tapes, and the like (FIG. 16F). The vehicles refer to wheeled vehicles such as bicycles, vessels, and the like (FIG. 16G). The commodities refer to bags, glasses, and the like (FIG. 16H). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

Counterfeits can be prevented by providing an RFID tag on the paper money, coin, securities, certificates, bearer bonds, and the like. The efficiency of an inspection system or a system used in a rental shop can be improved by providing an RFID tag on packing containers, documents, recording media, commodities, foods, livingwares, electronic apparatuses, or the like. By providing an RFID tag on each of the vehicles, health articles, medicines, and the like, counterfeits or theft can be prevented, further, medicines can be prevented from being taken mistakenly. The RFID tag is provided on goods by being pasted on their surfaces or embedded thereinto. For example, the RFID tag may be embedded in a paper in the case of a book or embedded in an organic resin in the case of a package formed of the organic resin. In the case of writing (additionally writing) by optical operation afterward, a transparent material is preferably used so that a memory element provided on a chip is exposed to light. Further, counterfeits can be effectively prevented by using a memory element in which once-written data cannot be changed. Problems such as privacy after a user purchases a product can be solved by providing a system for erasing data of a memory element provided on an RFID tag.

The efficiency of an inspection system, a system used in a rental shop, or the like can be improved by providing an RFID tag on, for example, packing containers, recording media, commodities, foods, garments, livingwares, electronic apparatuses, or the like. Counterfeits or theft can be prevented by providing an RFID tag on vehicles. Individual creatures can be easily identified by implanting an RFID tag equipped with a sensor in creatures such as animals. For example, health status such as body temperature in addition to year of birth, sex, breed, and the like can be easily managed by implanting an RFID tag in creatures such as domestic animals.

As described above, a semiconductor device according to the invention can be provided on anything as long as they are goods which store data. This embodiment mode can be freely combined with the any of the above embodiment modes.

Embodiment 1

In this embodiment, an organic memory element is provided over a substrate, and the result of writing data by applying electric action to the organic memory element will be described.

The organic memory is an element in which a first conductive layer, an organic compound layer, and a second conductive layer are sequentially stacked over the substrate. A compound of silicon oxide and indium tin oxide was used for the first conductive layer. As the organic compound layer, [Methoxy-5-(2-ethyl)hexyloxyl]-p-phenylene vinylene (can be abbreviated as MEH-PPV) is formed by spin coating. As the second conductive layer, aluminum is provided by vapor deposition.

Figure 17:
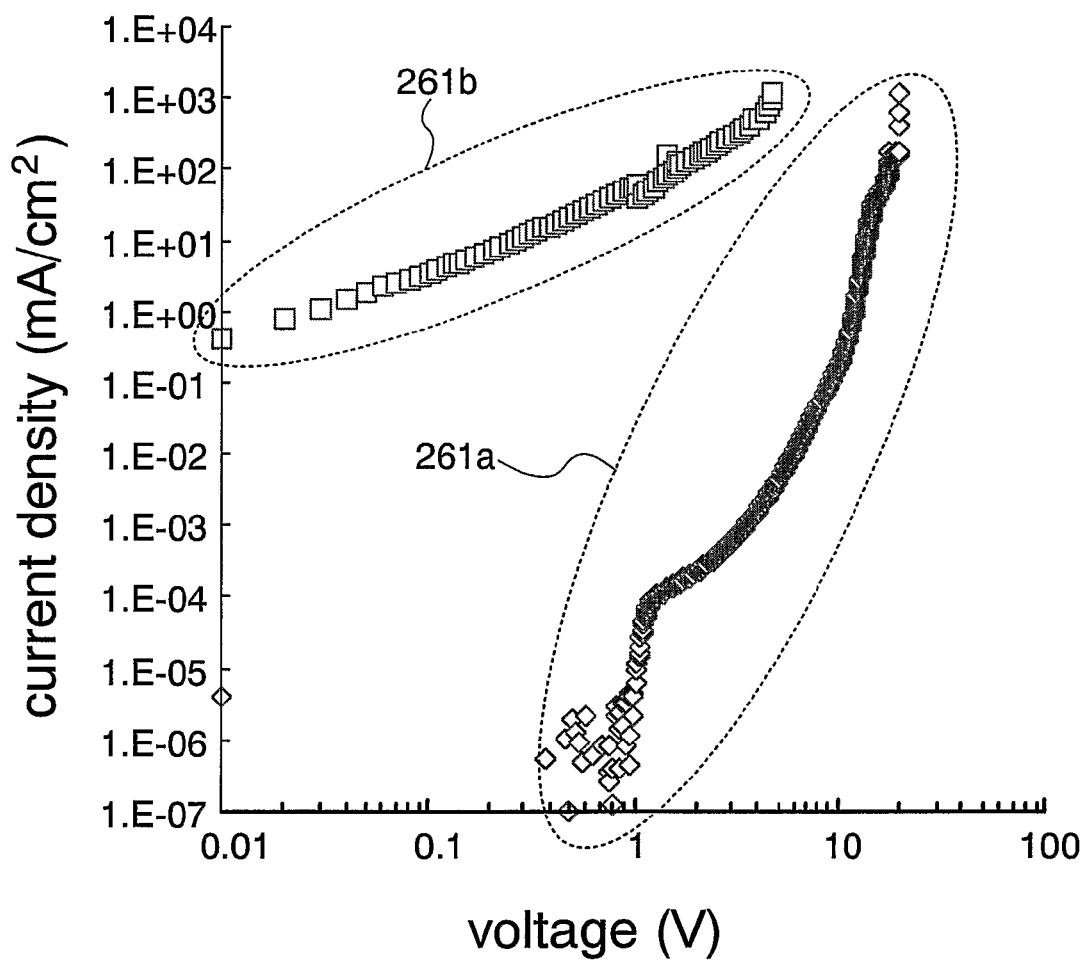
FIG. 17 shows a graph showing current-voltage characteristics of a memory element in a semiconductor device of the present invention.

The result of measuring the current density-voltage characteristics of an organic memory element having the above structure before and after writing data thereinto by electric action is shown in FIG. 17. In FIG. 17, the horizontal axis shows voltage values (V), and the vertical axis shows current density (mA/cm$^2$). Further, in FIG. 17, a plot 861*a* indicates current-voltage characteristic before writing data by electric action, and plot 861*b* indicates current-voltage characteristics after writing data by electric action.

In FIG. 17, great change can be seen between the current-voltage characteristics of the organic memory element before and after writing data. For example, the current density of the organic memory element after writing data is $1.1 \times 10^2$ mA/cm$^2$ after writing data while the applied voltage is $7.4 \times 10^{-6}$ mA/cm$^2$ before writing data at the applied voltage of 1 V; thus, the current density changes in eight orders of magnitude comparing before and after writing the data. Accordingly, the resistance value of the organic memory element is substantially reduced after writing the data.

As described above, the resistance value changes by writing data. The change in the resistance value of the organic memory element is read using a voltage value and a current value; thus, the semiconductor device of the present invention can have a function of a memory circuit.

Further, another organic memory element using different materials from the above structure is manufactured, and the result of writing data into the organic memory by electric action will be described.

The organic memory element is an element in which a first conductive layer, an organic compound layer, and a second conductive layer are sequentially stacked over a substrate. The first conductive layer is formed of a compound of silicon oxide and indium tin oxide. As the organic compound layer, poly (9-vinylcarbazole) (can be abbreviated to PVK) is formed by spin coating. As the second layer, aluminum is provided by vapor deposition.

Figure 18:
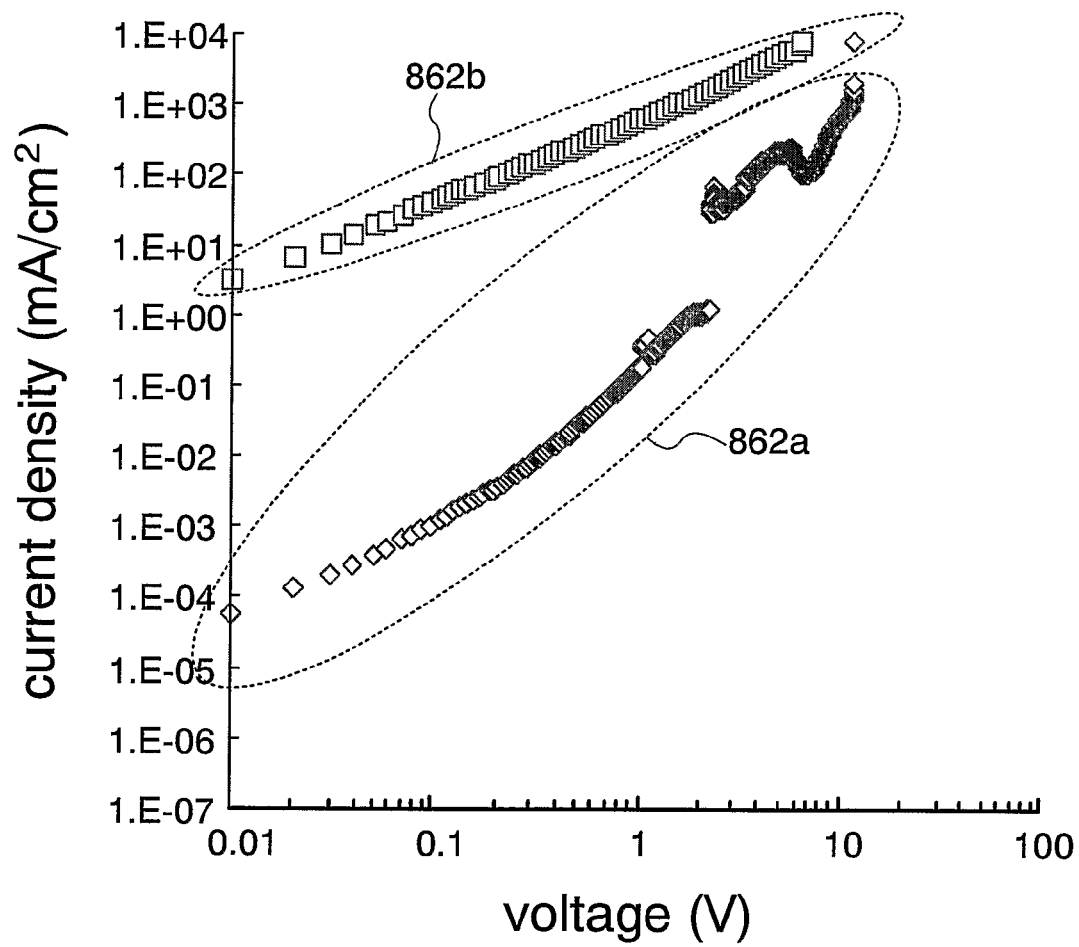
FIG. 18 shows a graph showing current-voltage characteristics of a memory element in a semiconductor device of the present invention.

The result of measuring the current density-voltage characteristics of an organic memory element having the above structure before and after writing data thereinto by electric action is shown in FIG. 18. In FIG. 18, the horizontal axis shows voltage value (V), and the vertical axis shows current density (mA/cm$^2$). Further, in FIG. 18, a plot 862a indicates current-voltage characteristics before writing data by electric action, and plot 862b indicates current-voltage characteristics after writing data by electric action.

In FIG. 18, great change can be seen between the current-voltage characteristics of the organic memory element before and after writing data. For example, the current density of the organic memory element after writing data is $2.6 \times 10^2$ mA/cm$^2$ after writing data while the applied voltage is $2.3 \times 10^{-1}$ mA/cm$^2$ before writing data at the applied voltage of 1V; thus, the current density changes in three orders of magnitude comparing before and after writing the data. Accordingly, the resistance value of the organic memory element is substantially reduced after writing the data.

As described above, the resistance value changes between before and after writing data. The change in the resistance value of the organic memory element is read using a voltage value and a current value thereby making it function as a memory circuit.

Embodiment 2

Figure 30A:
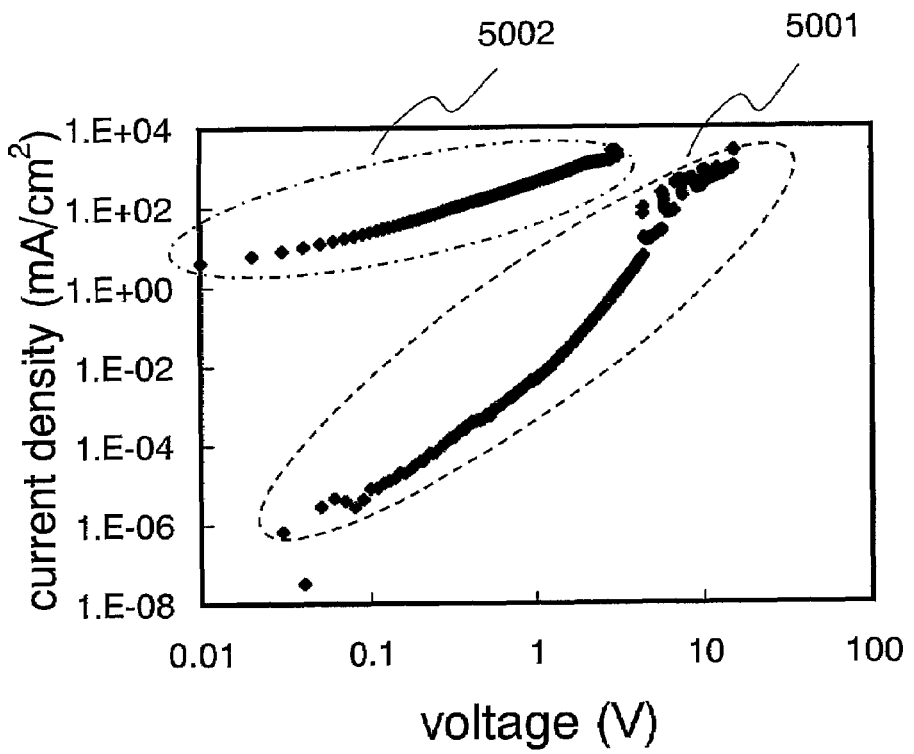
FIGS. 30A and 30B each shows a measurement result of the current-voltage characteristics of a memory element in a semiconductor device of the present invention.
Figure 30B:
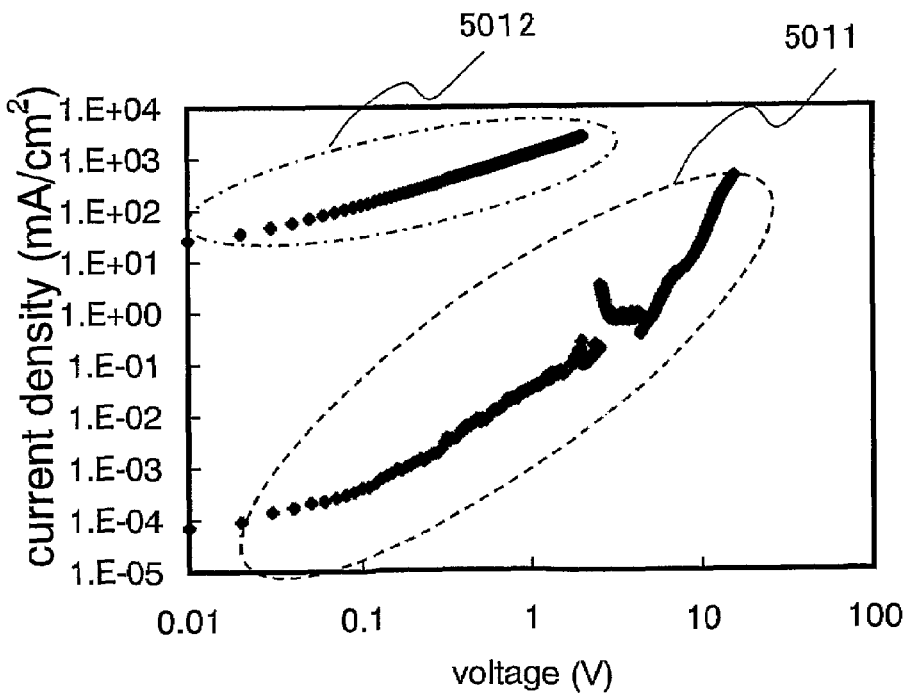

In this embodiment, current density-voltage characteristics of an organic memory element of which second conductive layer is formed by a droplet discharge method (an ink-jet method) will be described. Note that voltage was applied to the organic memory element and writing was conducted by shorting the organic memory. In FIGS. 30A and 30B, the horizontal axis shows voltage applied to the organic memory element, and the vertical axis shows density of current flown in the organic memory element.

Here, ITO containing silicon oxide is formed as a first conductive layer over a glass substrate. Next, PVK (poly(9-vinylcarbazole)) is applied by spin coating, and heating is thereafter carried out at 100° C. for ten minutes to form an organic compound layer to a thickness of 30 nm. Next, a composition containing Ag is discharged by a droplet discharge method and is heated in a nitrogen atmosphere at 200° C. for one hour to form the second conductive layer. The current density-voltage characteristics of the organic element is shown in FIG. 30A. The write voltage here was 4.2 V and the write current density was 5.8 mA/cm$^2$.

In FIG. 30A, a plot 5001 indicates current density-voltage characteristics of the organic memory element before writing, and a plot 5002 indicates current density-voltage characteristics of the organic memory element after writing. It can be recognized that ohmic current flows after the writing. Accordingly, the organic memory element can be short-circuited with an applied voltage of 4 V to 5 V.

Meanwhile, FIG. 30B shows a reference example of the organic memory element shown in FIG. 30A. Here, the current density-voltage characteristics of the organic memory element of which second conductive layer is formed by vapor deposition using an aluminum layer. The write voltage here was 1.9 V, and the write current density was 0.26 mA/cm$^2$.

In FIG. 30B, a plot 5011 shows current-voltage characteristics before writing into an organic memory element, and a plot 5012 shows current-voltage characteristics of the organic memory element after writing. As shown in FIGS. 30A with FIG. 30B, the organic memory element of which second conductive layer is formed by a droplet discharge method is short-circuited in the same manner as the organic memory element of which second conductive layer is formed by vapor deposition, when applied with voltage; thus, writing can be conducted.

Embodiment 3

In this embodiment mode, the result of measuring current-voltage characteristics of an organic memory element that has been heated. Here, an organic compound layer of the organic memory element was formed using PVK of which glass transition temperature was 200° C.

Figure 31:
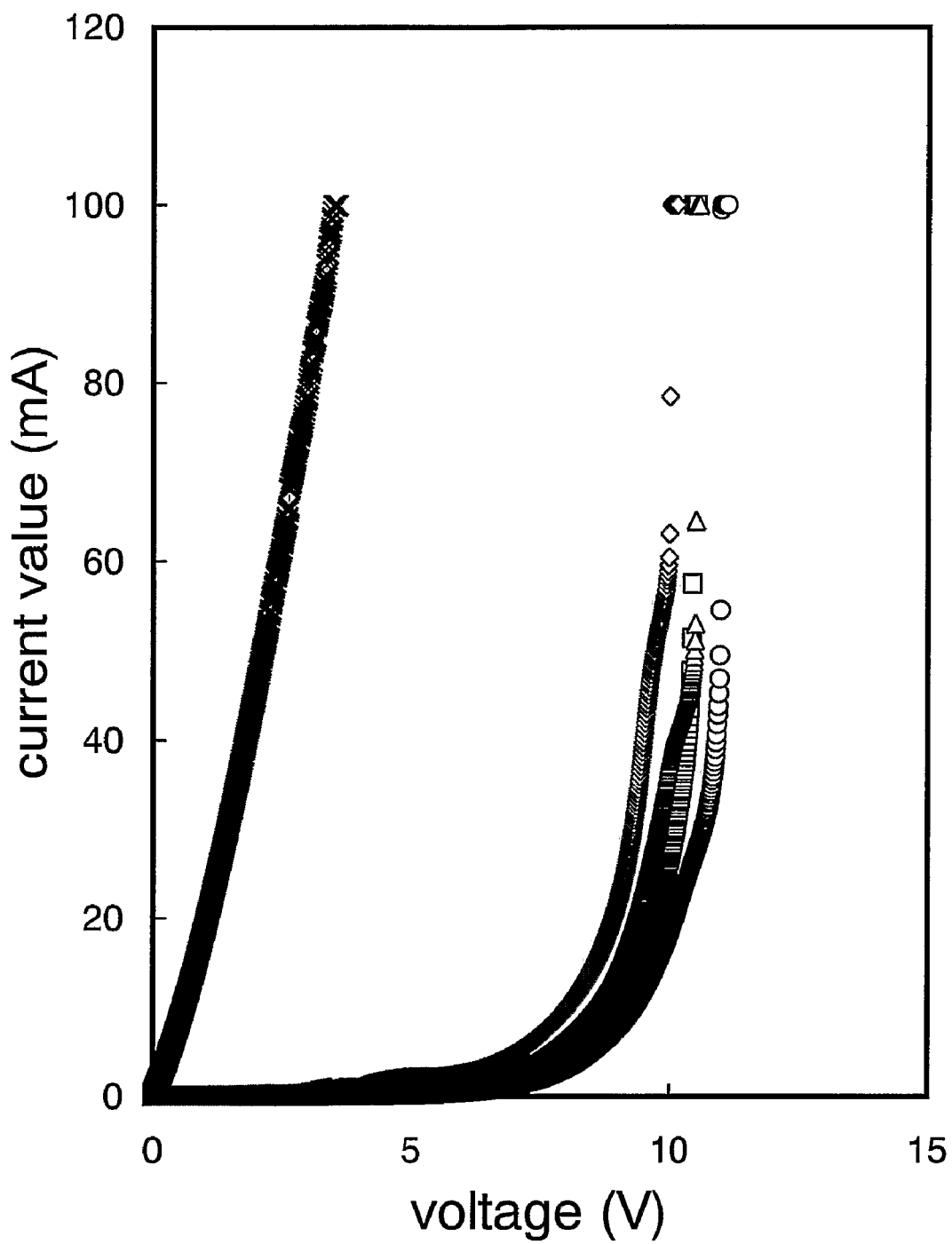
FIG. 31 shows a measurement result of the current-voltage characteristics of a memory element in a semiconductor device of the present invention.

As a first conductive layer, ITO containing silicon oxide was formed over a glass substrate by sputtering. An organic compound layer was formed by depositing PVK to a thickness of 17 nm over the first conductive layer by spin coating and heating it at 120° C. for 90 minutes. An aluminum layer was formed by vapor deposition as a second conductive layer over the organic compound layer. Thus, the organic memory element was formed. The thicknesses of the first conductive layer and the second conductive layer were respectively 110 nm and 200 nm. The area of the element on a horizontal plane was 2 mm×2 mm. The result of measuring the current-voltage characteristics of the organic memory element are indicated with circular plots in FIG. 31.

Next, after the organic memory element was heated at 120° C. for 10 minutes, the current-voltage characteristics of the organic memory element were measured at room temperature. The result was shown using square plots in FIG. 31. In a similar manner, after the organic memory element was heated at 160° C. for 10 minutes, the current-voltage characteristics of the organic memory element were measured at room temperature. The result was shown using triangular plots in FIG. 31. Similarly, after the organic memory element was heated at 200° C. for 10 minutes, the current-voltage characteristics of the organic memory element were measured at room temperature. The result was shown using rhombic plots in FIG. 31.

Further, the result of measuring current-voltage characteristics of each organic memory element after writing is shown using crossing plots.

As to organic memory elements into which wiring is not conducted, write voltage gradually decreases as higher heating temperature is applied; thus, the write voltage can be reduced.

Embodiment 4

In this embodiment, voltage and current in writing into organic memory elements having different sizes will be described with reference to Chart 1 and FIGS. 32A to 32C. Here, the organic memory elements were applied with voltage to be short-circuited; thus, writing was conducted.

As a first conductive layer, a titanium layer is formed over a substrate by sputtering. The first conductive layer is coated with PVK (poly(9-vinylcarbazole)) and heated to form an organic compound layer to a thickness of 8 nm. An aluminum layer is formed over the organic compound layer by vapor deposition as a second conductive layer. Thus, an organic memory element was formed. Thus, organic memory elements each having an area on a horizontal plane of 100 μm×100 μm, 40 μm×40 μm, 20 μm×20 μm, or 10 μm×10 μm were formed, and the current-voltage characteristics were measured.

Here, an organic memory element having the area of 100 μm×100 μm on a horizontal plane was used as Sample 1, another organic memory element having the area of 40 μm×40 μm on a horizontal plane was used as Sample 2, organic memory elements each having the area of 20 μm×20 μm on a horizontal plane were used as Samples 3 to 6, and organic memory elements each having the area of 10 μm×10 μm on a horizontal plane were used as Samples 7 to 10. The write voltage, write current, and read current of each organic memory element of Samples 1 to 10 is shown in Chart 1. Voltage of 2.5 V was applied to an element before writing, and voltage of 0.5 V was applied to an element after writing; thus, reading was conducted.

CHART 1

| sample | size of organic memory (μm × μm) | writing voltage (V) | writing current value (μA) | reading current value (μA) before writing (@ 2.5 V) | reading current value (μA) after writing (@ 0.5 V) |
|---|---|---|---|---|---|
| 1 | 100 × 100 | 7.7 | 27 | $1.3 \times 10^{-3}$ | $4.7 \times 10^{4}$ |
| 2 | 40 × 40 | 9.1 | 3.5 | $1.5 \times 10^{-5}$ | $5.3 \times 10^{4}$ |
| 3 | 20 × 20 | 7.5 | 3 | $2.2 \times 10^{-2}$ | 2.6 |
| 4 | 20 × 20 | 6.4 | 0.9 | $5.5 \times 10^{-2}$ | $5.8 \times 10^{4}$ |
| 5 | 20 × 20 | 6.2 | 0.31 | $3.3 \times 10^{-2}$ | $2.4 \times 10^{4}$ |
| 6 | 20 × 20 | 10.1 | $6.7 \times 10^{-2}$ | $6.6 \times 10^{-5}$ | $4.8 \times 10^{4}$ |
| 7 | 10 × 10 | 3.5 | 93 | 74 | $1.5 \times 10^{3}$ |
| 8 | 10 × 10 | 8.6 | 0.47 | $3.3 \times 10^{-5}$ | $6.2 \times 10^{4}$ |
| 9 | 10 × 10 | 10.1 | $2.4 \times 10^{-2}$ | $9.6 \times 10^{-5}$ | $5.9 \times 10^{4}$ |
| 10 | 10 × 10 | 9.6 | $3.4 \times 10^{-2}$ | $4.4 \times 10^{-5}$ | $8.0 \times 10^{4}$ |

Figure 32A:
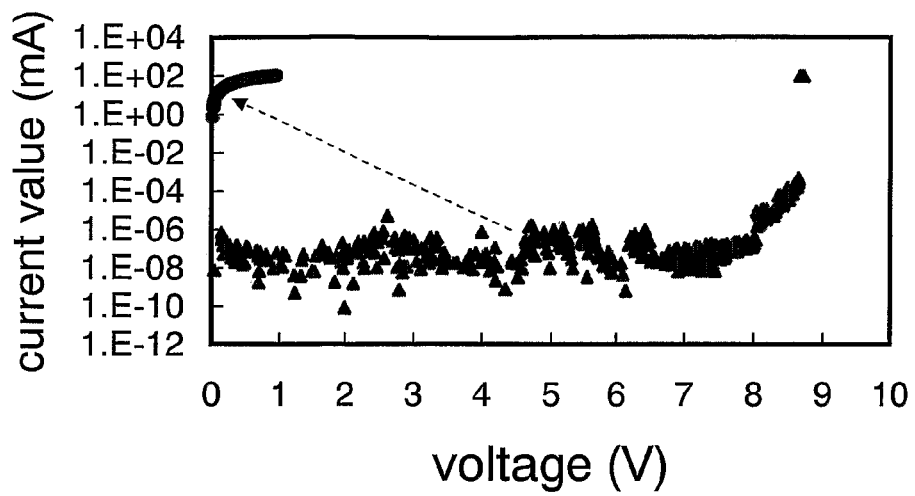
FIGS. 32A to 32C each shows a measurement result of the current-voltage characteristics of a memory element in a semiconductor device of the present invention.
Figure 32B:
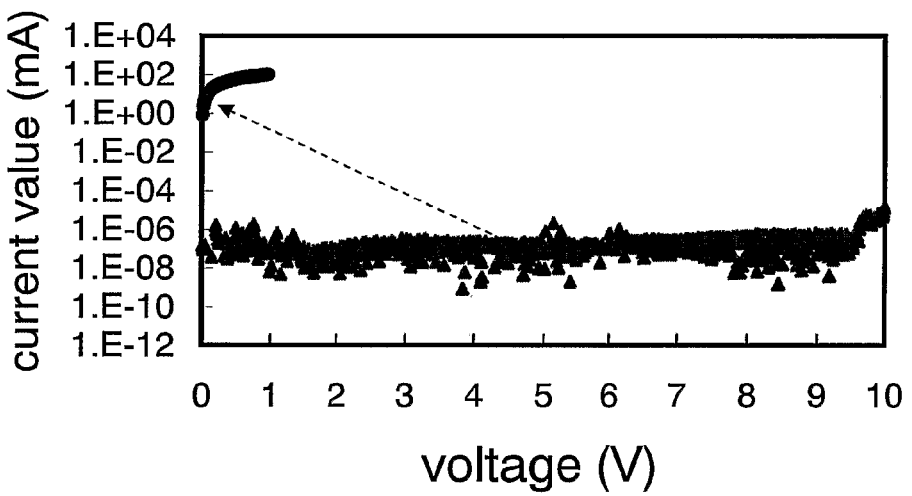
Figure 32C:
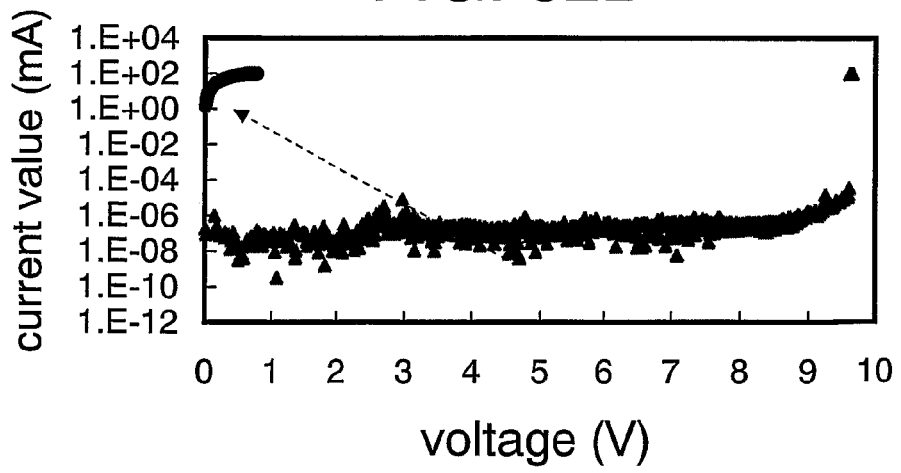

The current-voltage characteristics of Samples 8 to 10 are shown in FIGS. 32A to 32C. Triangular plots and circular plots show before and after writing data, respectively.

Writing can be conducted at 8.5 V to 10.1 V on each sample. The read current values before and after writing had a difference of $10^7$ or more at reading voltage of 1V, so that it was found that the samples have sufficient characteristics for being used as memories. Further, the current value in reading was 10 μA, so that it was found that data can be written into the organic memory elements at low power.

The invention claimed is:

1. A semiconductor device comprising:
   an element formation layer including a first transistor and a second transistor which are provided over a substrate;
   a memory element provided over the element formation layer; and
   a sensor portion provided above the memory element,
   wherein the memory element has a layered structure including a first conductive layer, an organic compound layer, and a second conductive layer,
   wherein the first conductive layer is electrically connected to the first transistor, and
   wherein the sensor portion is electrically connected to the second transistor.

2. A semiconductor device comprising:
   an element formation layer including a first transistor, a second transistor, and a third transistor which are provided over a substrate;
   a memory element provided over the element formation layer;
   a conductive layer which functions as an antenna; and
   a sensor portion provided above the memory element,
   wherein the memory element has a layered structure including a first conductive layer, an organic compound layer, and a second conductive layer,
   wherein the first conductive layer is electrically connected to the first transistor,
   wherein the sensor portion is electrically connected to the second transistor, and
   wherein the conductive layer which functions as the antenna is electrically connected to the third transistor.

3. The semiconductor device according to claim 2,
   wherein the conductive layer which functions as the antenna is provided on a same layer as the first conductive layer.

4. The semiconductor device according to claim 1,
   wherein a conductive layer provided in the sensor portion is electrically connected to a source or drain region of the second transistor through a conductive particle, so that the sensor portion is electrically connected to the second transistor.

5. A semiconductor device comprising:
   an element formation layer including a first transistor, a second transistor, and a sensor portion which are provided over a substrate; and
   a memory element provided over the element formation layer,
   wherein the memory element has a layered structure including a first conductive layer, an organic compound layer, and a second conductive layer,
   wherein the first conductive layer is electrically connected to the first transistor, and
   wherein the sensor portion is electrically connected to the second transistor.

6. A semiconductor device comprising:
   an element formation layer including a first transistor, a second transistor, a third transistor, and a sensor portion which are provided over a substrate;
   a memory element provided over the element formation layer; and
   a conductive layer which functions as an antenna,
   wherein the memory element has a layered structure including a first conductive layer, an organic compound layer, and a second conductive layer,
   wherein the first conductive layer is electrically connected to the first transistor, and
   wherein the sensor portion is electrically connected to the second transistor, and
   wherein the conductive layer which functions as the antenna is electrically connected to the third transistor.

7. The semiconductor device according to claim 6,
   wherein the conductive layer which functions as the antenna is provided on a same layer as the first conductive layer.

8. The semiconductor device according to claim 5,
   wherein the sensor portion includes a photodiode or a phototransistor.

9. A semiconductor device comprising:
   an element formation layer including a first transistor and a second transistor which are provided over a substrate; and a memory element and a sensor portion which are provided over the element formation layer, wherein the memory element has a layered structure including a first conductive layer, a first organic compound layer, and a second conductive layer, wherein the sensor portion has a layered structure including a third conductive layer, a second organic compound layer and a fourth conductive layer, wherein the first conductive layer is electrically connected to the first transistor, and wherein the third conductive layer is electrically connected to the second transistor.

10. A semiconductor device comprising:

an element formation layer including a first transistor, a second transistor, and a third transistor which are provided over a substrate;

a memory element and a sensor portion which are provided over the element formation layer; and a conductive layer which functions as an antenna, wherein the memory element has a layered structure including a first conductive layer, a first organic compound layer, and a second conductive layer, wherein the sensor portion has a layered structure including a third conductive layer, a second organic compound layer, and a fourth conductive layer, wherein the first conductive layer is electrically connected to the first transistor, wherein the third conductive layer is electrically connected to the second transistor, and wherein the conductive layer which functions as the antenna is electrically connected to the third transistor.

11. The semiconductor device according to claim 10, wherein the conductive layer which functions as the antenna is provided on a same layer as at least one of the first conductive layer and the third conductive layer.

12. The semiconductor device according to claim 9, wherein the first conductive layer and the third conductive layer are provided on a same layer.

13. The semiconductor device according to claim 9, wherein a same material is used for the first organic compound layer and the second organic compound layer.

14. The semiconductor device according to claim 1, wherein distance between the first conductive layer and the second conductive layer is changed by writing in the memory element.

15. The semiconductor device according to claim 1, wherein each of the first, second and third transistors is an organic transistor.

16. The semiconductor device according to claim 1, wherein the substrate is a glass substrate or a flexible substrate.

17. The semiconductor device according to claim 1, wherein the organic compound layer contains a high molecular weight compound.

18. The semiconductor device according to claim 17, wherein the high molecular weight compound is [methoxy-5-(2-ethyl) hexyloxy]-p-phenylene vinylene (MEH-PPV) or poly (9-vinylcarbazole) (PVK).

19. The semiconductor device according to claim 1, wherein resistance of the memory element changes irreversibly by writing.

20. The semiconductor device according to claim 2, wherein a conductive layer provided in the sensor portion is electrically connected to a source or drain region of the second transistor through a conductive particle, so that the sensor portion is electrically connected to the second transistor.

21. The semiconductor device according to claim 6, wherein the sensor portion includes a photodiode or a phototransistor.

22. The semiconductor device according to claim 10, wherein the first conductive layer and the third conductive layer are provided on a same layer.

23. The semiconductor device according to claim 10, wherein a same material is used for the first organic compound layer and the second organic compound layer.

24. The semiconductor device according to claim 2, wherein distance between the first conductive layer and the second conductive layer is changed by writing in the memory element.

25. The semiconductor device according to claim 5, wherein distance between the first conductive layer and the second conductive layer is changed by writing in the memory element.

26. The semiconductor device according to claim 6, wherein distance between the first conductive layer and the second conductive layer is changed by writing in the memory element.

27. The semiconductor device according to claim 9, wherein distance between the first conductive layer and the second conductive layer is changed by writing in the memory element.

28. The semiconductor device according to claim 10, wherein distance between the first conductive layer and the second conductive layer is changed by writing in the memory element.

29. The semiconductor device according to claim 2, wherein each of the first, second and third transistors is an organic transistor.

30. The semiconductor device according to claim 5, wherein each of the first, second and third transistors is an organic transistor.

31. The semiconductor device according to claim 6, wherein each of the first, second and third transistors is an organic transistor.

32. The semiconductor device according to claim 9, wherein each of the first, second and third transistors is an organic transistor.

33. The semiconductor device according to claim 10, wherein each of the first, second and third transistors is an organic transistor.

34. The semiconductor device according to claim 2, wherein the substrate is a glass substrate or a flexible substrate.

35. The semiconductor device according to claim 5, wherein the substrate is a glass substrate or a flexible substrate.

36. The semiconductor device according to claim 6, wherein the substrate is a glass substrate or a flexible substrate.

37. The semiconductor device according to claim 9, wherein the substrate is a glass substrate or a flexible substrate.

38. The semiconductor device according to claim 10, wherein the substrate is a glass substrate or a flexible substrate.

39. The semiconductor device according to claim 2, wherein the organic compound layer contains a high molecular weight compound.

40. The semiconductor device according to claim 5, wherein the organic compound layer contains a high molecular weight compound.

41. The semiconductor device according to claim 6, wherein the organic compound layer contains a high molecular weight compound.

42. The semiconductor device according to claim 9, wherein the first organic compound layer contains a high molecular weight compound.

43. The semiconductor device according to claim 10, wherein the first organic compound layer contains a high molecular weight compound.

44. The semiconductor device according to claim 39, wherein the high molecular weight compound is [methoxy-5-(2-ethyl) hexyloxy]- p-phenylene vinylene (MEH-PPV) or poly (9-vinylcarbazole) (PVK).

45. The semiconductor device according to claim 40, wherein the high molecular weight compound is [methoxy-5-(2-ethyl) hexyloxy]-p-phenylene vinylene (MEH-PPV) or poly (9-vinylcarbazole) (PVK).

46. The semiconductor device according to claim 41, wherein the high molecular weight compound is [methoxy-5-(2-ethyl) hexyloxy]-p-phenylene vinylene (MEH-PPV) or poly (9-vinylcarbazole) (PVK).

47. The semiconductor device according to claim 42, wherein the high molecular weight compound is [methoxy-5-(2-ethyl) hexyloxy]-p-phenylene vinylene (MEH-PPV) or poly (9-vinylcarbazole) (PVK).

48. The semiconductor device according to claim 43, wherein the high molecular weight compound is [methoxy-5-(2-ethyl) hexyloxy]-p-phenylene vinylene (MEH-PPV) or poly (9-vinylcarbazole) (PVK).

49. The semiconductor device according to claim 2, wherein resistance of the memory element changes irreversibly by writing.

50. The semiconductor device according to claim 5, wherein resistance of the memory element changes irreversibly by writing.

51. The semiconductor device according to claim 6, wherein resistance of the memory element changes irreversibly by writing.

52. The semiconductor device according to claim 9, wherein resistance of the memory element changes irreversibly by writing.

53. The semiconductor device according to claim 10, wherein resistance of the memory element changes irreversibly by writing.

* * * * *